United States Patent
Cho et al.

(10) Patent No.: US 11,569,460 B2
(45) Date of Patent: Jan. 31, 2023

(54) ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

(71) Applicant: Samsung Electronics Co., Ltd., Suwon-si (KR)

(72) Inventors: Yongsuk Cho, Hwaseong-si (KR); Ohyun Kwon, Seoul (KR); Yoonhyun Kwak, Seoul (KR); Sungjun Kim, Seongnam-si (KR); Chul Baik, Suwon-si (KR); Kum Hee Lee, Suwon-si (KR); Sunghun Lee, Hwaseong-si (KR); Aram Jeon, Suwon-si (KR); Jongwon Choi, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 322 days.

(21) Appl. No.: 16/176,330

(22) Filed: Oct. 31, 2018

(65) Prior Publication Data
US 2019/0140192 A1 May 9, 2019

(30) Foreign Application Priority Data
Nov. 8, 2017 (KR) .................... 10-2017-0148314

(51) Int. Cl.
*H01L 51/00* (2006.01)
*C07F 15/00* (2006.01)
(Continued)

(52) U.S. Cl.
CPC ...... *H01L 51/0087* (2013.01); *C07F 15/0033* (2013.01); *C07F 15/0086* (2013.01);
(Continued)

(58) Field of Classification Search
CPC ............. H01L 51/0084; H01L 51/0087; H01L 51/5016; H01L 51/0085;
(Continued)

(56) References Cited

U.S. PATENT DOCUMENTS 4,248,949 A    2/1981   Hara et al.
10,050,218 B2   8/2018   Stoessel et al.
(Continued)

FOREIGN PATENT DOCUMENTS

CN     101020699 A    8/2007
KR   1020150139965 A   12/2015

OTHER PUBLICATIONS

Chemical Bond. Definition from TheFreeDictionary.com. (Year: 2021).*
(Continued)

*Primary Examiner* — Jennifer A Boyd
*Assistant Examiner* — Elizabeth M Dahlburg
(74) *Attorney, Agent, or Firm* — Cantor Colburn LLP

(57) ABSTRACT

An organometallic compound represented by Formula 1:

$$M(L_1)_{n1}(L_2)_{n2}(L_3)_{n3} \qquad \text{Formula 1}$$

wherein M, $L_1$, $L_2$, $L_3$, n1, n2, and n3 are the same as described in the specification.

16 Claims, 3 Drawing Sheets

(51) Int. Cl.
　　　*C09K 11/06*　　　(2006.01)
　　　*H01L 51/50*　　　(2006.01)
(52) U.S. Cl.
　　　CPC .......... *C09K 11/06* (2013.01); *H01L 51/0085* (2013.01); *C09K 2211/185* (2013.01); *H01L 51/5016* (2013.01)
(58) Field of Classification Search
　　　CPC ... H01L 51/0077–0089; H01L 51/0091–0092; H01L 51/5088; H01L 51/5056; H01L 51/5072; H01L 51/5092; H01L 51/5012; H01L 51/5096; C07F 15/006; C07F 15/0086; C07F 1/12; C07F 15/0033; C07F 5/00; C07F 5/003; C07F 5/06–069; C07F 7/00; C07F 7/003; C07F 7/22–28; C07F 9/00; C07F 9/005; C09K 2211/185; C09K 11/06; C09K 2211/182–188; C09K 2211/1044
　　　See application file for complete search history.

(56) References Cited

U.S. PATENT DOCUMENTS

| | | | | |
|---|---|---|---|---|
| 2002/0047551 | A1* | 4/2002 | Rubner | H01L 51/0086 315/169.2 |
| 2012/0018711 | A1* | 1/2012 | Che | C07D 213/30 257/40 |
| 2016/0240800 | A1 | 8/2016 | Ma et al. | |
| 2016/0308149 | A1* | 10/2016 | Stoessel | C09K 11/06 |
| 2018/0062088 | A1 | 3/2018 | Cho et al. | |
| 2018/0287077 | A1* | 10/2018 | Joseph | H01L 51/0085 |

OTHER PUBLICATIONS

Anandan et al. "Syntheses of mixed ligands complexes of Ru(II) with 4,4'-dicarboxy-2,2'-bipyridine and substituted pteridinedione and the use of these complexes in electrochemical photovoltaic cells" Journal of Photochemistry and Photobiology 150 (2002), pp. 167-175. (Year: 2002).*

Illan-Cabeza et al. "XRD and DFT-modelized structures of a pteridine-2,4(1H,3H)-dithione/N,N'-dimethylformamide H-bonded cluster (2:2). MO study of the coordination ability" Journal of Molecular Modeling (18) 2012, pp. 815-824. (Year: 2012).*

Cochran et al. "cis-Diamminodichloronickel and Its Interaction With Guanine and Guanine-Cytosine Base Pair" Structural Chemistry (13-2) 2002, pp. 133-140. (Year: 2002).*

Khan et al. "Mixed ligand complexes of platinum(II) with histidine as primary ligand and purines, pyrimidines and nucleosides as secondary ligands" Indian Journal of Chemistry (31A) 1992, pp. 28-33. (Year: 1992).*

Alper "ortho-Palladated and ortho-platinated complexes of diaryl thioketones", Journal of Organometallic Chemistry, 1973, 61, pp. C62-C64.

Casas et al. "Syntheses and Structures of the Complexes cis-[M(C6F5)]2(N—X)] Containing N—X Acting as a Bidentate Chelating Ligand and Displeaying I—M or O—M Interactions", Inorganic Chemistry, 1996, 35 (1), pp. 56-62.

Chen et al. "Potential new inorganic antitumor agents from combining the anticancer traditional Chinese medicine liriodenine with metal ions, and DNA binding studies", Dalton Transactions, 2008, 2, pp. 262-272.

Cristalli et al. "Metal complexes of 2,2-bipyridyl-6-carbothioamide as anti-tumor and anti-fungal agents", European Journal of Medicinal Chemistry, 1988, 23 (3), pp. 301-305.

Extended European search report issued by the European Patent Office dated Mar. 6, 2019 in the examination of the European Patent Application No. 18203677.2-1109.

Sutton Some Studies in Inorganic 1,2 complexes. 18 2-Thioamidopyridine and N-methylpyridine complexes of palladium and platinum, Australian Journal of Chemistry, 1965, 18 (2), pp. 150-154.

Sutton "Complexes of 2-thiocarbamoylpyridine", Australian Journal of Chemistry, 1969, 22 (2), pp. 2475-2478.

J. Fan et al. "Journal of Materials Chemistry C", J. Mater Chem. C, 2017, 25 pp.

English Translation of Office Action dated Nov. 4, 2022 issued in corresponding KR Patent Application No. 10-2017-0148314, 10 pp.

Office Action dated Nov. 4, 2022 issued in corresponding KR Patent Application No. 10-2017-0148314, 9 pp.

\* cited by examiner

ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

CROSS-REFERENCE TO RELATED APPLICATION

This application claims priority to Korean Patent Application No. 10-2017-0148314, filed on Nov. 8, 2017, in the Korean Intellectual Property Office, and all the benefits accruing therefrom under 35 U.S.C. § 119, the content of which is incorporated herein in its entirety by reference.

BACKGROUND

1. Field

The present disclosure relates to an organometallic compound, an organic light-emitting device including the organometallic compound, and a diagnostic composition that includes the organometallic compound.

2. Description of the Related Art

Organic light-emitting devices (OLEDs) are self-emission devices which produce full-color images. In addition, OLEDs have wide viewing angles and exhibit excellent driving voltage and response speed characteristics.

Typically, OLEDs include an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

Further, light-emitting compounds, e.g., phosphorescence-emitting compounds, can also be used to monitor, sense, or detect biological materials, including a variety of cells and proteins.

Various types of organic light emitting devices are known. However, there still remains a need in OLEDs having low driving voltage, high efficiency, high brightness, and long lifespan.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According an aspect of an embodiment, an organometallic compound is represented by Formula 1:

$$M(L_1)_{n1}(L_2)_{n2}(L_3)_{n3}$$  Formula 1

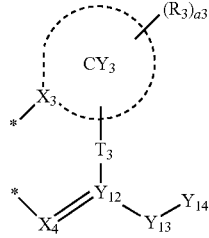

Formula 2 wherein, M in Formula 1 may be a transition metal, $L_1$ in Formula 1 may be selected from ligands represented by Formula 2,

* in Formula 2 may indicate a binding site to M in Formula 1, n1 in Formula 1 may be 1, 2, or 3; provided that when n1 is 2 or greater, at least two $L_1$ groups may be identical to or different from each other, $L_2$ and $L_3$ in Formula 1 may each independently be selected from a monodentate ligand, a bidentate ligand, a tridentate ligand, and a tetradentate ligand, n2 and n3 in Formula 1 may each independently be 0, 1, 2, 3, or 4; provided that when n2 is 2 or greater, at least two $L_2$ groups may be identical to or different from each other; and when n3 is 2 or greater, at least two $L_3$ groups may be identical to or different from each other, in Formula 1, at least two selected from $L_1$ groups in the number of n1, $L_2$ groups in the number of n2, and $L_3$ groups in the number of n3 may optionally be linked to each other via a single bond, a double bond, or an organic linking group to form a tridentate ligand, a tetradentate ligand, a pentadentate ligand, or a hexadentate ligand, $X_3$ and $Y_{12}$ in Formula 2 may each independently be N or C, $X_4$ in Formula 2 may be O or S, $X_4$ in Formula 2 may be bound to M in Formula 1 via a coordinate bond, $X_3$ in Formula 2 may be bound to M in Formula 1 via a coordinate bond or a covalent bond, ring $CY_3$ in Formula 2 may be a $C_5$-$C_{30}$ carbocyclic group or a $C_1$-$C_{30}$ heterocyclic group, $T_3$ in Formula 2 may be a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—S(=O)$_2$—*', *—C($R_7$)=*', *=C($R_7$)—*', *—C($R_7$)=C($R_8$)—*', *—C(=S)—*', or *—C≡C—*', wherein * and *' each indicate a binding site to an adjacent atom, and $R_7$ and $R_8$ may optionally be linked to each other via a single bond, a double bond, or a first linking group to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, $Y_{13}$ in Formula 2 may be a single bond, a double bond, *—S—*', *—Se—*', *—O—*', *—C(=O)—*', *—S(=O)—*', *—S(=O)$_2$—*', *—C(=S)—*', or *—C≡C—*', wherein * and *' each indicate a binding site to an adjacent atom, $R_3$ and $Y_{14}$ in Formula 2 may optionally be linked to each other via a single bond, a double bond, or a first linking group to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, $R_3$, $R_4$, $R_7$, $R_8$, $Y_{14}$, and $R_{10a}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a3 may be an integer from 0 to 20, two adjacent groups selected from a plurality of $R_3$ groups may optionally be linked to form a $C_5$-$C_{30}$ carbocyclic group or a $C_1$-$C_{30}$ heterocyclic group, wherein the $C_5$-$C_{30}$ carbocyclic group and the $C_1$-$C_{30}$ heterocyclic group are each unsubstituted or substituted with at least one $R_{10a}$, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium; a $C_1$-$C_{60}$ alkyl group; and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium; a $C_1$-$C_{60}$ alkyl group; and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

According to an aspect of another embodiment, an organic light-emitting device may include:

a first electrode;

a second electrode; and an organic layer disposed between the first electrode and the second electrode, wherein the organic layer including an emission layer and at least one of the organometallic compound.

In the organic layer, the organometallic compound may serve as a dopant.

According to another aspect, a diagnostic composition may include at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
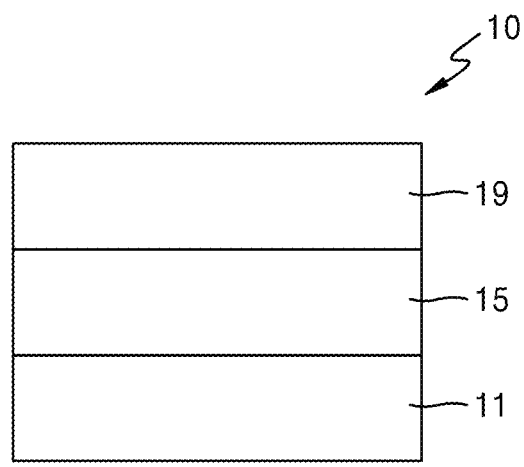
FIG. 1 is a schematic cross-sectional view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. According to an aspect, an organometallic compound may be represented by Formula 1:

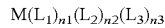

$$M(L_1)_{n1}(L_2)_{n2}(L_3)_{n3} \qquad \text{Formula 1}$$

M in Formula 1 may be a transition metal. For example, M in Formula 1 may be selected from a first-row transition metal of the Periodic Table of Elements, a second-row transition metal of the Periodic Table of Elements, and a third-row transition metal of the Periodic Table of Elements. In some embodiments, M may be selected from iridium (Ir), osmium (Os), titanium (Ti), zirconium (Zr), hafnium (Hf), europium (Eu), terbium (Tb), thulium (Tm), rhodium (Rh), manganese (Mn), cobalt (Co), copper (Cu), zinc (Zn), gallium (Ga), germanium (Ge), ruthenium (Ru), palladium (Pd), silver (Ag), rhenium (Re), platinum (Pt), and gold (Au).

In an embodiment, M may be selected from Ir, Pt, Pd, Au, and Os.

In one or more embodiments, M may be selected from Pt, Pd, and Au, but embodiments are not limited thereto.

$L_1$ in Formula 1 may be selected from ligands represented by Formula 2:

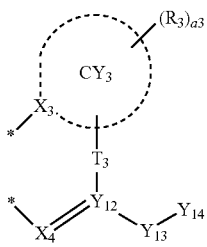

Formula 2

Formula 2 may be understood by referring to the descriptions therefor described herein; * in Formula 2 indicates a binding site to M in Formula 1.

n1 in Formula 1 indicates the number of $L_1$ groups, and n1 may be selected from 1, 2, and 3. When n1 is 2 or greater, at least two $L_1$ groups may be identical to or different from each other.

For example, n1 may be 1, but embodiments are not limited thereto.

$L_2$ and $L_3$ in Formula 1 may each independently be selected from a monodentate ligand, a bidentate ligand, a tridentate ligand, and a tetradentate ligand.

In some embodiments, $L_2$ and $L_3$ may each independently be selected from ligands represented by Formulae 3A to 3F:

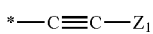

3A

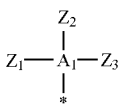

3B

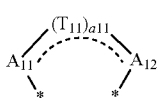

3C

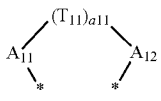

3D

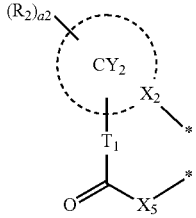

3E

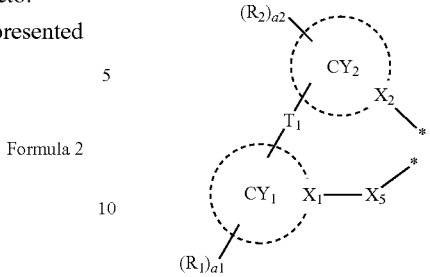

3F wherein, A1 in Formula 3B may be selected from P and As, $A_{11}$ in Formulae 3C and 3D may be selected from O, N, $N(Z_1)$, $P(Z_1)(Z_2)$, and $As(Z_1)(Z_2)$, $A_{12}$ in Formulae 3C and 3D may be selected from O, N, $N(Z_3)$, $P(Z_3)(Z_4)$, and $As(Z_3)(Z_4)$, $T_{11}$ in Formulae 3C and 3D may each independently be selected from a single bond, a double bond, *—$C(Z_{11})$ $(Z_{12})$—*', *—$C(Z_{11})$=$C(Z_{12})$—*', *=$C(Z_{11})$—*', *—$C(Z_{11})$=*'*=$C(Z_{11})$—$C(Z_{12})$=$C(Z_{13})$—*', *—$C(Z_{11})$=$C(Z_{12})$—$C(Z_{13})$=*', *—$N(Z_{11})$—*', and a $C_5$-$C_{30}$ carbocyclic group unsubstituted or substituted with at least one $Z_{11}$, wherein * and *' each indicate a binding site to an adjacent atom, a11 in Formulae 3C and 3D may be an integer from 1 to 10, $X_1$ and $X_2$ in Formulae 3E and 3F may each independently be selected from N and C, $X_5$ in Formulae 3E and 3F may be selected from a chemical bond, O, S, B(R'), N(R'), P(R'), C(R')(R''), Si(R') (R''), Ge(R')(R''), C(=O), B(R')(R''), N(R')(R''), and P(R') (R''); when $X_5$ is a chemical bond, $X_1$ in Formula 3F may be directly bound to M in Formula 1, $T_1$ in Formulae 3E and 3F may be selected from a single bond, a double bond, *—$N(R_5)$—*', *—$B(R_5)$—*', *—$P$ $(R_5)$—*', *—$C(R_5)(R_6)$—*', *—$Si(R_5)(R_6)$—*', *—$Ge(R_5)$ $(R_6)$—*', *—$S$—*', *—$Se$—*', *—$O$—*', *—$C(=O)$—*', *—$S(=O)$—*', *—$S(=O)_2$—*', *—$C(R_5)$=*', *=$C$ $(R_5)$—*', *—$C(R_5)$=$C(R_6)$), *—$C(=S)$—*', and *—C≡C—*', wherein * and *' each indicate a binding site to an adjacent atom, rings $CY_1$ and $CY_2$ in Formulae 3E and 3F may each be understood by referring to the descriptions for ring $CY_3$ provided herein, in Formulae 3A to 3F, $Z_1$ to $Z_4$, $Z_{11}$ to $Z_{13}$, $R_1$, $R_2$, $R_5$, $R_6$, R', and R'' may each be understood by referring to the descriptions for $R_3$ provided herein, a1 and a2 in Formulae 3E and 3F may each independently be an integer from 0 to 20, and

* in Formulae 3A to 3F indicates a binding site to M in Formula 1.

n2 and n3 in Formula 1 may respectively indicate the number of $L_2$ groups and $L_3$ groups, and n2 and n3 may each independently be an integer selected from 0, 1, 2, 3, and 4; provided that when n2 is 2 or greater, at least two $L_2$ groups may be identical to or different from each other, and provided that when n3 is 2 or greater, at least two $L_3$ groups may be identical to or different from each other.

In Formula 1, at least two selected from $L_1$ groups in the number of n1, $L_2$ groups in the number of n2, and $L_3$ groups in the number of n3 may optionally be linked to each other via a single bond, a double bond, and an organic linking group (for example, see $T_2$ provided herein) to form a tridentate ligand, a tetradentate ligand, a pentadentate ligand, or a hexadentate ligand.

In an embodiment, n1 and n2 in Formula 1 may each be 1, n3 may be 0, $L_2$ may be a bidentate ligand (e.g., a ligand represented by Formula 3E or 3F provided herein), and $L_1$ may be linked to $L_2$ via a single bond, a double bond, or an organic linking group (for example, see $T_2$ provided herein) to form a tetradentate ligand (e.g., Formula 1A or 1A(1) provided herein), but embodiments are not limited thereto.

$X_3$ and $Y_{12}$ in Formula 2 may each independently be selected from N and C.

$X_4$ in Formula 2 may be selected from O and S.

In an embodiment, $X_4$ may be O.

A bond between $X_4$ in Formula 2 and M in Formula 1 may be a coordinate bond, and a bond between $X_3$ in Formula 2 and M in Formula 1 may be a coordinate bond or a covalent bond.

Ring $CY_3$ in Formula 2 may be selected from a $C_5$-$C_{30}$ carbocyclic group and a $C_1$-$C_{30}$ heterocyclic group.

In some embodiments, rings $CY_3$ may be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In one or more embodiments, ring $CY_3$ may be selected from i) a first ring, ii) a second ring, iii) a condensed ring in which two or more second rings may be condensed, and iv) a condensed ring in which at least one first ring and at least one second ring may be condensed, the first ring may be selected from a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group, but embodiments are not limited thereto.

$T_3$ in Formula 2 may be selected from a single bond, a double bond, *—N($R_7$)—*', *—B($R_7$)—*', *—P($R_7$)—*', *—C($R_7$)($R_8$)—*', *—Si($R_7$)($R_8$)—*', *—Ge($R_7$)($R_8$)—*', *—S—*', *—Se—*', *—O—*', *—C(=O)—*', *—S(=O)—*', *—S(=O)$_2$—*', *—C($R_7$)=*', *=C($R_7$)—*', *—C($R_7$)=C($R_8$)—*', *—C(=S)—*', and *—C≡C—*', wherein * and *' each indicate a binding site to an adjacent atom, and $R_7$ and $R_8$ may optionally be linked via a single bond, a double bond, or a first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

The first linking group may be selected from *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—O—*', *—C(=O)—*', *—S(=O)—*', *—S(=O)$_2$—*', *—C($R_9$)=*', *=C($R_9$)—*', *—C($R_9$)=C($R_{10}$)—*', *—C(=S)—*', and *—C≡C—*', wherein $R_9$ and $R_{10}$ may each be understood by referring to the descriptions for $R_7$ provided herein, and * and *' may each independently indicate a binding site to an adjacent atom.

In some embodiments, $T_3$ may be a single bond, but embodiments are not limited thereto.

$Y_{13}$ in Formula 2 may be selected from a single bond, a double bond, *—S—*', *—Se—*', *—O—*', *—C(=O)—*', *—S(=O)—*', *—S(=O)$_2$—*', *—C(=S)—*', and *—C≡C—*', wherein * and *' each indicate a binding site to an adjacent atom.

In an embodiment, $Y_{13}$ may be a single bond or *—O—*', but embodiments are not limited thereto.

$R_3$ and $Y_{14}$ in Formula 2 may respectively be understood by referring to the descriptions for those provided herein. $R_3$ and $Y_{14}$ may optionally be linked to each other via a single bond, a double bond, or a first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$. That is, $L_1$ in Formula 1 may be selected from ligands represented by Formula 2(1):

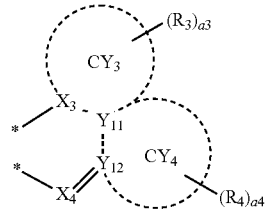

Formula 2(1)

wherein, in Formula 2(1), $X_3$, $X_4$, $Y_{12}$, ring $CY_3$, $R_3$, a3, and * may respectively be understood by referring to the descriptions for those provided herein, $Y_{11}$ may be N or C, and ring $CY_4$, $R_4$, and a4 may respectively be understood by referring to the descriptions for ring $CY_3$, $R_3$, and a3.

$R_3$, $R_4$, $R_7$, $R_8$, $Y_{14}$, and $R_{10a}$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ may respectively be understood by referring to the descriptions for those provided herein.

In an embodiment, $R_3$, $R_4$, $R_7$, $R_8$, $Y_{14}$, and $R_{10a}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a $C_1$-$C_{20}$ alkylthiophenyl group, a furanyl group, a $C_1$-$C_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a $C_1$-$C_{20}$ alkylthiophenyl group, a furanyl group, a $C_1$-$C_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a $C_1$-$C_{20}$ alkylthiophenyl group, a furanyl group, a $C_1$-$C_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ may each independently be selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

In one or more embodiments, R$_3$, R$_4$, R$_7$, R$_8$, Y$_{14}$, and R$_{10a}$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19 and groups represented by Formulae 10-1 to 10-226, but embodiments are not limited thereto:

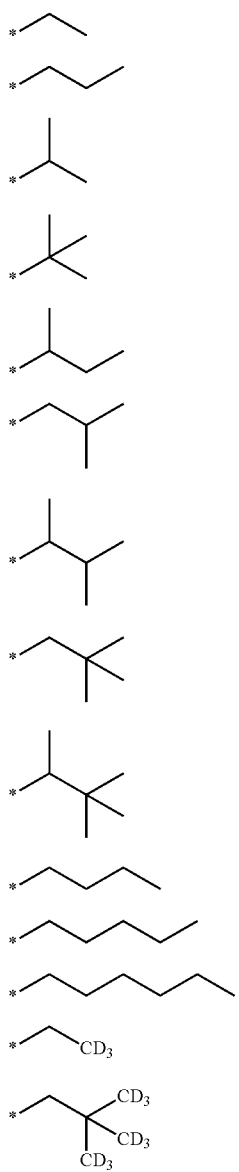

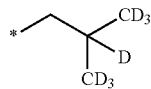

9-15

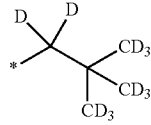

9-16

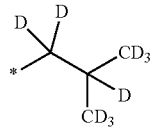

9-17

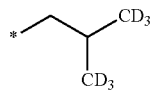

9-18

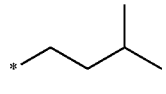

9-19

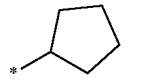

10-1

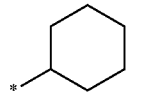

10-2

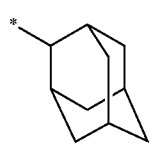

10-3

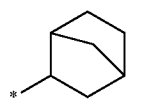

10-4

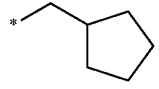

10-5

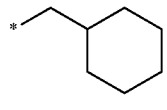

10-6

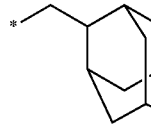

10-7

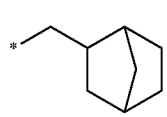

10-8

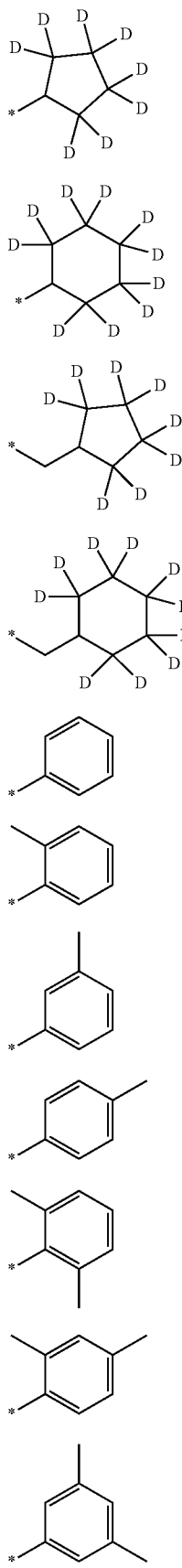
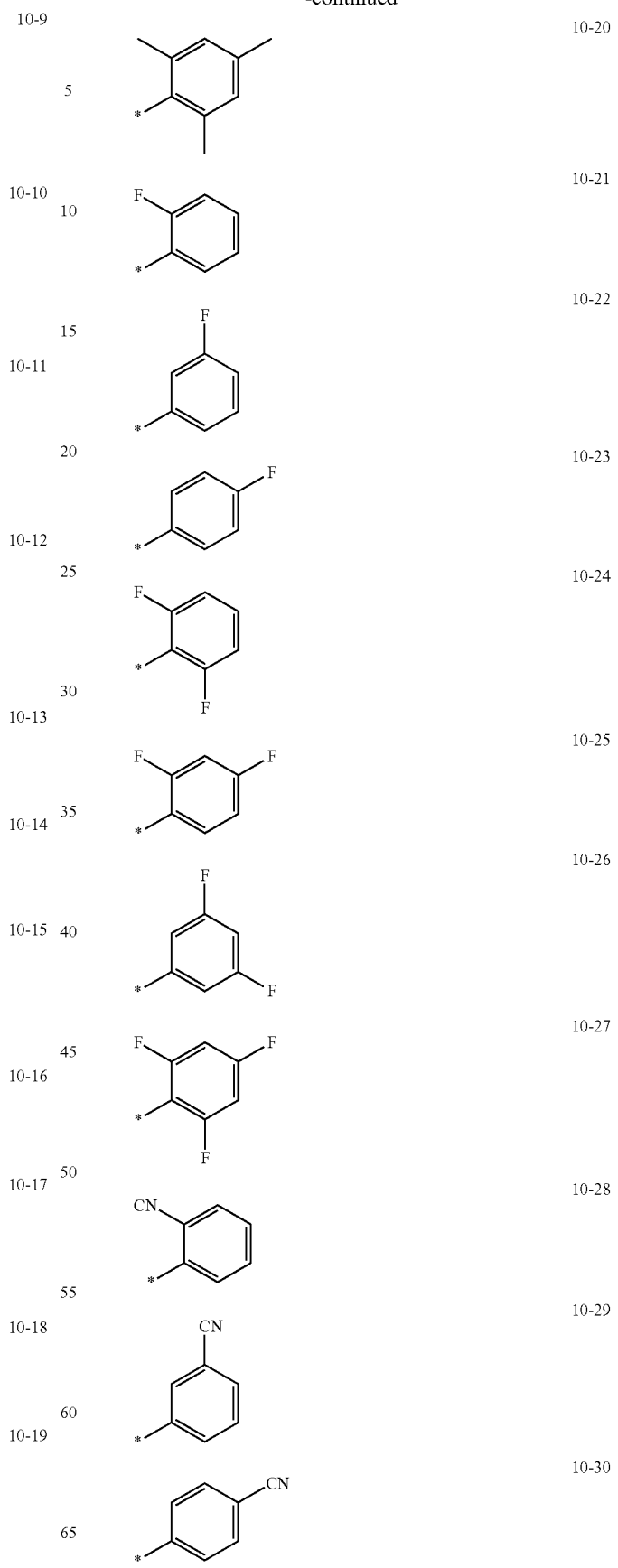

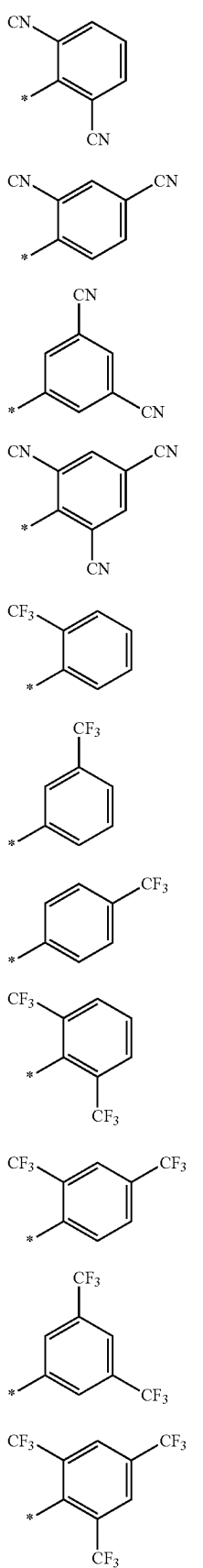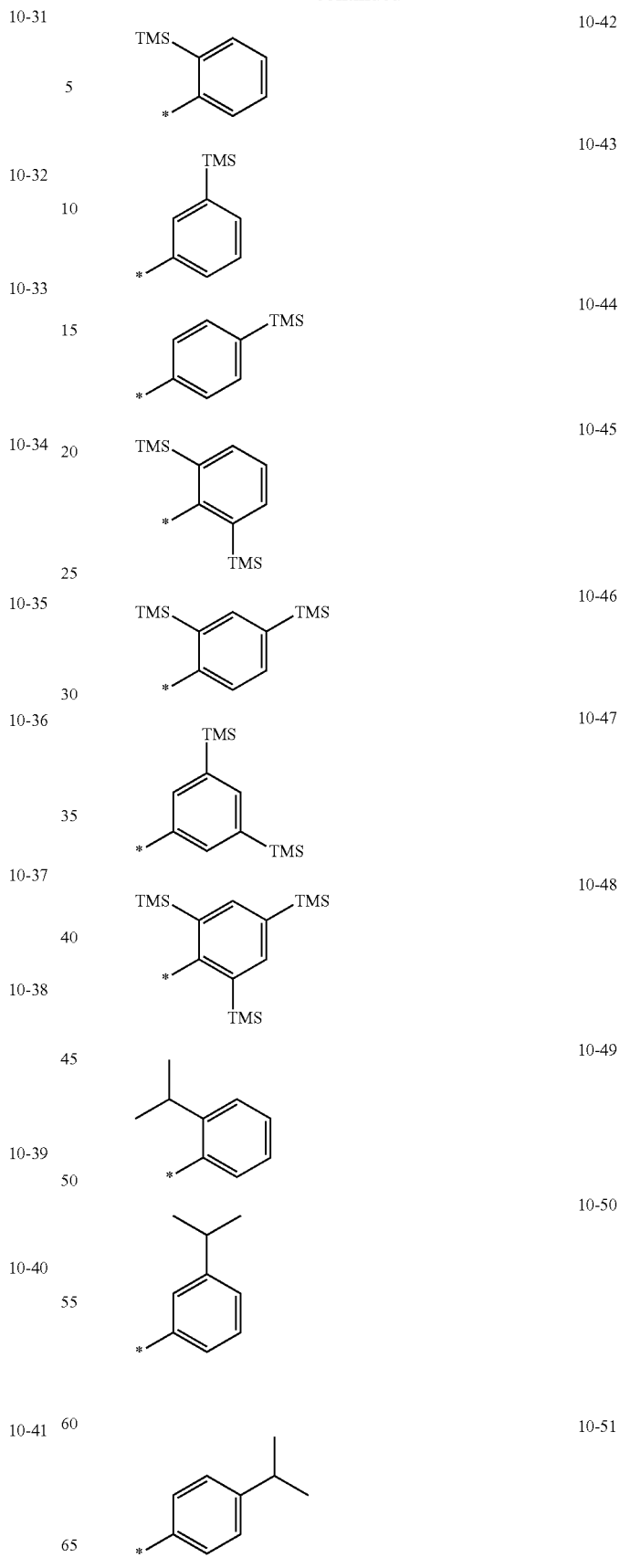

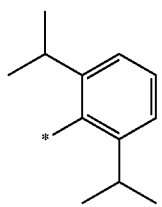 10-52
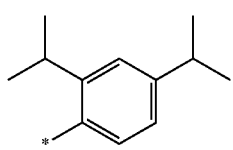 10-53
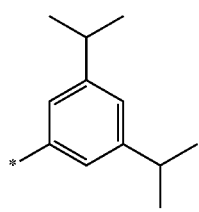 10-54
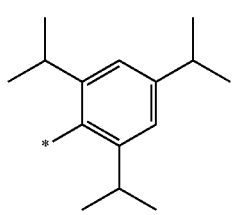 10-55
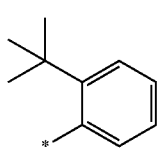 10-56
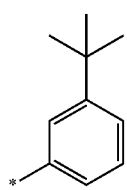 10-57
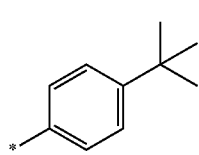 10-58
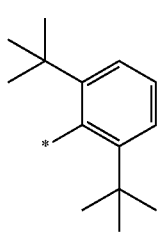 10-59
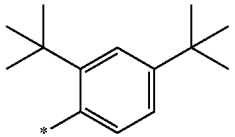 10-60
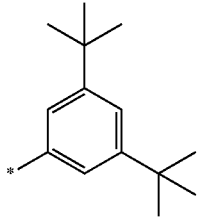 10-61
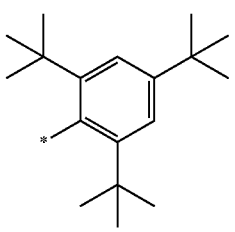 10-62
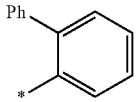 10-63
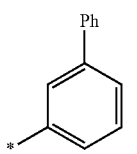 10-64
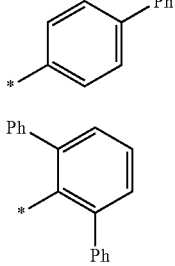 10-65
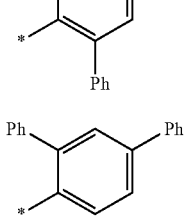 10-66
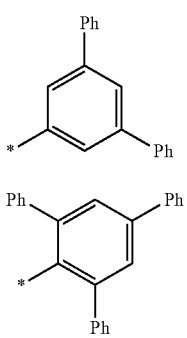 10-67
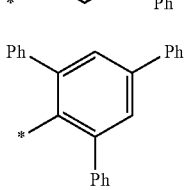 10-68
10-69

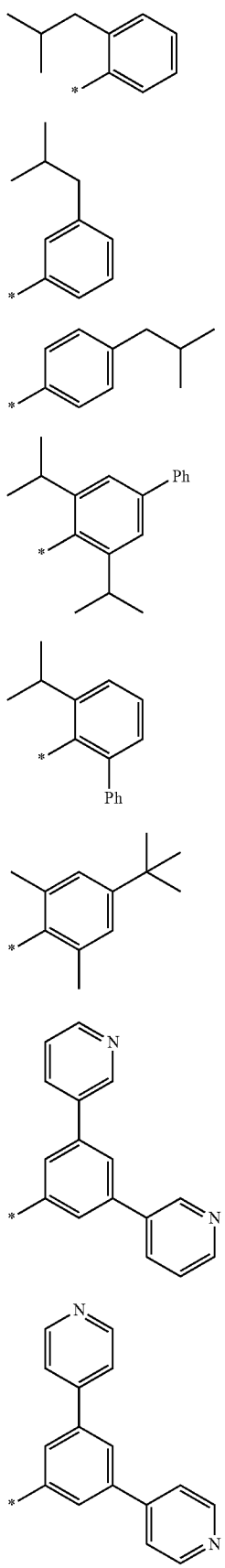
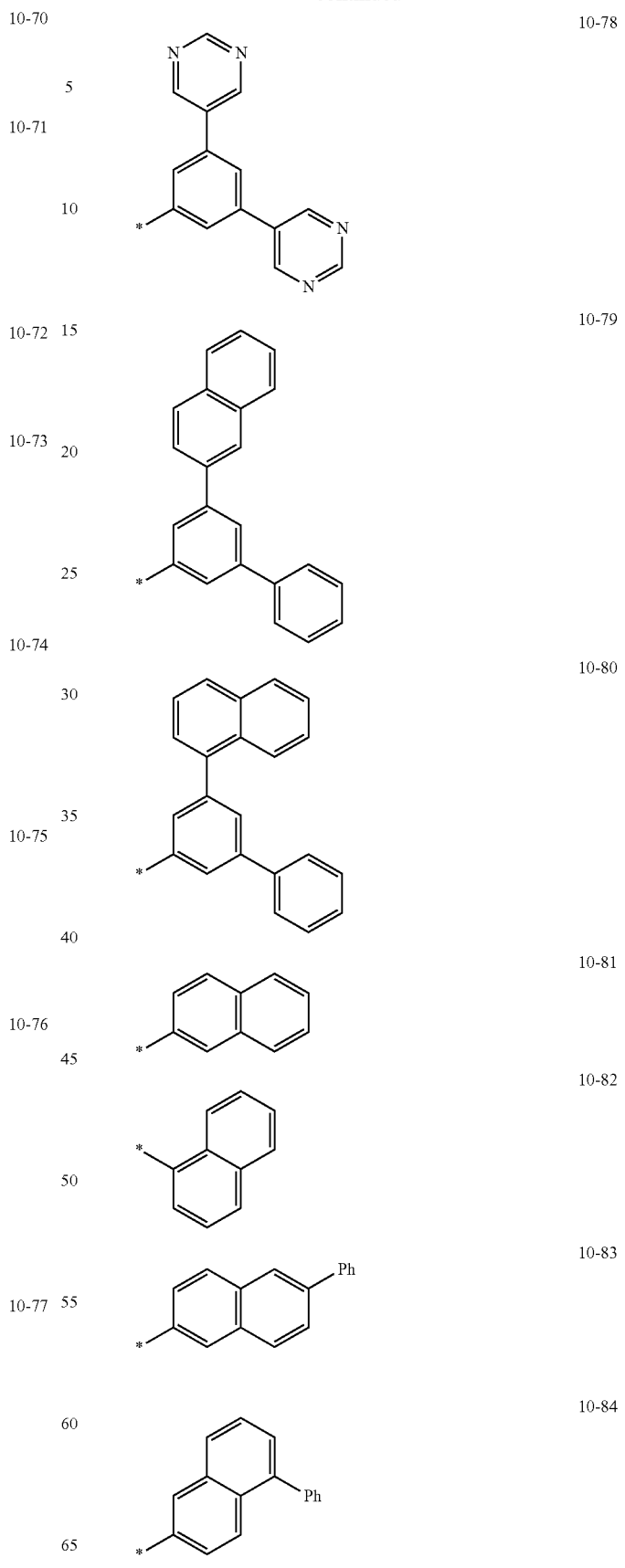

-continued
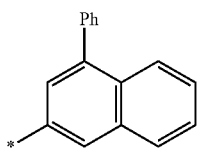
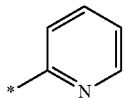
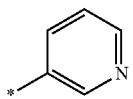
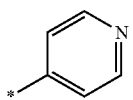
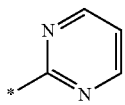
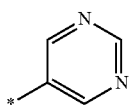
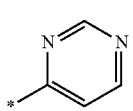
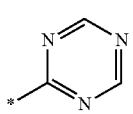
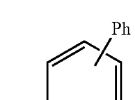
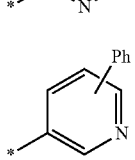
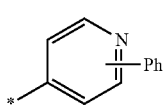
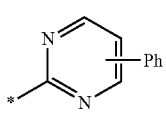
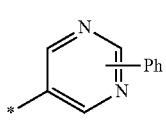
-continued
10-85
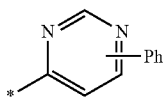
10-86
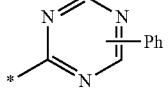
10-87
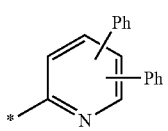
10-88
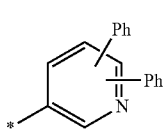
10-89
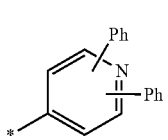
10-90
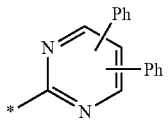
10-91
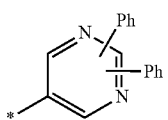
10-92
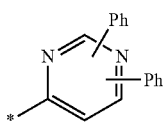
10-93
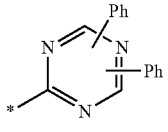
10-94
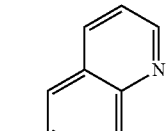
10-95
10-96
10-97
10-98
10-99
10-100
10-101
10-102
10-103
10-104
10-105
10-106
10-107
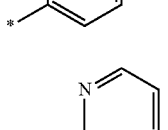
10-108
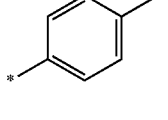

-continued
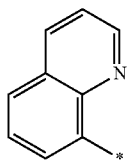
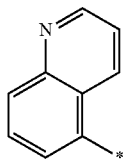 10-110
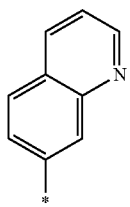 10-111
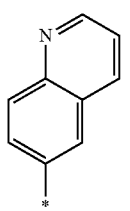 10-112
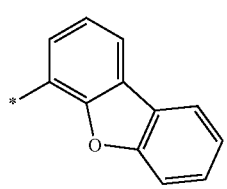 10-113
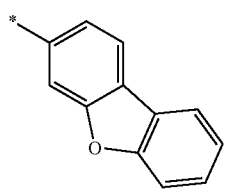 10-114
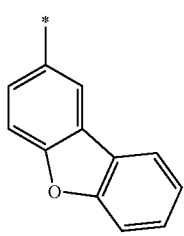 10-115
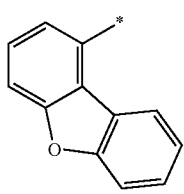 10-116
-continued
10-109 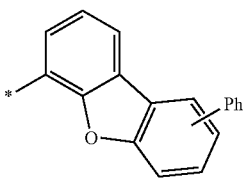 10-117
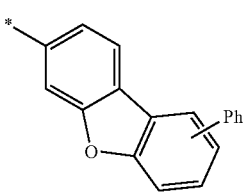 10-118
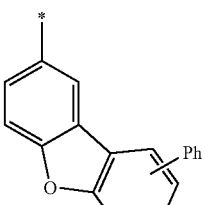 10-119
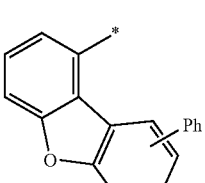 10-120
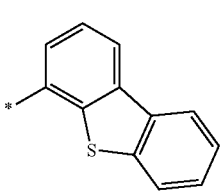 10-121
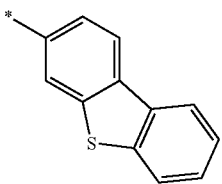 10-122
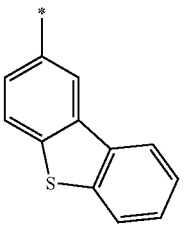 10-123
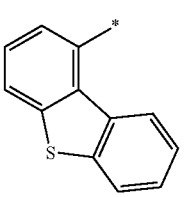 10-124

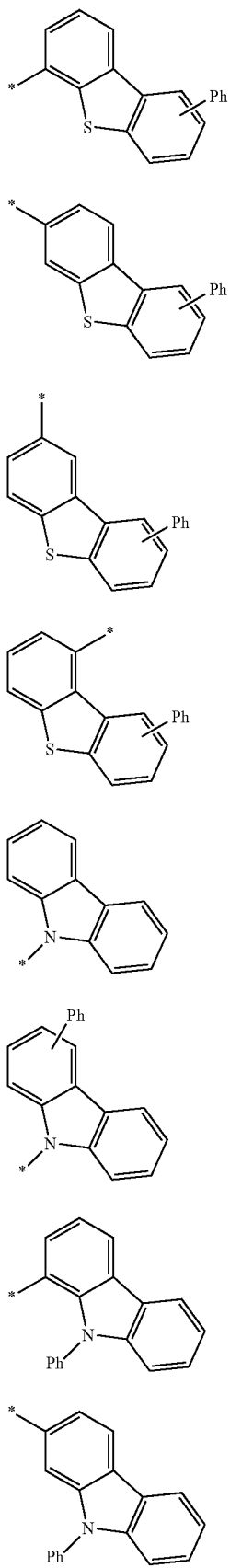
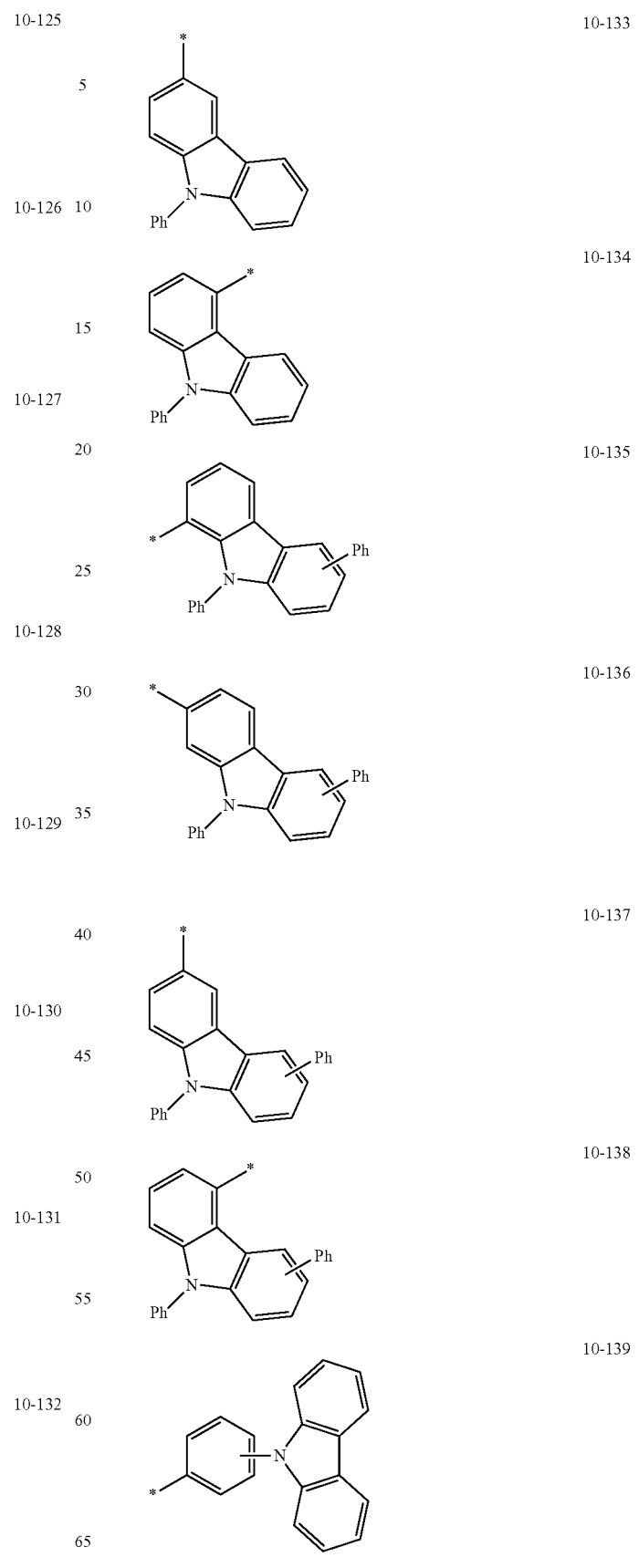

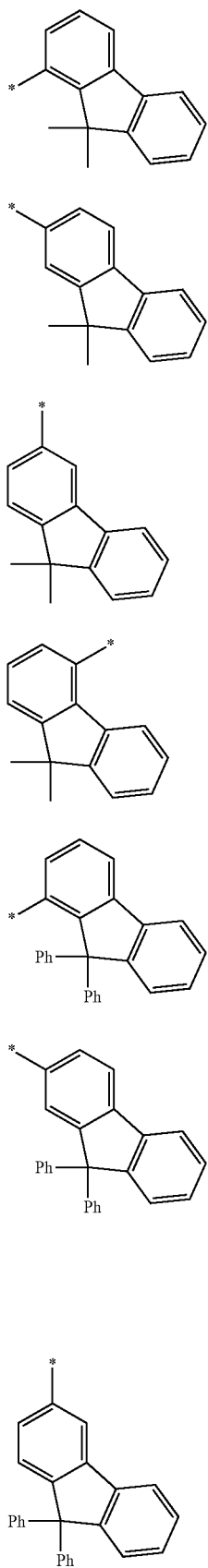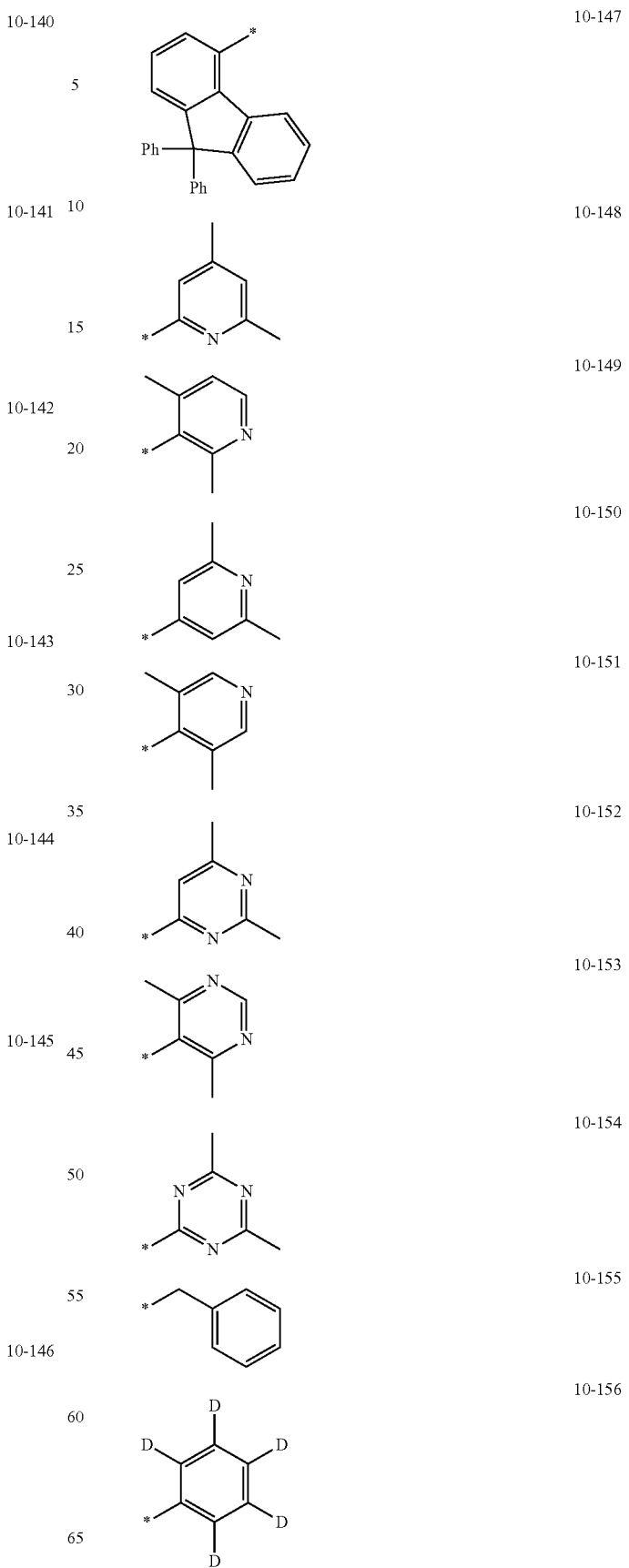

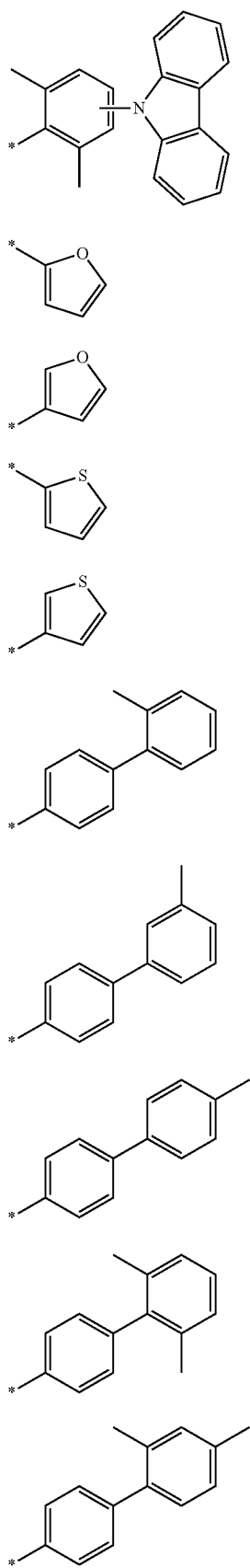
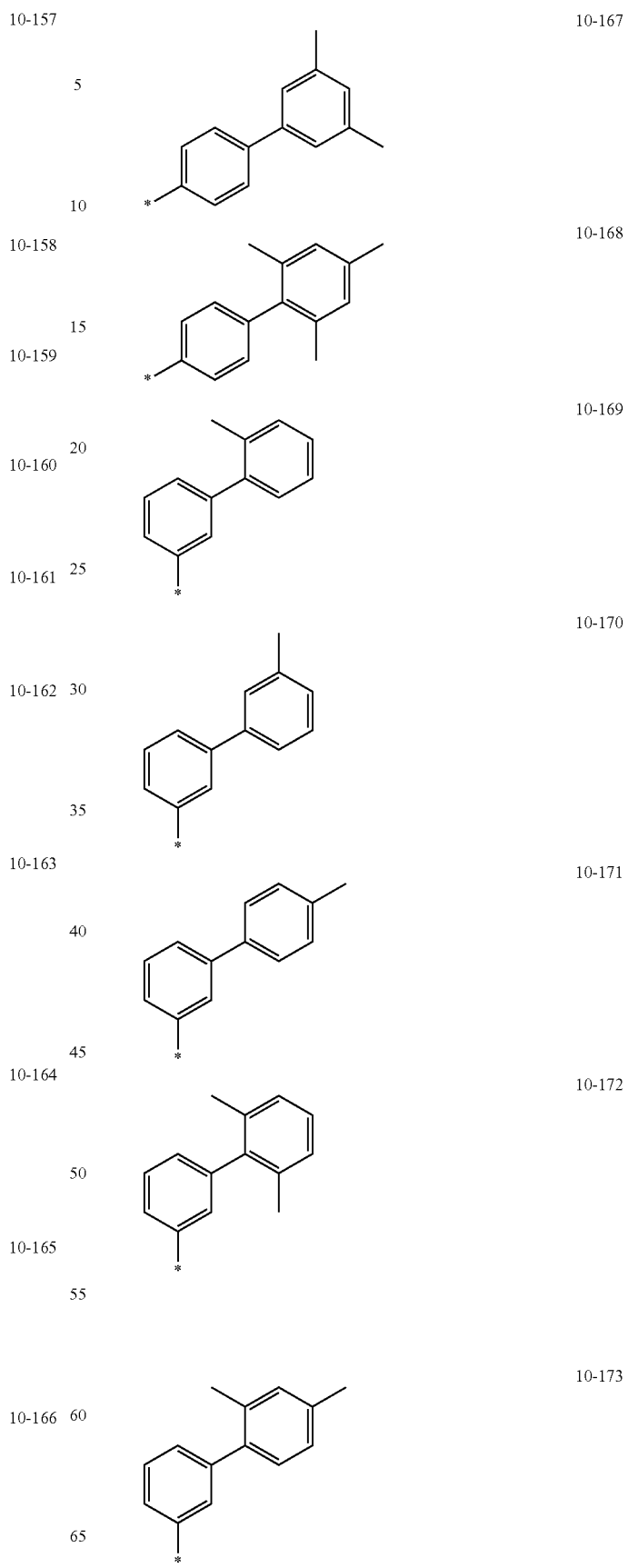

10-174 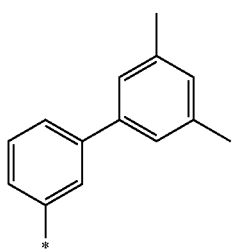
10-175 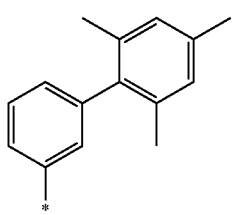
10-176 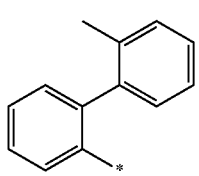
10-177 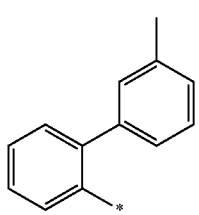
10-178 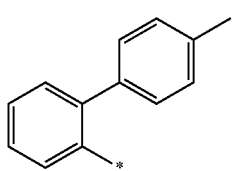
10-179 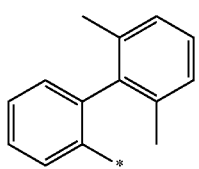
10-180 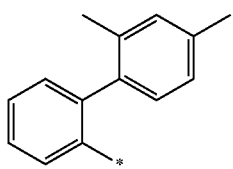
10-181 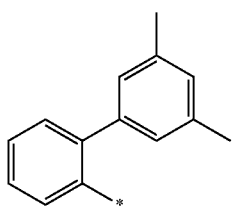
10-182 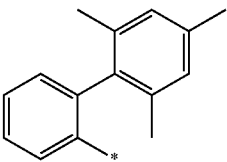
10-183 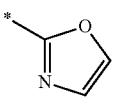
10-184 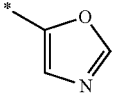
10-185 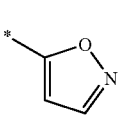
10-186 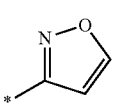
10-187 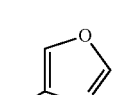
10-188 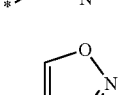
10-189 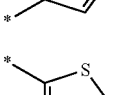
10-190 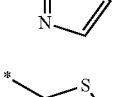
10-191 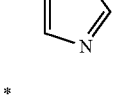
10-192 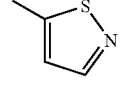
10-193 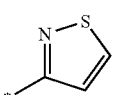
10-194 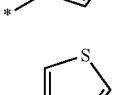
10-195 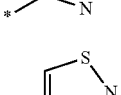

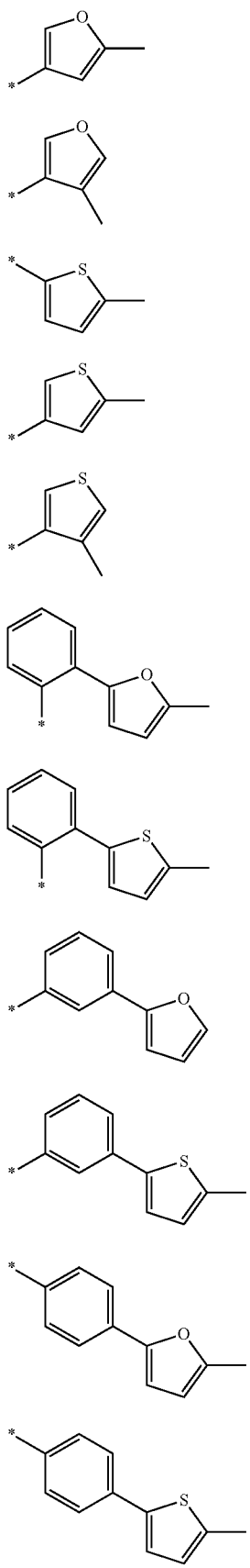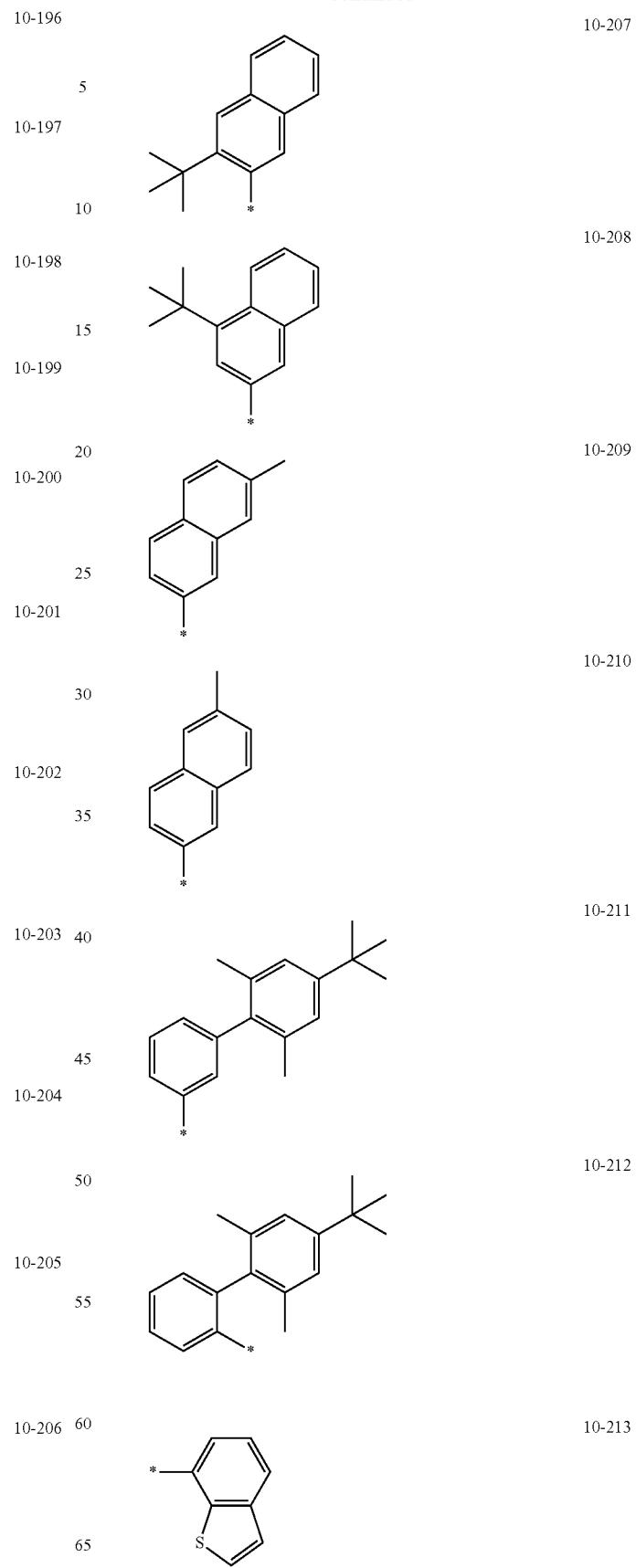

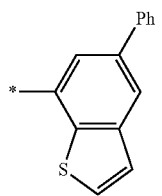 10-214

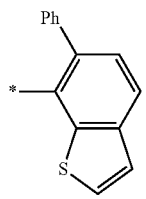 10-215

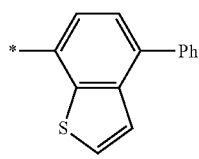 10-216

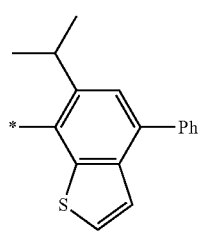 10-217

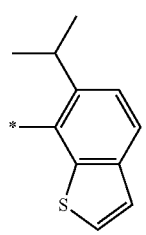 10-218

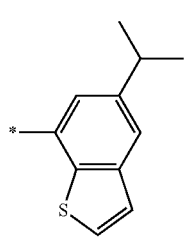 10-219

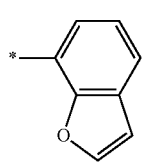 10-220

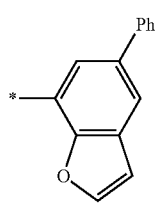 10-221

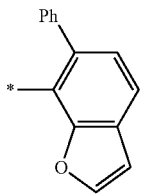 10-222

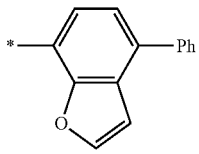 10-223

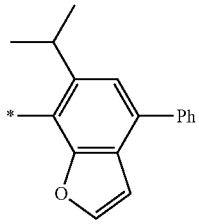 10-224

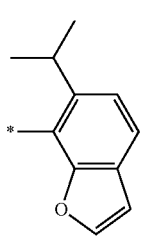 10-225

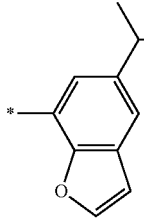 10-226 wherein, in Formulae 9-1 to 9-19 and 10-1 to 10-226, * indicates a binding site to an adjacent atom, "Ph" represents a phenyl group, and "TMS" represents a trimethylsilyl group.

a3 in Formula 2 indicates the number of $R_3$ groups. a3 may be an integer from 0 to 20 (for example, a3 may be an integer from 0 to 8). When a3 is 2 or greater, at least two $R_3$ groups may be identical to or different from each other.

In an embodiment, $L_1$ in Formula 1 may be selected from ligands represented by Formulae 2(1)-(1) to 2(1)-(27), but embodiments are not limited thereto:

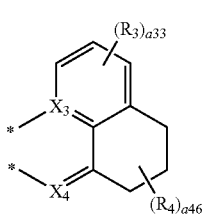 2(1)-(1)

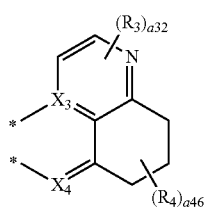 2(1)-(2)
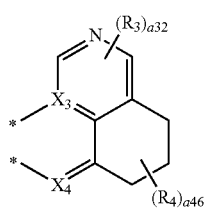 2(1)-(3)
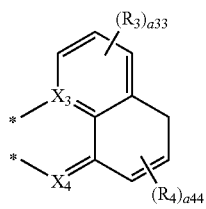 2(1)-(4)
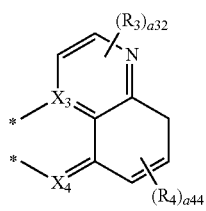 2(1)-(5)
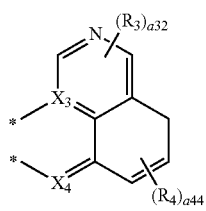 2(1)-(6)
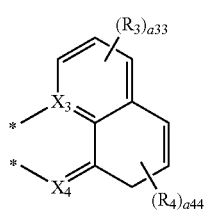 2(1)-(7)
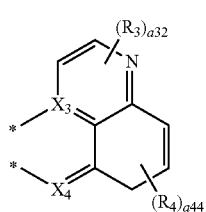 2(1)-(8)
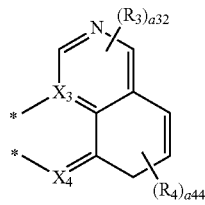 2(1)-(9)
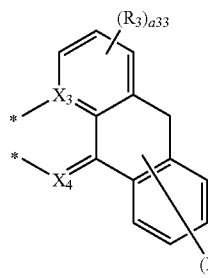 2(1)-(10)
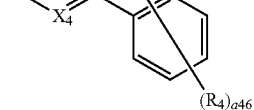 2(1)-(11)
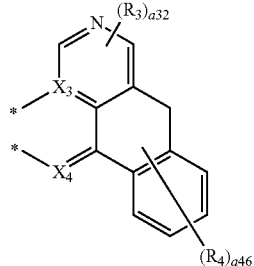 2(1)-(12)
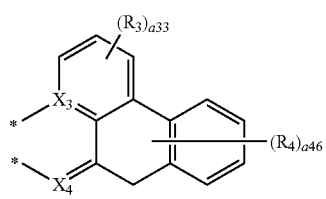 2(1)-(13)
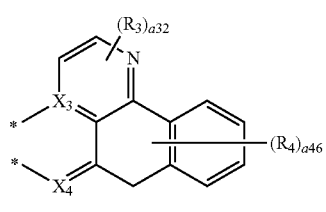 2(1)-(14)

2(1)-(15) 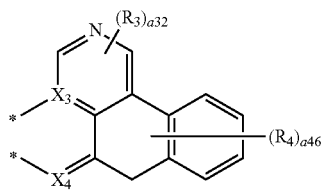

2(1)-(16) 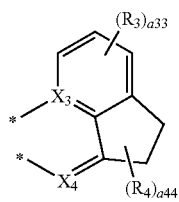

2(1)-(17) 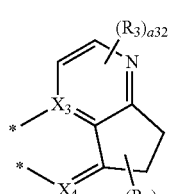

2(1)-(18) 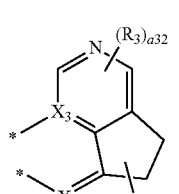

2(1)-(19) 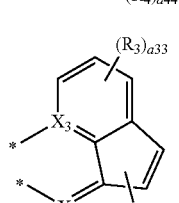

2(1)-(20) 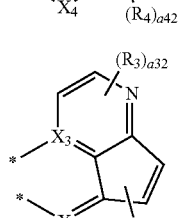

2(1)-(21) 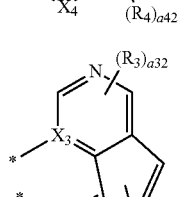

2(1)-(22) 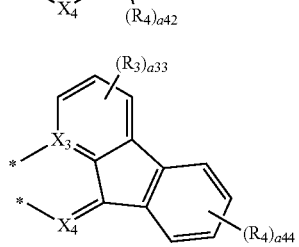

2(1)-(23) 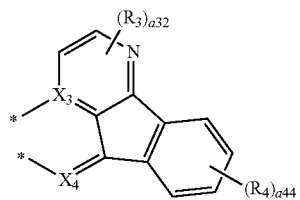

2(1)-(24) 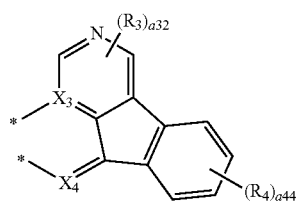

2(1)-(25) 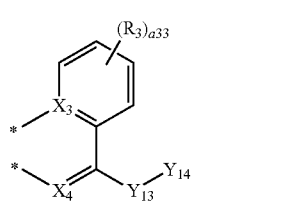

2(1)-(26) 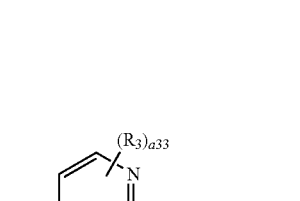

2(1)-(27) 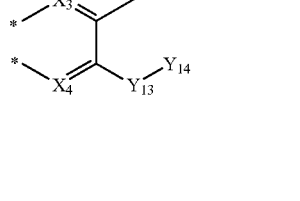

wherein, in Formulae 2(1)-(1) to 2(1)-1(27), $X_3$, $X_4$, $R_3$, and $R_4$ may respectively be understood by referring to the descriptions for those provided herein, a46 may be an integer from 0 to 6, a44 may be an integer from 0 to 4, a33 may be an integer from 0 to 3, a42 and a32 may each independently be an integer from 0 to 2, and

* indicates a binding site to M in Formula 1.

In some embodiments, an organometallic compound may be represented by Formula 1A:

Formula 1A

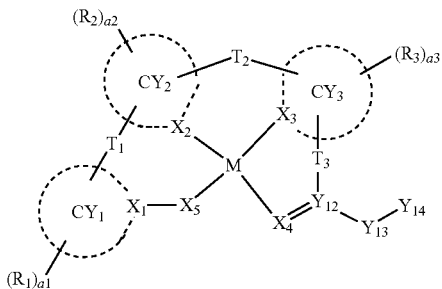

wherein, in Formula 1A,

M, $X_3$, $X_4$, $Y_{12}$ to $Y_{14}$, ring $CY_3$, $T_3$, $R_3$, and a3 may respectively be understood by referring to the descriptions for those provided herein, $X_1$ and $X_2$ may each independently be selected from N and C, $X_5$ may be selected from a chemical bond, O, S, B(R'), N(R'), P(R'), C(R')(R''), Si(R')(R''), Ge(R')(R''), C(=O), B(R')(R''), N(R')(R''), and P(R')(R''); when $X_5$ is a chemical bond, $X_1$ and M may be directly bound to each other, $X_4$ may be bound to M via a coordinate bond, two bonds selected from a bond between M and $X_5$ or $X_1$, a bond between $X_2$ and M, and a bond between $X_3$ and M may each be a covalent bond, while the remaining bond is a coordinate bond, ring $CY_1$ and ring $CY_2$ may each be understood by referring to the descriptions for ring $CY_3$ provided herein, $T_1$ and $T_2$ may each independently be selected from a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—(=O)—*', *—S(=O)$_2$—*', *—C($R_5$)=*', *=C($R_5$)—*', *—C($R_5$)=C($R_6$)—*', *—C(=S)—*', and *—C≡C—*', wherein * and *' each indicate a binding site to an adjacent atom, $R_1$, $R_2$, $R_5$, $R_6$, R' and R'' may each be understood by referring to the descriptions for $R_3$ provided herein, a1 and a2 may each be understood by referring to the descriptions for a3 provided herein, two adjacent groups selected from a plurality of $R_1$ groups may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, two adjacent groups selected from a plurality of $R_2$ groups may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, two adjacent groups selected from a plurality of $R_3$ groups may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, at least two adjacent groups selected from $R_1$ to $R_8$, R', and R'' may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, and $R_{10a}$ may be understood by referring to the descriptions therefor provided herein.

In one or more embodiments, the organometallic compound may be represented by Formula 1A(1):

Formula 1A(1)

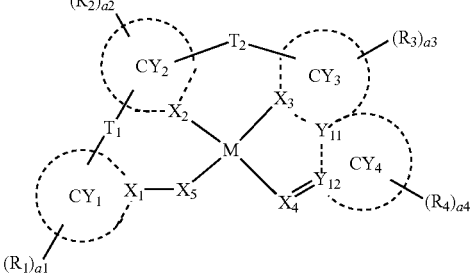

wherein, in Formula 1A(1),

M, $X_1$ to $X_5$, $Y_{12}$, ring $CY_1$ to ring $CY_3$, $T_1$, $T_2$, $R_1$ to $R_3$, and a1 to a3 may respectively be understood by referring to the descriptions for those provided herein, $Y_{11}$ may be selected from N and C, and ring $CY_4$, $R_4$, and a4 may respectively be understood by referring to the descriptions for ring $CY_3$, $R_3$, and a3.

The organometallic compound represented by Formula 1A or Formula 1A(1) may be electrically neutral.

In an embodiment, in Formulae 1A and 1A(1), i) $X_1$ and $X_3$ may each be C, and $X_2$ may be N, ii) $X_1$ and $X_2$ may each be N, and $X_3$ may be C, or iii) $X_1$ may be N, and $X_2$ and $X_3$ may each be C.

In one or more embodiments, in Formulae 1A and 1A(1), a bond between M and $X_5$ or $X_1$ and a bond between $X_3$ and M may each be a covalent bond, and a bond between $X_2$ and M may be a coordinate bond, or a bond between $X_2$ and M and a bond between $X_3$ and M may each be a covalent bond, $X_5$ may be a chemical bond, and a bond between $X_1$ and M may be a coordinate bond.

In one or more embodiments, in Formula 1A, $T_1$ and $T_3$ may each be a single bond, $T_2$ may be a single bond, *—N($R_5$)—*', *—C($R_5$)($R_6$)—*', *—Si($R_5$)($R_6$)—*', *—S—*', or *—O—*'.

In one or more embodiments, Formulae 1A and 1A(1) may satisfy one of Conditions 1 to 3:

Condition 1 a) $X_5$ may be a chemical bond;

b) the moiety represented by

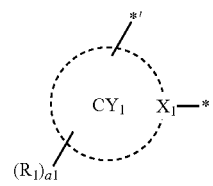

may be represented by Formula A1-1;
c) $T_1$ may be a single bond; and
d) the moiety represented by

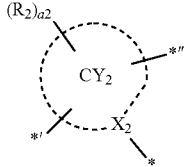

may be represented by Formula A2-2, or $T_2$ may be selected from *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—S—*', *—Se—*', *—O—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', and *—C≡C—*', Condition 2 a) $X_5$ may be selected from O, S, B(R'), N(R'), P(R'), C(R')(R''), Si(R')(R''), Ge(R')(R''), C(=O), B(R')(R''), N(R')(R''), and P(R')(R''), b) the moiety represented by

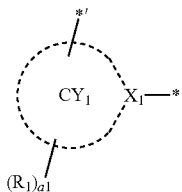

may be represented by Formula A1-1;
c) $T_1$ may be a single bond; and
d) the moiety represented by

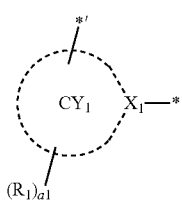

may be represented by Formula A2-1 or Formula A2-2, and

Condition 3 a) $X_5$ may be a chemical bond;
b) the moiety represented by

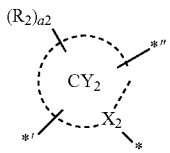

may be represented by Formula A1-2;
c) $T_1$ may be a single bond; and
d) the moiety represented by

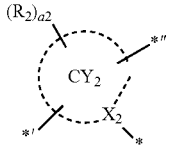

may be represented by Formula A2-1 or Formula A2-2, and

A1-1

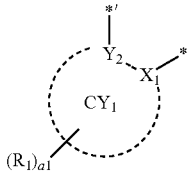

A1-2

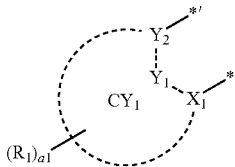

A2-1

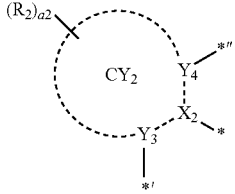

A2-2

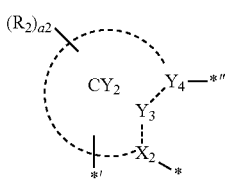

wherein, in Formulae A1-1 and A1-2, $X_1$, ring $CY_1$, $R_1$, and a1 may respectively be understood by referring to the descriptions for those provided herein, $Y_1$ and $Y_2$ may each independently be selected from N and C, * indicates a binding site to M or $X_5$ in Formulae 1A and 1A(1), *' indicates a binding site to $T_1$ in Formulae 1A and 1A(1), in Formulae A2-1 and A2-2, $X_2$, ring $CY_2$, $R_2$, and a2 may respectively be understood by referring to the descriptions for those provided herein, $Y_3$ and $Y_4$ may each independently be selected from N and C, * indicates a binding site to M in Formulae 1A and 1A(1), *' indicates a binding site to $T_1$ in Formulae 1A and 1A(1), and *" indicates a binding site to $T_2$ in Formulae 1A and 1A(1).

In one or more embodiments, in Formulae 1A and 1A(1), the moiety represented by
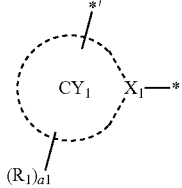
may be represented by one of Formulae A1-1(1) to A1-1(28) and A1-2(1) to A1-2(74):
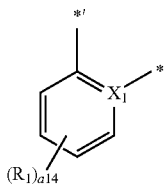
A1-1(1)
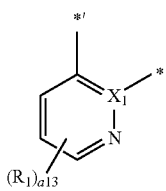
A1-1(2)
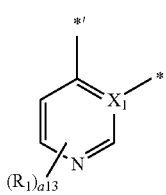
A1-1(3)
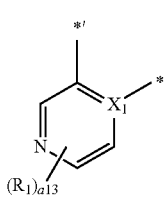
A1-1(4)
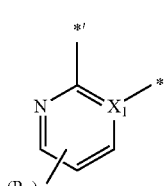
A1-1(5)
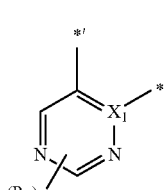
A1-1(6)
-continued
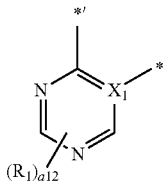
A1-1(7)
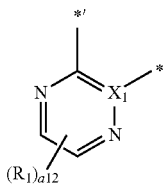
A1-1(8)
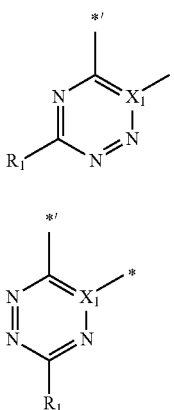
A1-1(9)
A1-1(10)
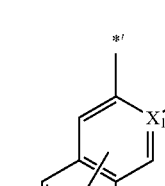
A1-1(11)
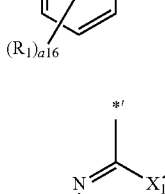
A1-1(12)
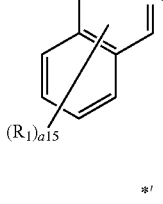
A1-1(13)
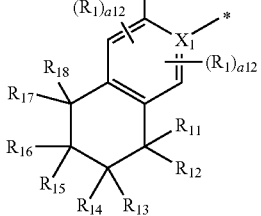

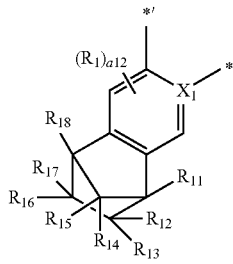 A1-1(14)
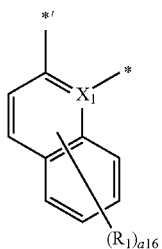 A1-1(15)
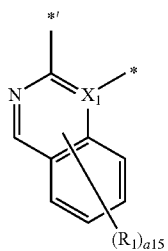 A1-1(16)
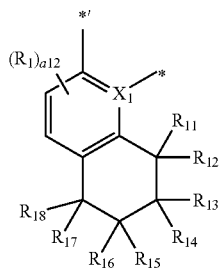 A1-1(17)
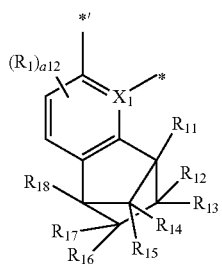 A1-1(18)
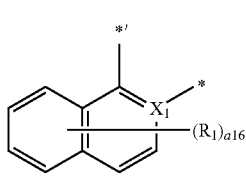 A1-1(19)
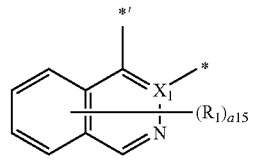 A1-1(20)
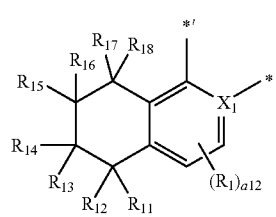 A1-1(21)
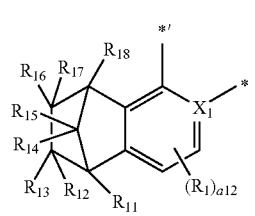 A1-1(22)
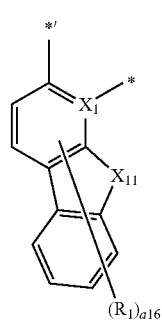 A1-1(23)
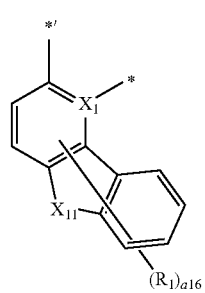 A1-1(24)
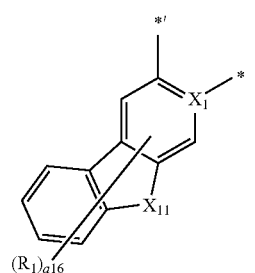 A1-1(25)

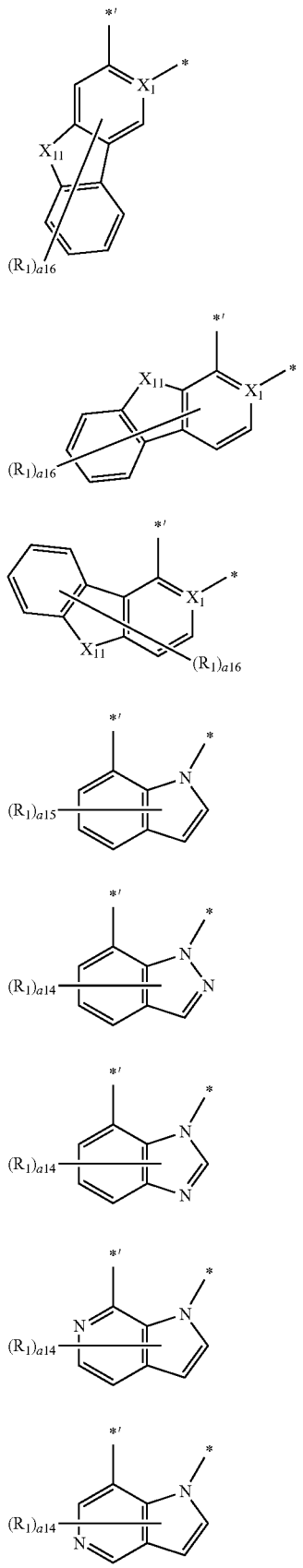
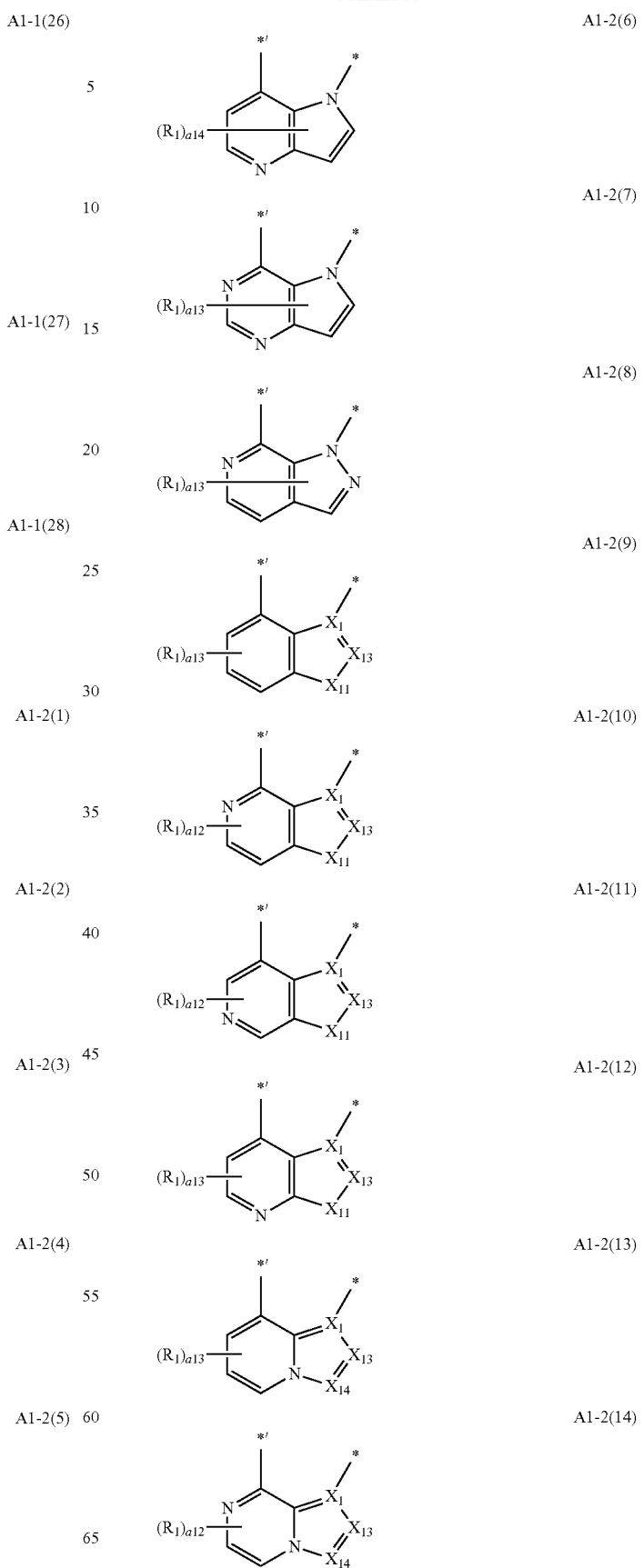

A1-2(15)
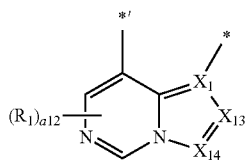
A1-2(16)
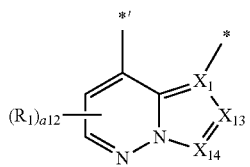
A1-2(17)
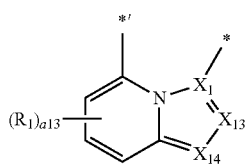
A1-2(18)
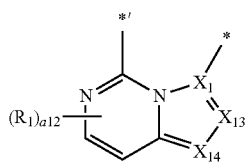
A1-2(19)
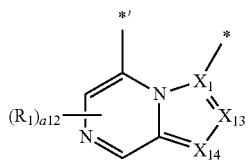
A1-2(20)
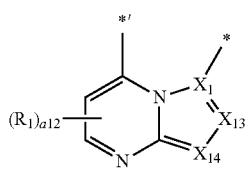
A1-2(21)
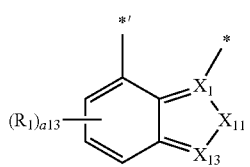
A1-2(22)
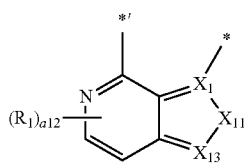
A1-2(23)
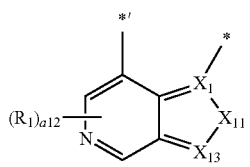
A1-2(24)
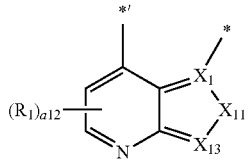
A1-2(25)
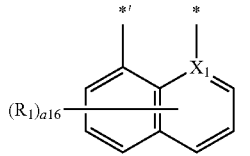
A1-2(26)
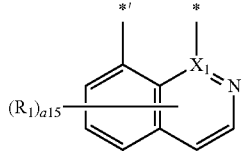
A1-2(27)
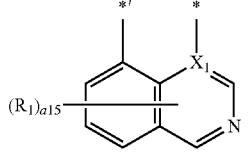
A1-2(28)
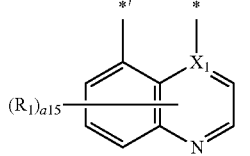
A1-2(29)
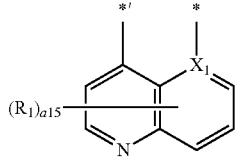
A1-2(30)
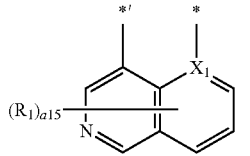
A1-2(31)
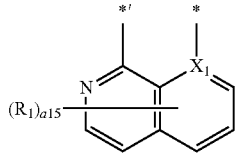
A1-2(32)
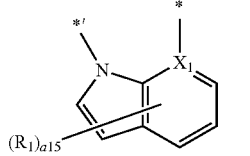

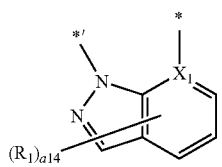 A1-2(33)
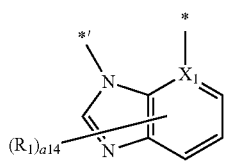 A1-2(34)
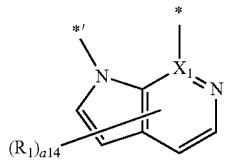 A1-2(35)
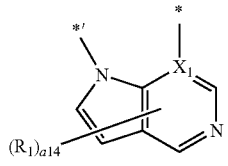 A1-2(36)
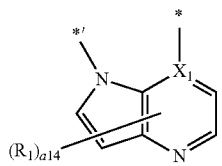 A1-2(37)
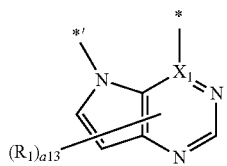 A1-2(38)
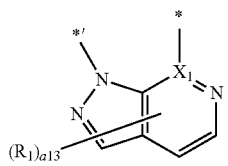 A1-2(39)
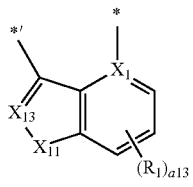 A1-2(40)
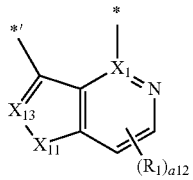 A1-2(41)
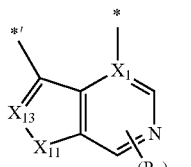 A1-2(42)
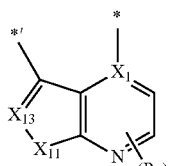 A1-2(43)
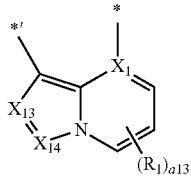 A1-2(44)
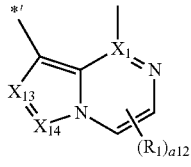 A1-2(45)
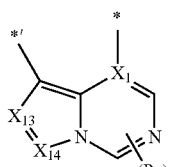 A1-2(46)
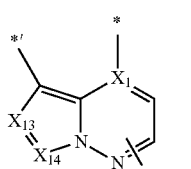 A1-2(47)
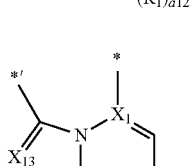 A1-2(48)
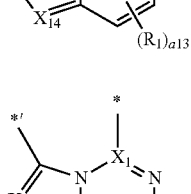 A1-2(49)

-continued
A1-2(50)
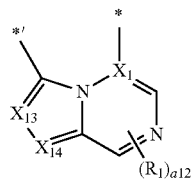
A1-2(51)
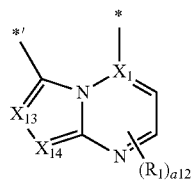
A1-2(52)
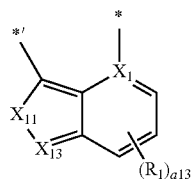
A1-2(53)
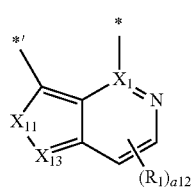
A1-2(54)
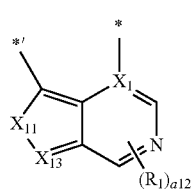
A1-2(55)
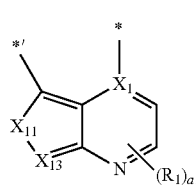
A1-2(56)
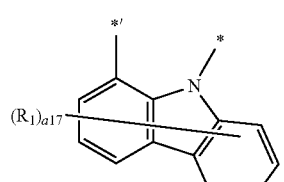
A1-2(57)
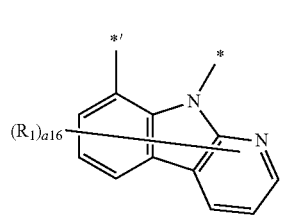
-continued
A1-2(58)
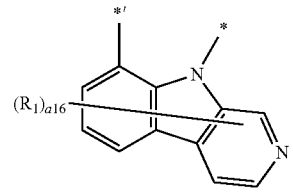
A1-2(59)
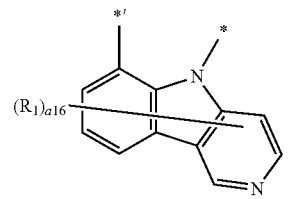
A1-2(60)
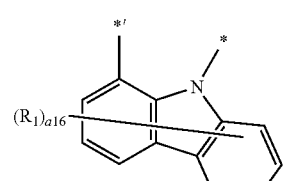
A1-2(61)
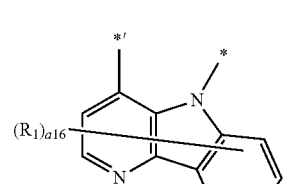
A1-2(62)
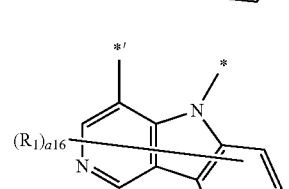
A1-2(63)
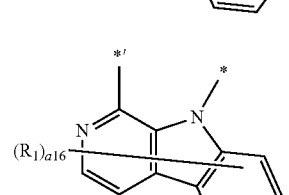
A1-2(64)
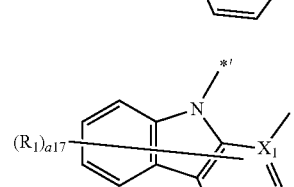
A1-2(65)
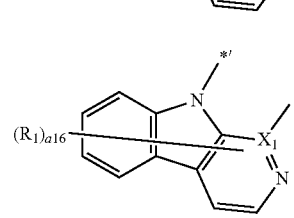

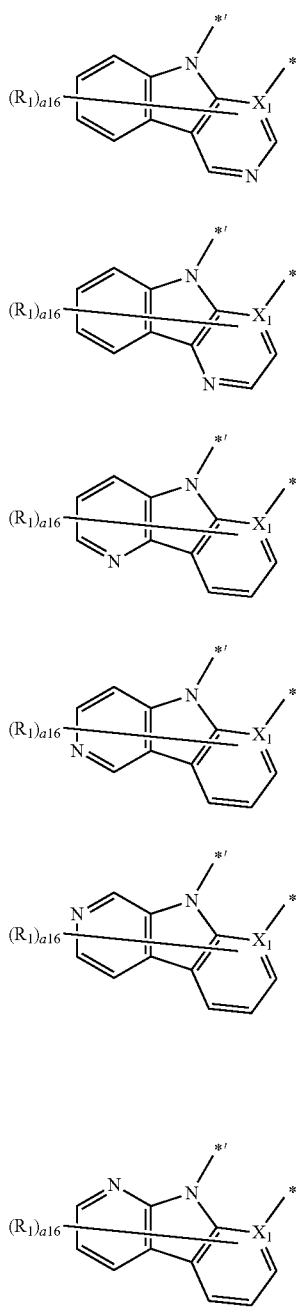

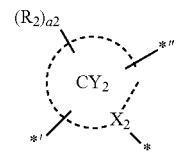

wherein, in Formulae A1-1(1) to A1-1(28) and A1-2(1) to A1-2(74), $X_1$ and $R_1$ may respectively be understood by referring to the descriptions for those provided herein, $X_{11}$ may be selected from O, S, $N(R_{11})$, $C(R_{11})(R_{12})$, and $Si(R_{11})(R_{12})$, $X_{13}$ may be selected from N and $C(R_{13})$, $X_{14}$ may be selected from N and $C(R_{14})$, $R_{11}$ to $R_{18}$ may each be understood by referring to the descriptions for $R_1$ provided herein, a17 may be an integer from 0 to 7, a16 may be an integer from 0 to 6, a15 may be an integer from 0 to 5, a14 may be an integer from 0 to 4, a13 may be an integer from 0 to 3, a12 may be an integer from 0 to 2,

* indicates a binding site to M or $X_5$ in Formulae 1A and 1A(1), and

*' indicates a binding site to $T_1$ in Formulae 1A and 1A(1).

In one or more embodiments, in Formulae 1A and 1A(1), the moiety represented by

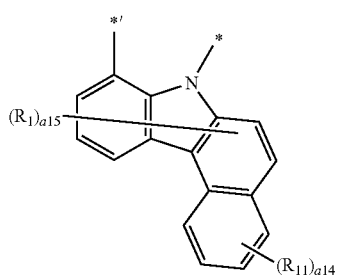

may be represented by one of Formulae A2-1(1) to A2-1(17), A2-2(1) to A2-2(58), and A2-3(1) to A2-3(58):

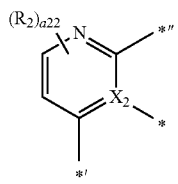
A2-1(2)
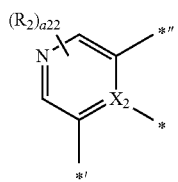
A2-1(3)
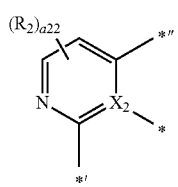
A2-1(4)
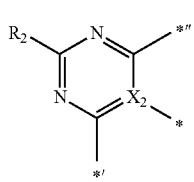
A2-1(5)
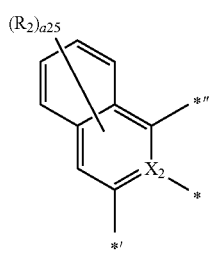
A2-1(6)
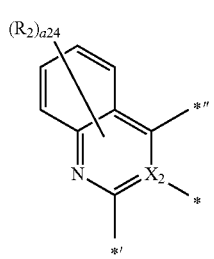
A2-1(7)
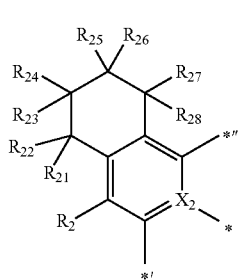
A2-1(8)
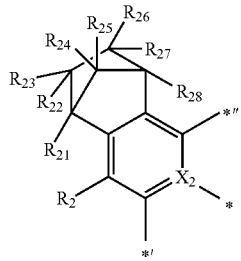
A2-1(9)
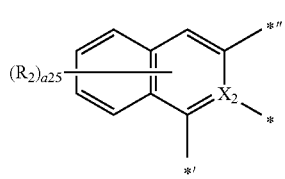
A2-1(10)
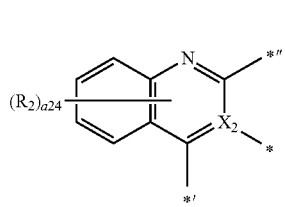
A2-1(11)
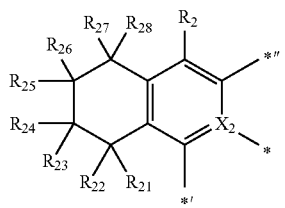
A2-1(12)
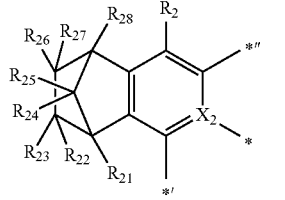
A2-1(13)
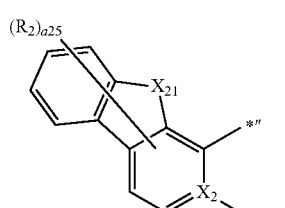
A2-1(14)

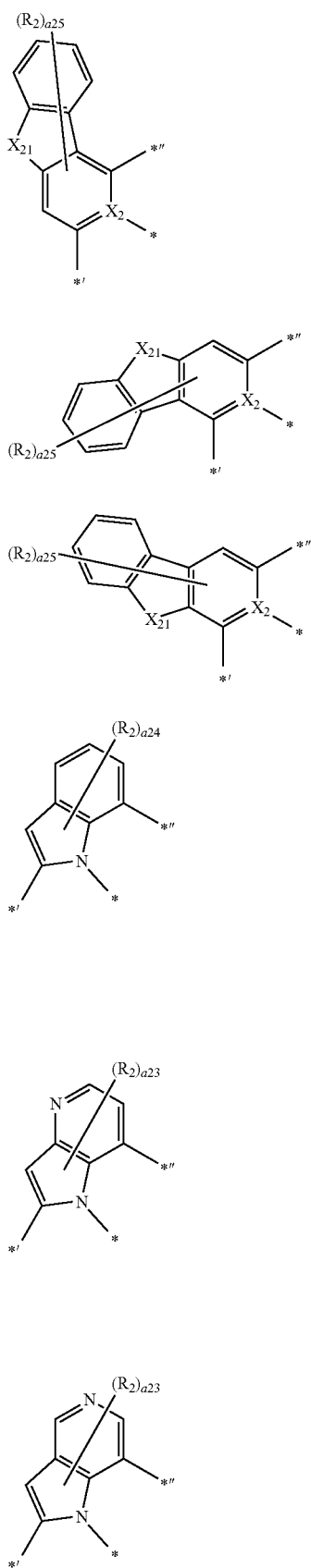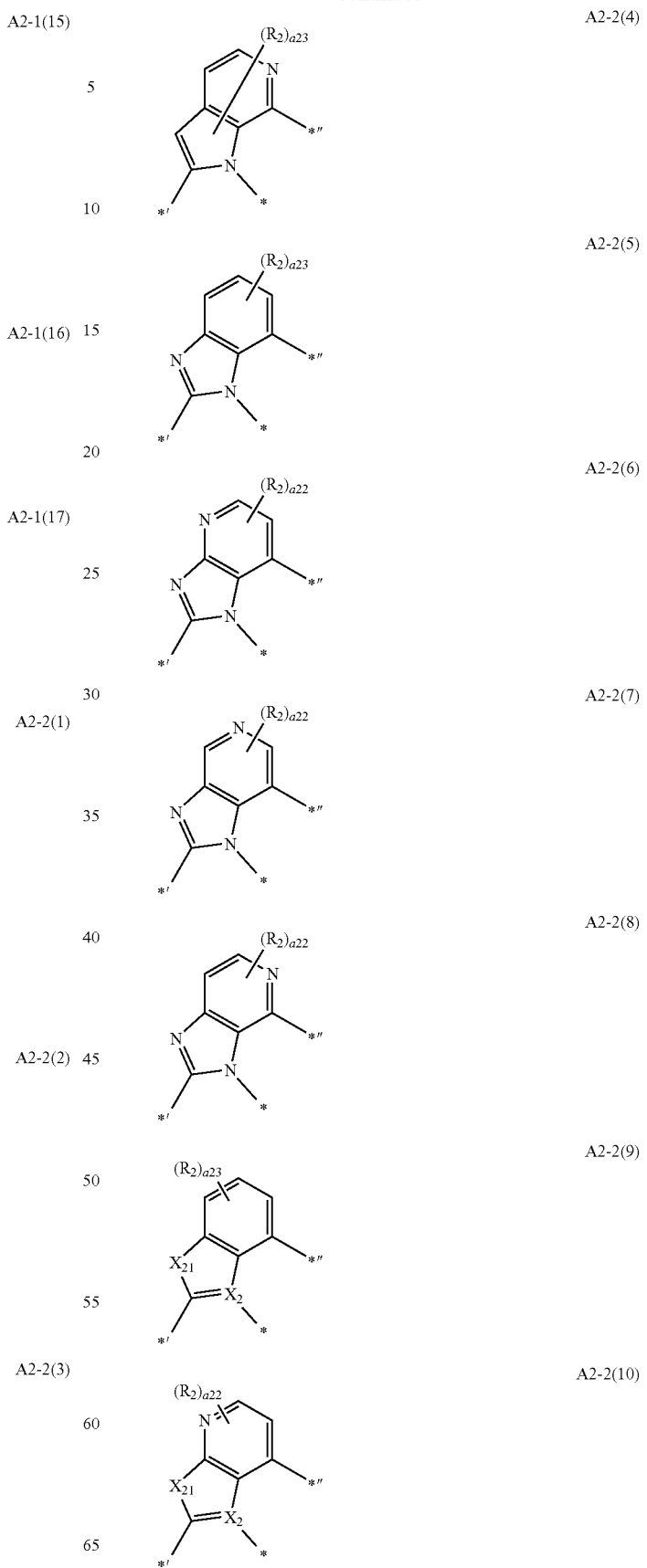

-continued

A2-2(11)

A2-2(12)

A2-2(13)

A2-2(14)

A2-2(15)

A2-2(16)

A2-2(17)

-continued

A2-2(18)

A2-2(19)

A2-2(20)

A2-2(21)

A2-2(22)

A2-2(23)

A2-2(24)

-continued
A2-2(25)
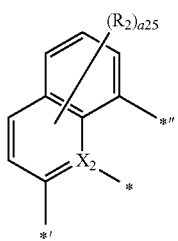
A2-2(26)
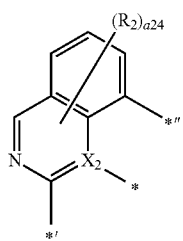
A2-2(27)
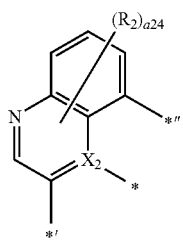
A2-2(28)
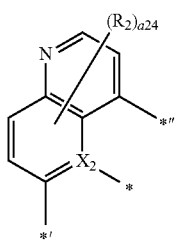
A2-2(29)
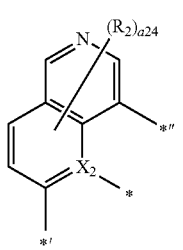
A2-2(30)
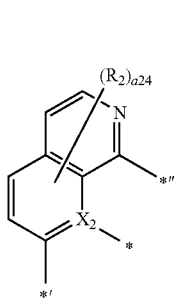
-continued
A2-2(31)
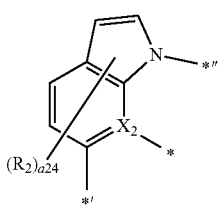
A2-2(32)
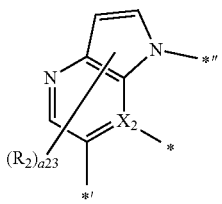
A2-2(33)
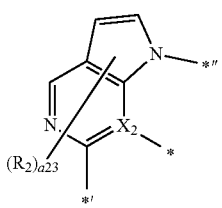
A2-2(34)
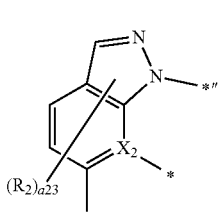
A2-2(35)
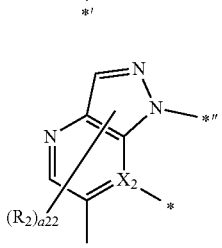
A2-2(36)
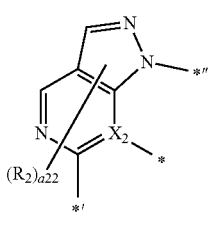
A2-2(37)
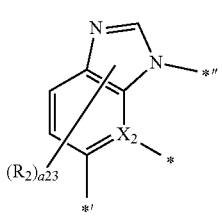

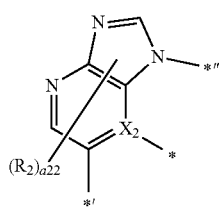 A2-2(38)
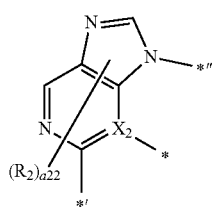 A2-2(39)
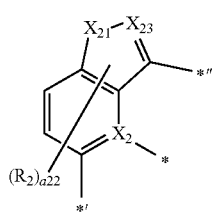 A2-2(40)
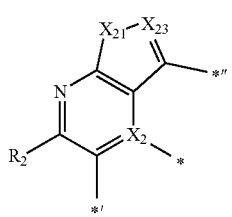 A2-2(41)
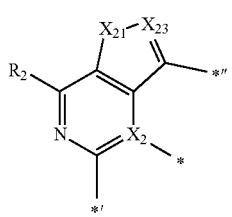 A2-2(42)
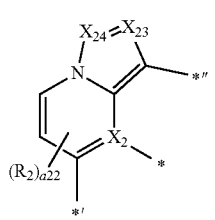 A2-2(43)
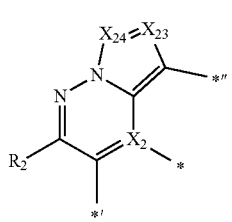 A2-2(44)
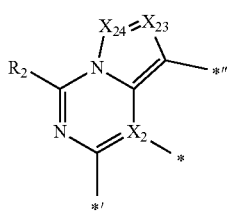 A2-2(45)
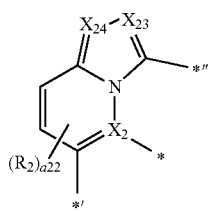 A2-2(46)
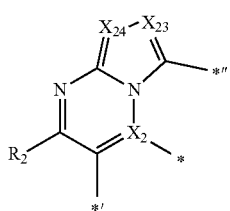 A2-2(47)
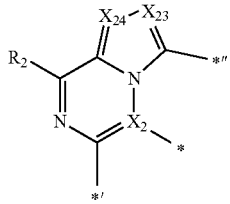 A2-2(48)
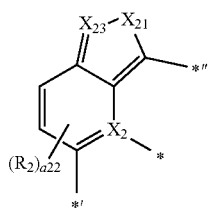 A2-2(49)
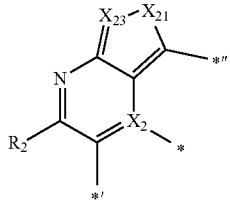 A2-2(50)
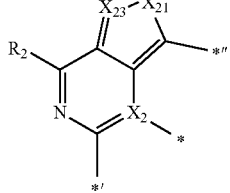 A2-2(51)

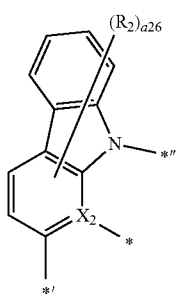 A2-2(52)
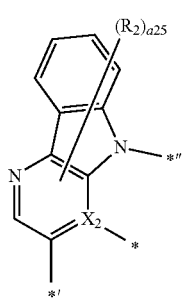 A2-2(53)
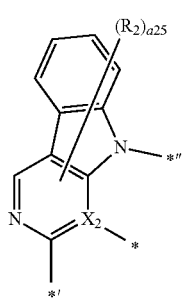 A2-2(54)
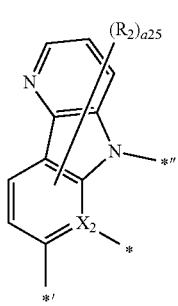 A2-2(55)
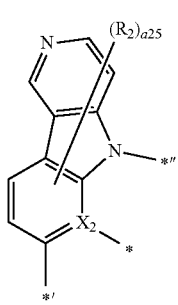 A2-2(56)
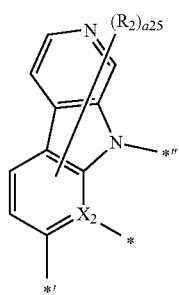 A2-2(57)
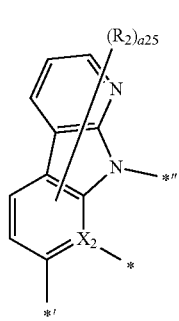 A2-2(58)
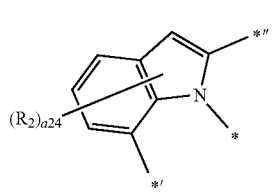 A2-3(1)
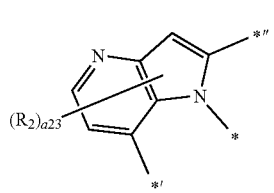 A2-3(2)
A2-3(3)
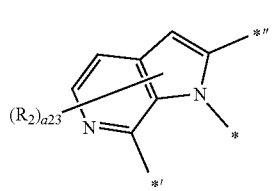 A2-3(4)
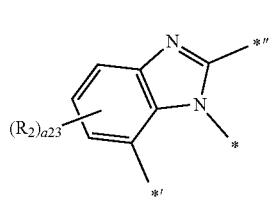 A2-3(5)

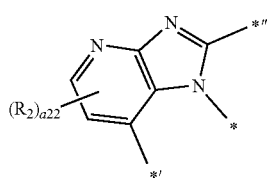 A2-3(6)
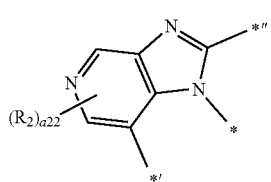 A2-3(7)
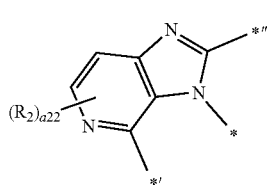 A2-3(8)
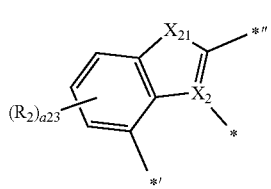 A2-3(9)
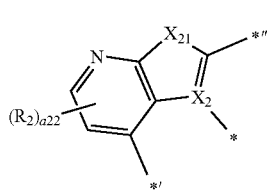 A2-3(10)
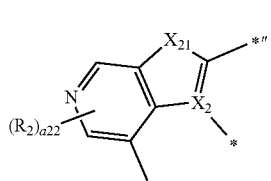 A2-3(11)
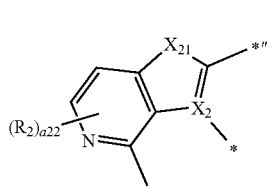 A2-3(12)
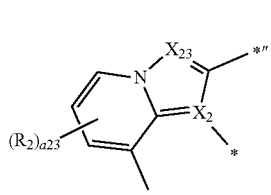 A2-3(13)
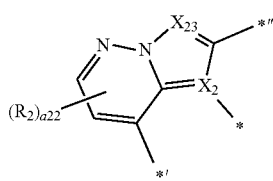 A2-3(14)
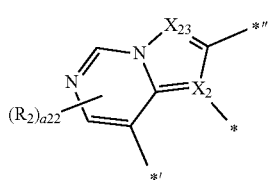 A2-3(15)
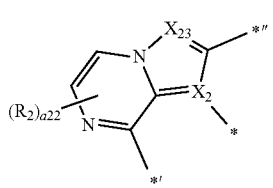 A2-3(16)
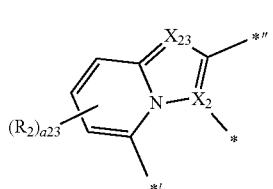 A2-3(17)
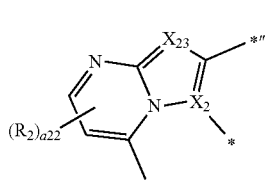 A2-3(18)
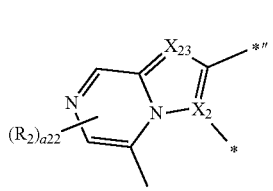 A2-3(19)
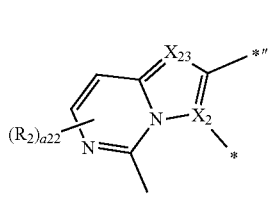 A2-3(20)
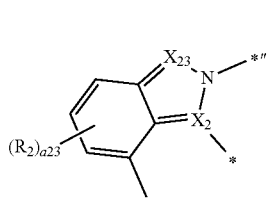 A2-3(21)

| | |
|---|---|
| 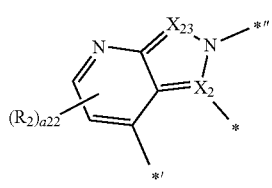 A2-3(22) | 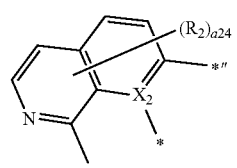 A2-3(30) |
| 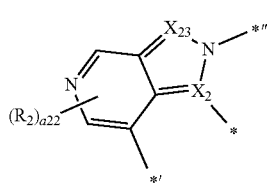 A2-3(23) | 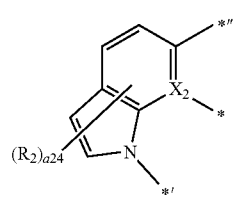 A2-3(31) |
| 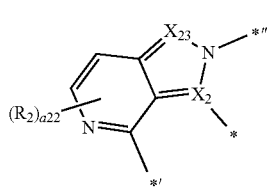 A2-3(24) | 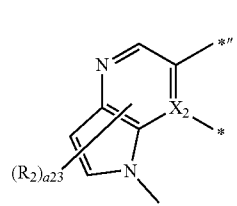 A2-3(32) |
| 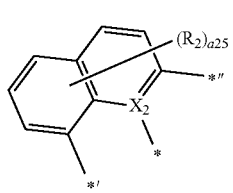 A2-3(25) | 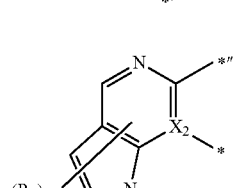 A2-3(33) |
| 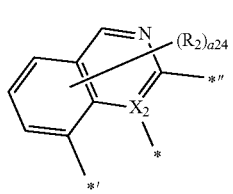 A2-3(26) | 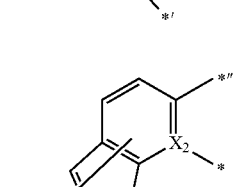 A2-3(34) |
| 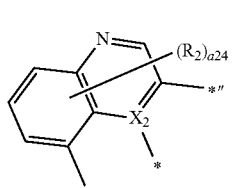 A2-3(27) | 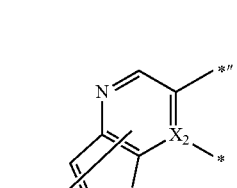 A2-3(35) |
| 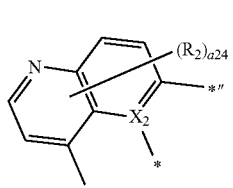 A2-3(28) | 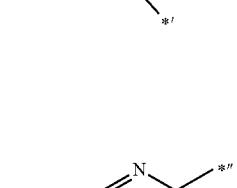 |
| 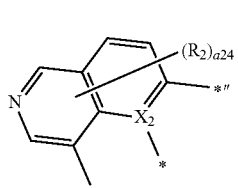 A2-3(29) | 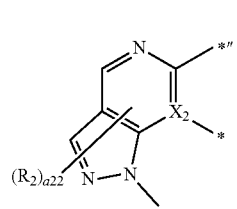 A2-3(36) |

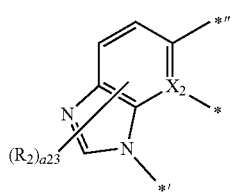
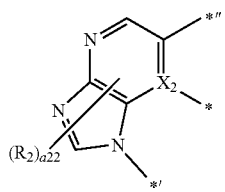
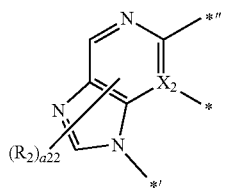
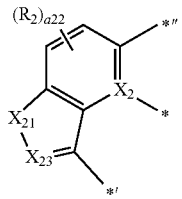
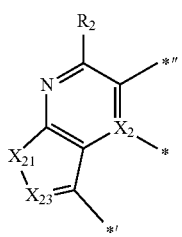
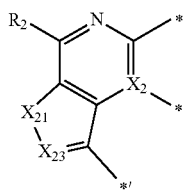
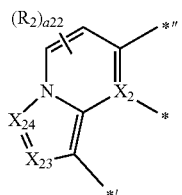
A2-3(37)
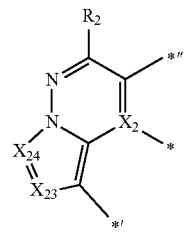
A2-3(38)
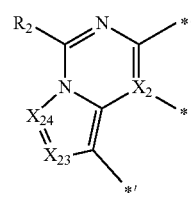
A2-3(39)
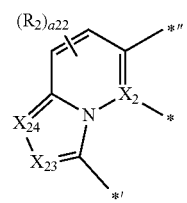
A2-3(40)
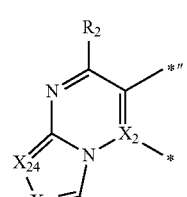
A2-3(41)
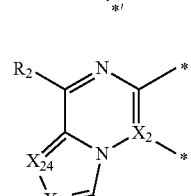
A2-3(42)
A2-3(43)
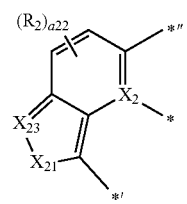
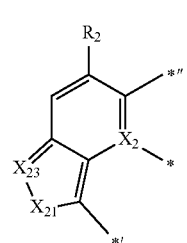
A2-3(44)
A2-3(45)
A2-3(46)
A2-3(47)
A2-3(48)
A2-3(49)
A2-3(50)

A2-3(51) 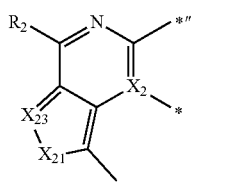

A2-3(52) 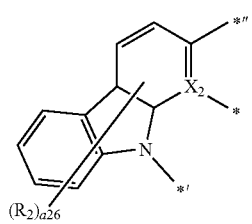

A2-3(53) 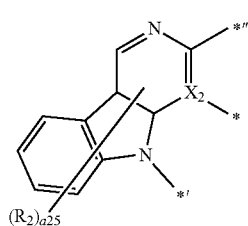

A2-3(54) 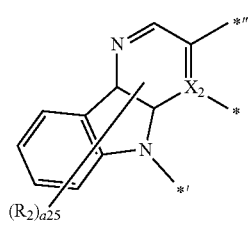

A2-3(55) 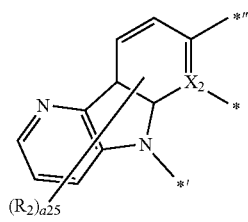

A2-3(56) 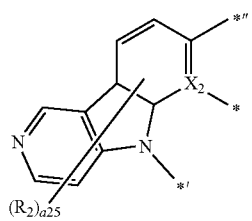

A2-3(57) 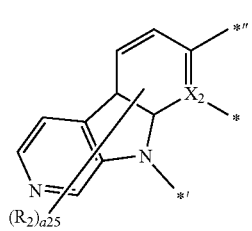

A2-3(58) 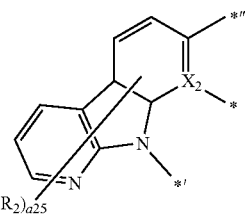

wherein, in Formulae A2-1(1) to A2-1(17), A2-2(1) to A2-2(58), and A2-3(1) to A2-3(58), $X_2$ and $R_2$ may respectively be understood by referring to the descriptions for those provided herein, $X_{21}$ may be selected from O, S, $N(R_{21})$, $C(R_{21})(R_{22})$, and $Si(R_{21})(R_{22})$, $X_{23}$ may be selected from N and $C(R_{23})$, $X_{24}$ may be selected from N and $C(R_{24})$, $R_{21}$ to $R_{28}$ may each be understood by referring to the descriptions for $R_2$ provided herein, a26 may be an integer from 0 to 6, a25 may be an integer from 0 to 5, a24 may be an integer from 0 to 4, a23 may be an integer from 0 to 3, a22 may be an integer from 0 to 2, \* indicates a binding site to M in Formulae 1A and 1A(1), \*' indicates a binding site to $T_1$ in Formulae 1A and 1A(1), and \*" indicates a binding site to $T_2$ in Formulae 1A and 1A(1).

In one or more embodiments, in Formulae 1A and 1A(1), the moiety represented by

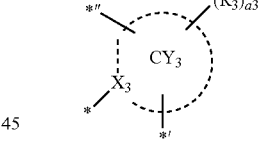

may be represented by one of Formulae A3-1(1) to A3-1(21) and A3-3(1) to A3-3(58):

A3-1(1) 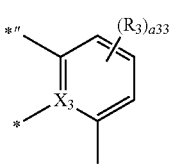

A3-1(2) 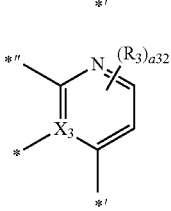

-continued
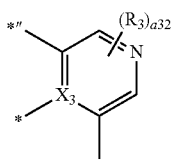
A3-1(3)
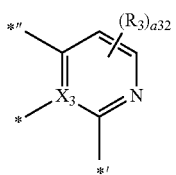
A3-1(4)
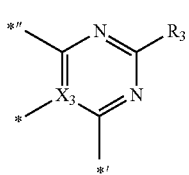
A3-1(5)
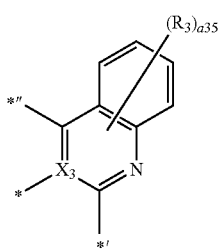
A3-1(6)
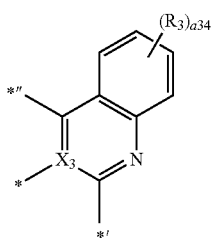
A3-1(7)
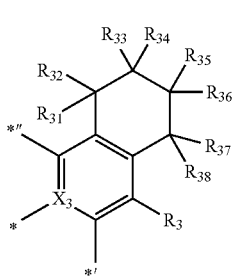
A3-1(8)
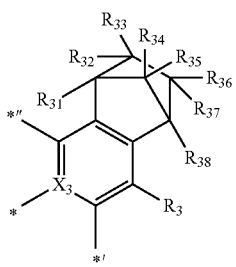
A3-1(9)
-continued
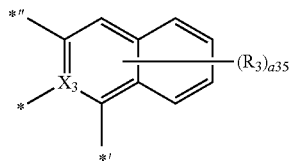
A3-1(10)
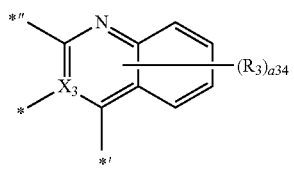
A3-1(11)
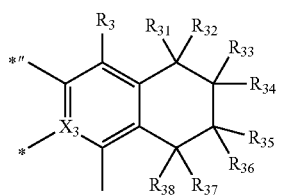
A3-1(12)
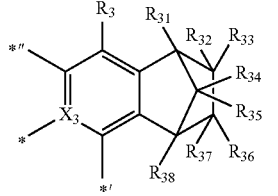
A3-1(13)
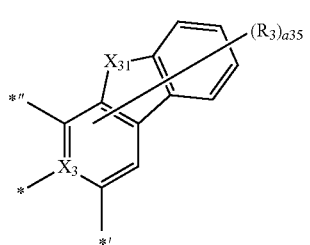
A3-1(14)
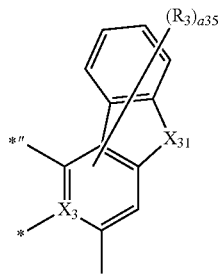
A3-1(15)
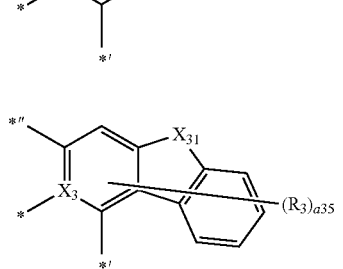
A3-1(16)

-continued
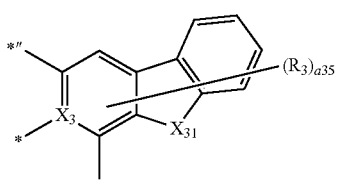
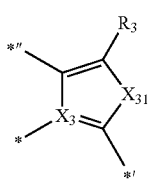
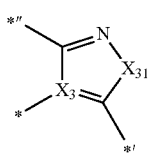
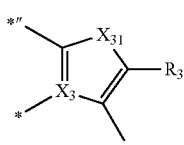
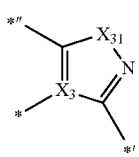
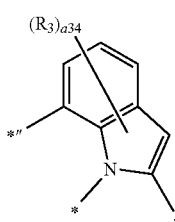
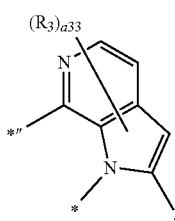
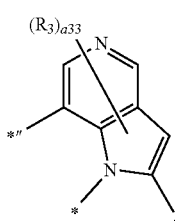
A3-1(17)
A3-1(18)
A3-1(19)
A3-1(20)
A3-1(21)
A3-3(1)
A3-3(2)
A3-3(3)
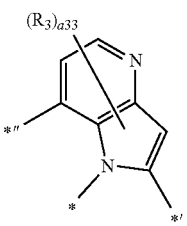
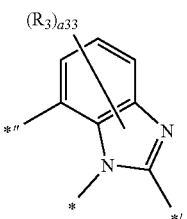
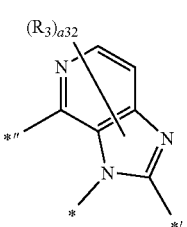
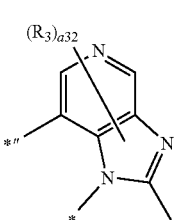
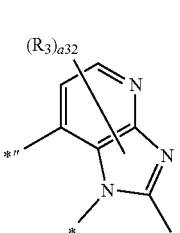
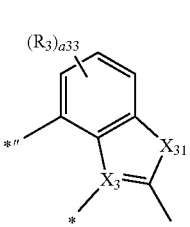
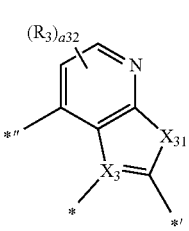
A3-3(4)
A3-3(5)
A3-3(6)
A3-3(7)
A3-3(8)
A3-3(9)
A3-3(10)

-continued
A3-3(11) 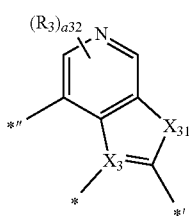
A3-3(12) 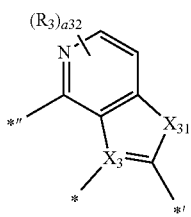
A3-3(13) 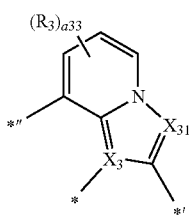
A3-3(14) 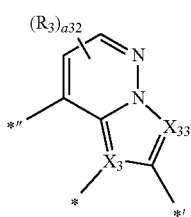
A3-3(15) 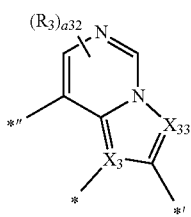
A3-3(16) 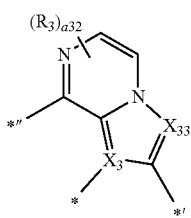
A3-3(17) 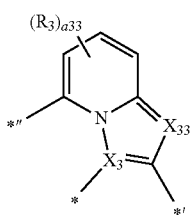
-continued
A3-3(18) 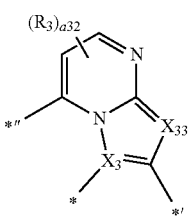
A3-3(19) 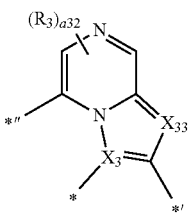
A3-3(20) 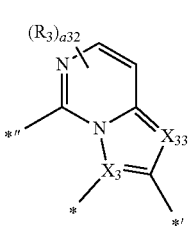
A3-3(21) 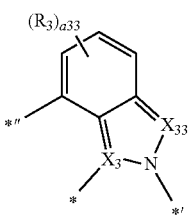
A3-3(22) 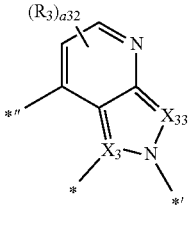
A3-3(23) 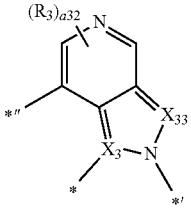
A3-3(24) 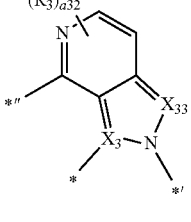

87
-continued
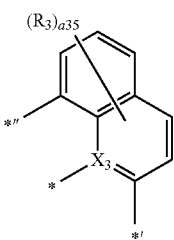
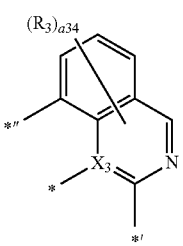
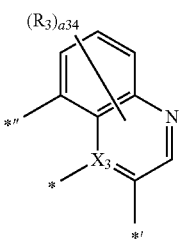
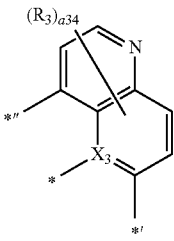
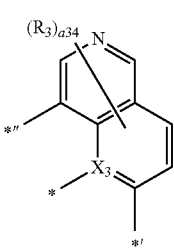
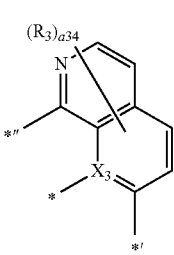
88
-continued
A3-3(25)
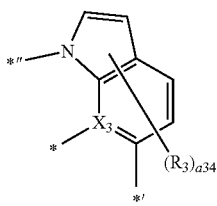
A3-3(26)
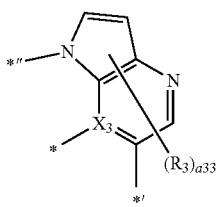
A3-3(27)
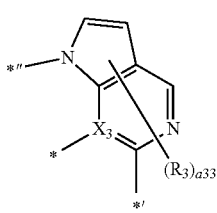
A3-3(28)
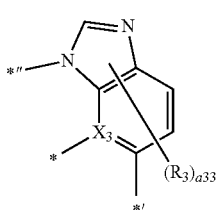
A3-3(29)
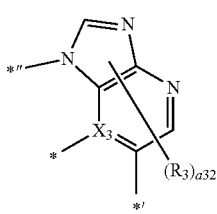
A3-3(30)
A3-3(31)
A3-3(32)
A3-3(33)
A3-3(34)
A3-3(35)
A3-3(36)
A3-3(37)
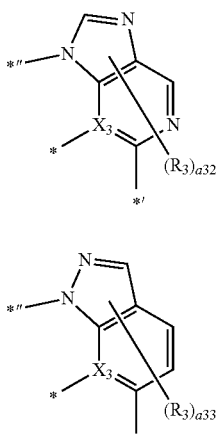

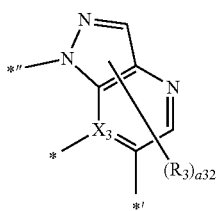 A3-3(38)
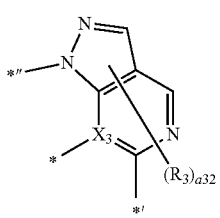 A3-3(39)
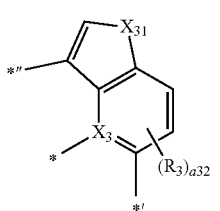 A3-3(40)
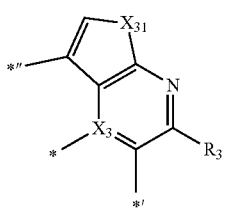 A3-3(41)
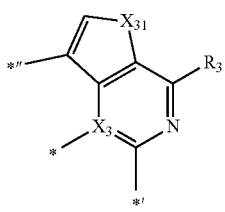 A3-3(42)
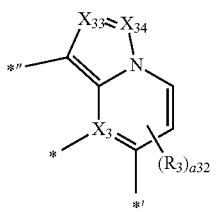 A3-3(43)
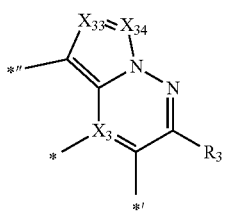 A3-3(44)
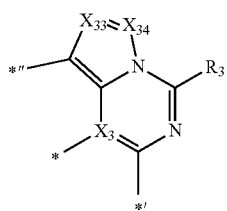 A3-3(45)
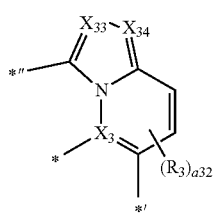 A3-3(46)
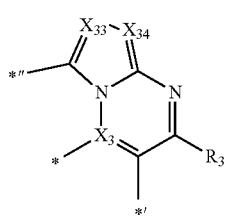 A3-3(47)
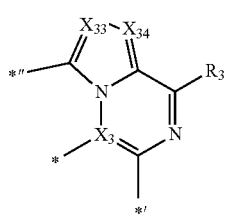 A3-3(48)
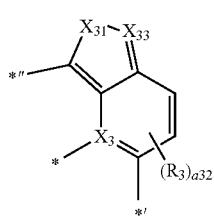 A3-3(49)
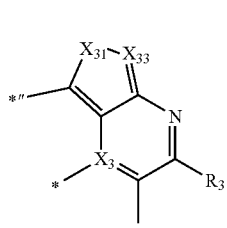 A3-3(50)
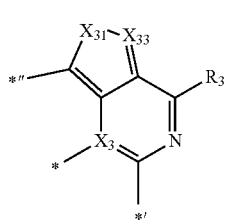 A3-3(51)

-continued

A3-3(52)

A3-3(53)

A3-3(54)

A3-3(55)

A3-3(56)

-continued

A3-3(57)

A3-3(58)

wherein, in Formulae A3-1(1) to A3-1(21) and A3-3(1) to A3-3(58), $X_3$ and $R_3$ may respectively be understood by referring to the descriptions for those provided herein, $X_{31}$ may be selected from O, S, $N(R_{31})$, $C(R_{31})(R_{32})$, and $Si(R_{31})(R_{32})$, $X_{33}$ may be selected from N and $C(R_{33})$, $X_{34}$ may be selected from N and $C(R_{34})$, $R_{31}$ to $R_{38}$ may each be understood by referring to the descriptions for $R_3$ provided herein, a36 may be an integer from 0 to 6, a35 may be an integer from 0 to 5, a34 may be an integer from 0 to 4, a33 may be an integer from 0 to 3, a32 may be an integer from 0 to 2,

* indicates a binding site to M in Formulae 1A and 1A(1),

*'' indicates a binding site to $T_2$ in Formulae 1A and 1A(1), and

*' indicates a binding site to $T_3$ in Formulae 1A and 1A(1).

In one or more embodiments, in Formula 1A(1), the moiety represented by may be represented by one of Formulae A4-1(1) to A4-1(24):
A4-1(1)
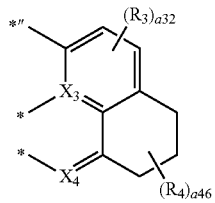
A4-1(2)
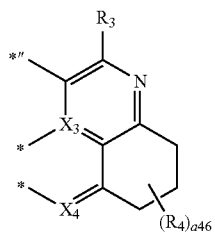
A4-1(3)
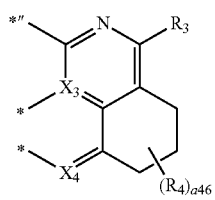
A4-1(4)
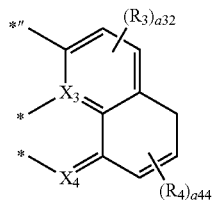
A4-1(5)
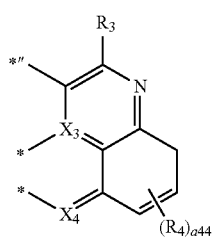
A4-1(6)
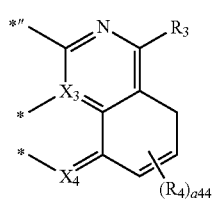
A4-1(7)
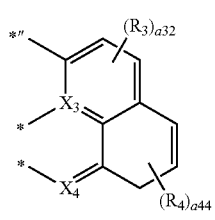
-continued
A4-1(8)
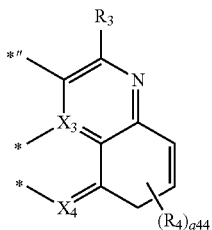
A4-1(9)
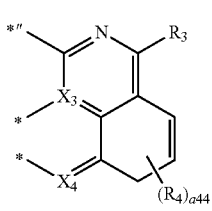
A4-1(10)
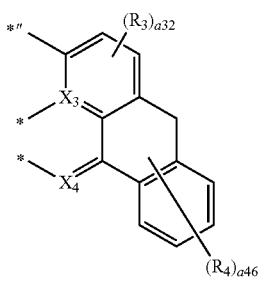
A4-1(11)
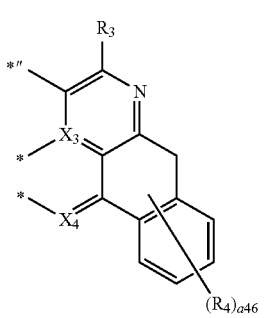
A4-1(12)
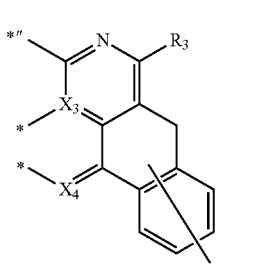
A4-1(13)
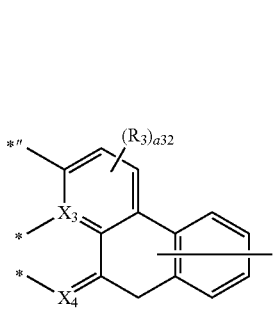

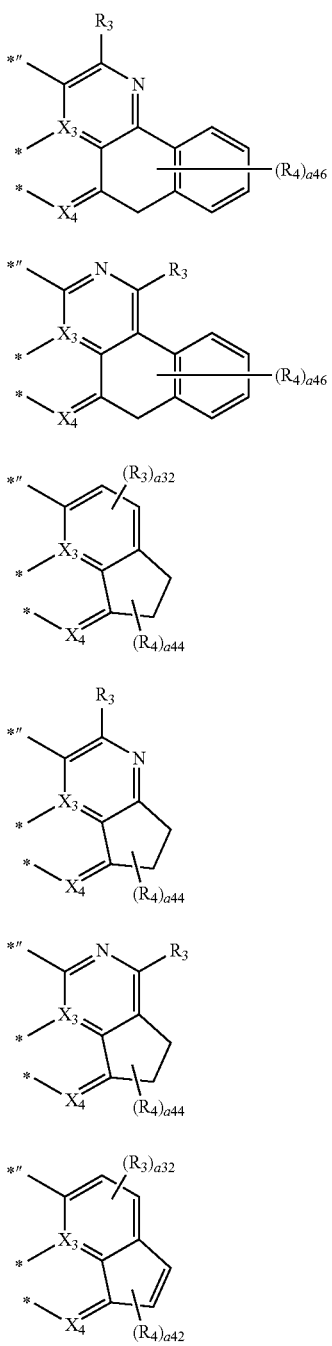

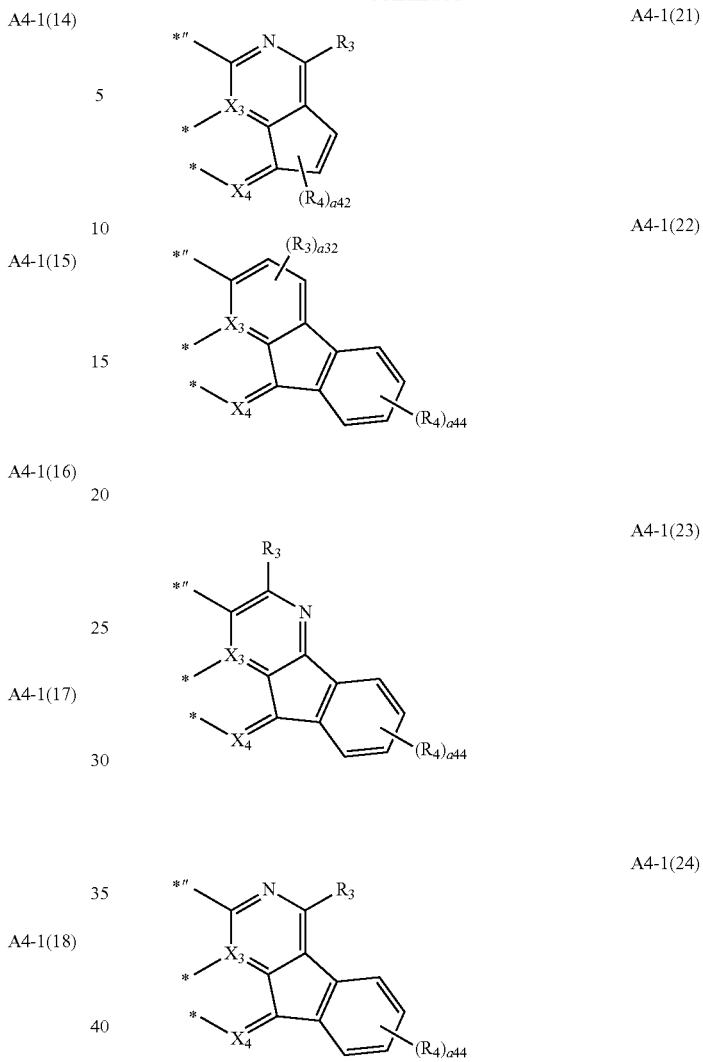

wherein, in Formulae A4-1 (1) to A4-1(24),

X$_3$, X$_4$, R$_3$, and R$_4$ may respectively be understood by referring to the descriptions for those provided herein, a46 may be an integer from 0 to 6, a44 may be an integer from 0 to 4, a42 and a32 may each independently be an integer from 0 to 2,

* indicates a binding site to M in Formula 1A(1), and
*''' indicates a binding site to T$_2$ in Formula 1A(1).

In one or more embodiments, in Formulae 1A and/or 1A(1), the moiety represented by

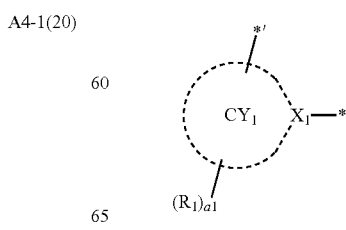

may be represented by one of Formulae CY1-1 to CY1-30,
the moiety represented by
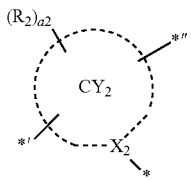
may be represented by one of Formulae CY2-1 to CY2-37, and/or
the moiety represented by
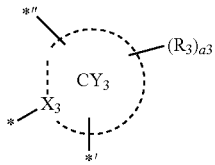
may be represented by one of Formulae CY3-1 to CY3-16:
CY1-1
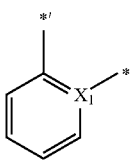
CY1-2
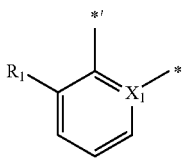
CY1-3
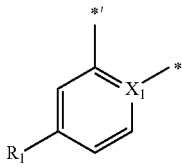
CY1-4
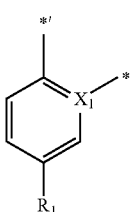
CY1-5
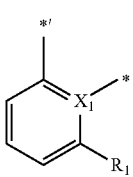
-continued
CY1-6
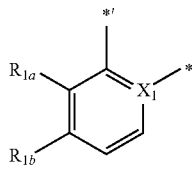
CY1-7
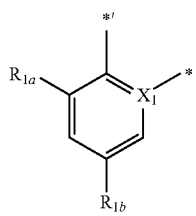
CY1-8
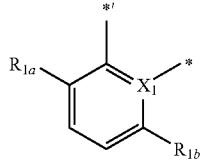
CY1-9
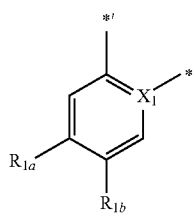
CY1-10
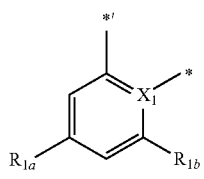
CY1-11
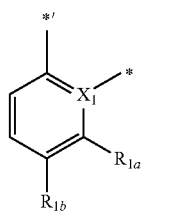
CY1-12
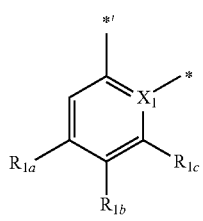

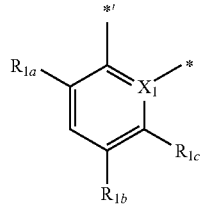
CY1-13
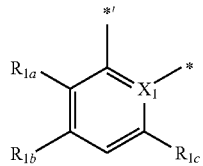
CY1-14
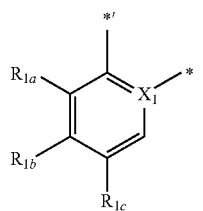
CY1-15
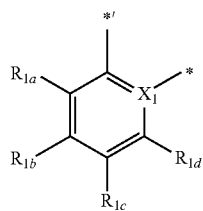
CY1-16
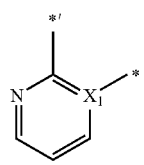
CY1-17
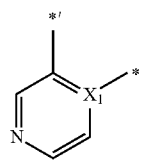
CY1-18
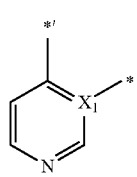
CY1-19
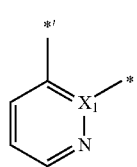
CY1-20
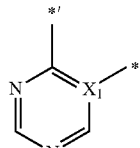
CY1-21
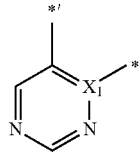
CY1-22
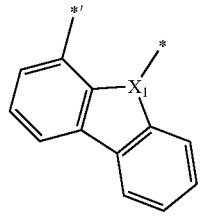
CY1-23
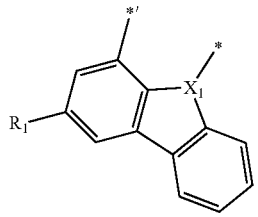
CY1-24
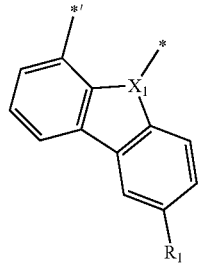
CY1-25
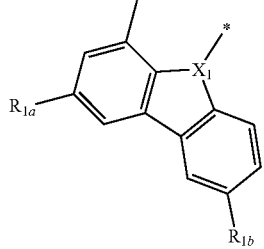
CY1-26
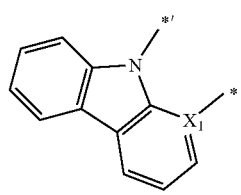
CY1-27

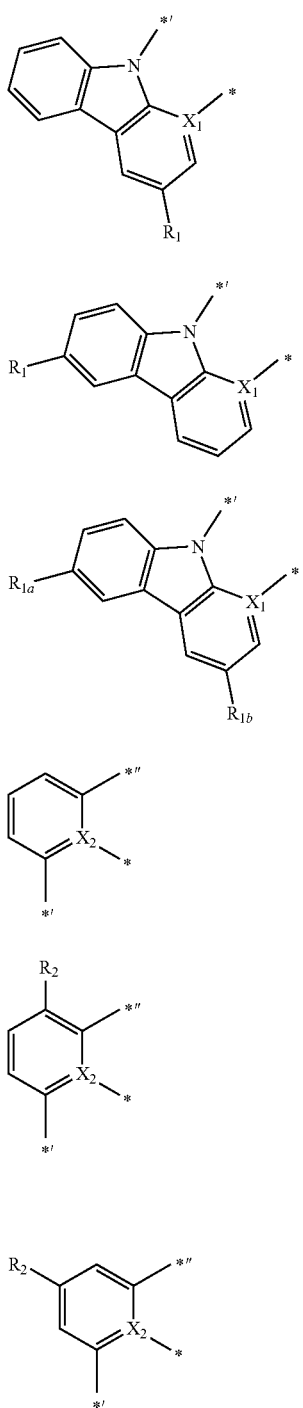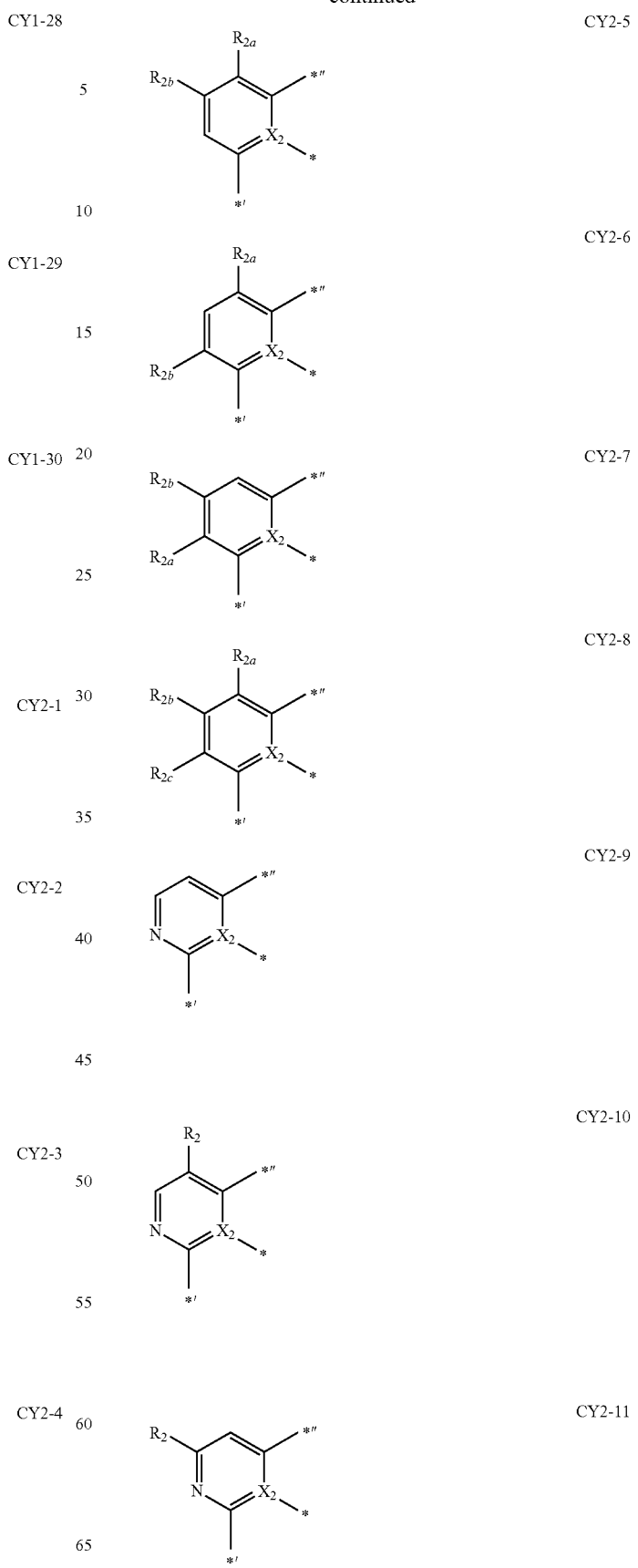

-continued
CY2-12
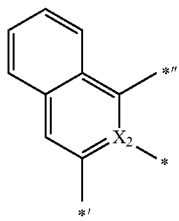
CY2-13
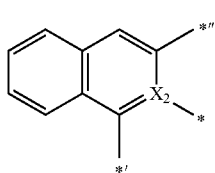
CY2-14
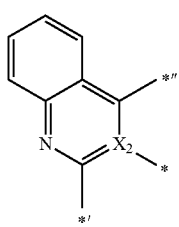
CY2-15
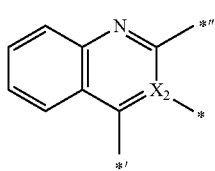
CY2-16
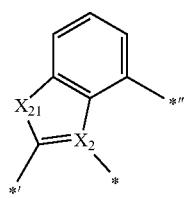
CY2-17
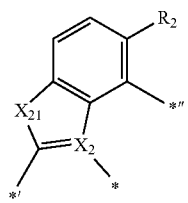
CY2-18
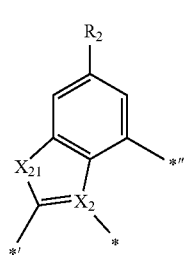
-continued
CY2-19
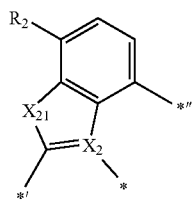
CY2-20
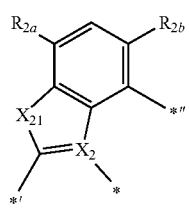
CY2-21
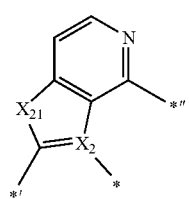
CY2-22
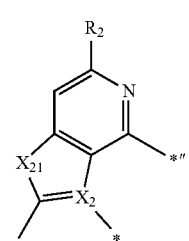
CY2-23
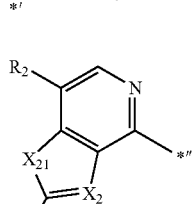
CY2-24
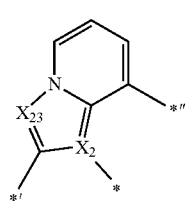
CY2-25
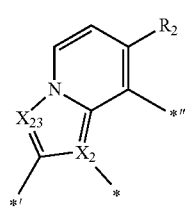

-continued
CY2-26 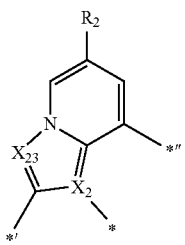
CY2-27 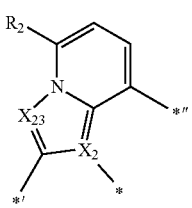
CY2-28 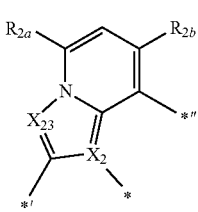
CY2-29 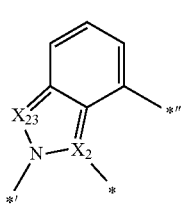
CY2-30 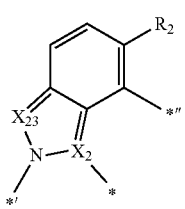
CY2-31 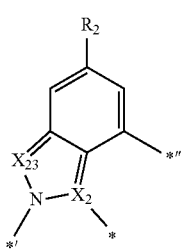
CY2-32 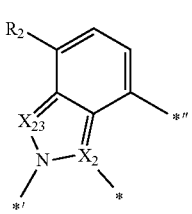
-continued
CY2-33 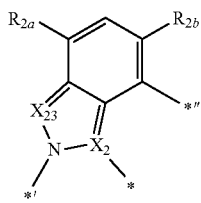
CY2-34 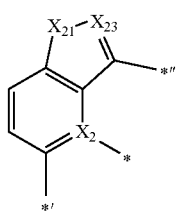
CY2-35 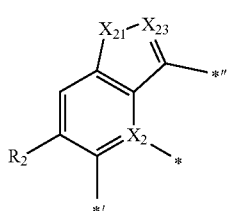
CY2-36 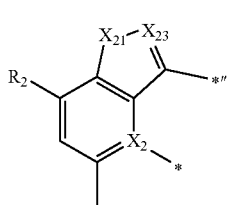
CY2-37 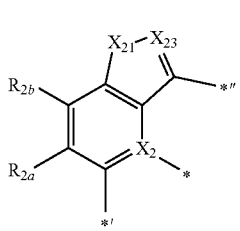
CY3-1 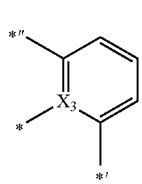
CY3-2 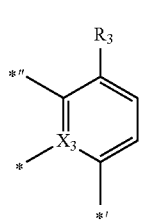

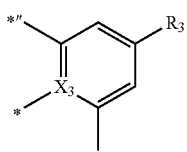
CY3-3
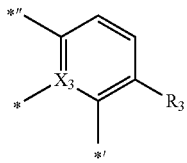
CY3-4
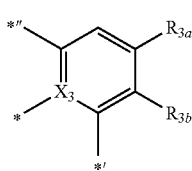
CY3-5
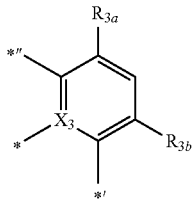
CY3-6
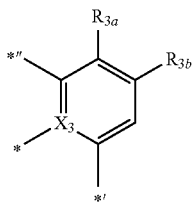
CY3-7
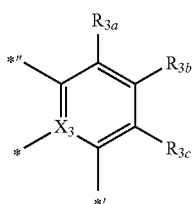
CY3-8
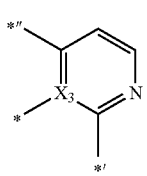
CY3-9
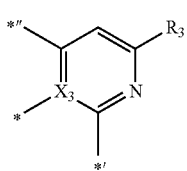
CY3-10
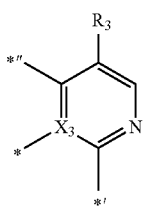
CY3-11
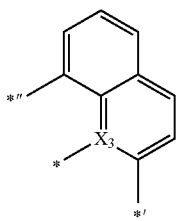
CY3-12
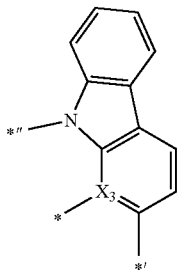
CY3-13
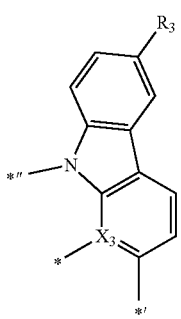
CY3-14
CY3-15

-continued

CY3-16

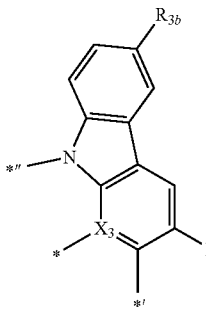

wherein, in Formulae CY1-1 to CY1-30, CY2-1 to CY2-37, and CY3-1 to CY3-16, $X_1$ to $X_3$ and $R_1$ to $R_3$ may respectively be understood by referring to the descriptions for those provided herein, $X_{21}$ may be selected from O, S, $N(R_{21})$, $C(R_{21})(R_{22})$, and $Si(R_{21})(R_{22})$, $X_{23}$ may be selected from N and $C(R_{23})$, $R_{1a}$ to $R_{1d}$ may each be understood by referring to the descriptions for $R_1$ provided herein, $R_{2a}$ to $R_{2c}$ and $R_{21}$ to $R_{23}$ may each be understood by referring to the descriptions for $R_2$ provided herein, $R_{3a}$ to $R_{3c}$ may each be understood by referring to the descriptions for $R_3$, provided that $R_1$ to $R_3$, $R_{1a}$ to $R_{1d}$, $R_{2a}$ to $R_{2c}$, and $R_{3a}$ to $R_{3c}$ may not each be hydrogen, in Formula CY1-1 to CY1-30, * indicates a binding site to M or $X_5$ in Formulae 1A and 1A(1), *' and indicates a binding site to $T_1$ in Formulae 1A and 1A(1), in Formula CY2-1 to CY2-37, * indicates a binding site to M in Formulae 1A and 1A(1), *' indicates a binding site to $T_1$ in Formulae 1A and 1A(1), and *'" indicates a binding site to $T_2$ in Formulae 1A and 1A(1), and in Formula CY3-1 to CY3-16, * indicates a binding site to M in Formula 1A, *'" indicates a binding site to $T_2$ in Formula 1A, and *' indicates a binding site to $T_3$ in Formula 1A.

In some embodiments, in Formula 1A(1), the moiety represented by

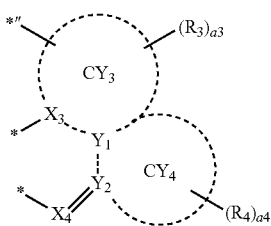

may be represented by one of Formulae CY4-1 to CY4-7:

CY4-1

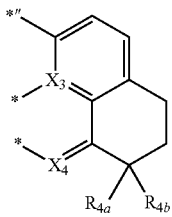

CY4-2

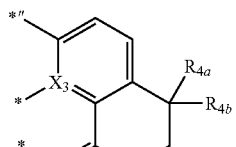

CY4-3

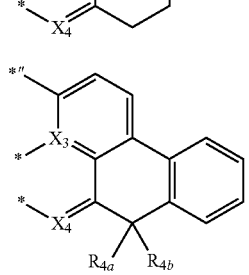

CY4-4

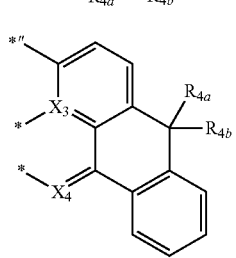

CY4-5

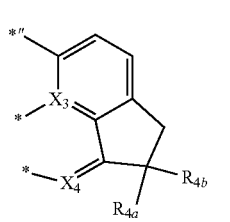

CY4-6

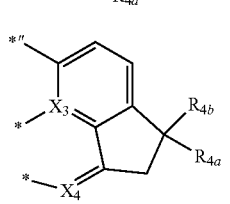

CY4-7

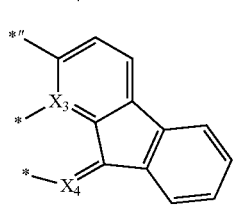

wherein, in Formulae CY4-1 to CY4-7, $X_3$ and $X_4$ may respectively be understood by referring to the descriptions for those provided herein, $R_{4a}$ and $R_{4b}$ may each be understood by referring to the descriptions for $R_4$ provided herein, provided that $R_{4a}$ and $R_{4b}$ may not each be hydrogen,

*'" indicates a binding site to $T_2$ in Formula 1A(1), and

* indicates a binding site to M in Formula 1A(1).

In Formulae 2, 1A, and 1A(1), i) two adjacent groups selected from a plurality of $R_1$ groups may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, ii) two adjacent groups selected from a plurality of $R_2$ groups may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, iii) two adjacent groups selected from a plurality of $R_3$ groups may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, iv) two adjacent groups selected from a plurality of $R_4$ groups may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$, and v) two adjacent groups selected from $R_1$ to $R_8$, R', and R" may optionally be linked to form a $C_5$-$C_{30}$ carbocyclic group or a $C_1$-$C_{30}$ heterocyclic group, wherein the $C_5$-$C_{30}$ carbocyclic group or the $C_1$-$C_{30}$ heterocyclic group may each be unsubstituted or substituted with at least one $R_{10a}$. The term "$C_5$-$C_{30}$ carbocyclic group" as used herein may be understood by referring to the descriptions for ring $CY_3$ provided herein. The term "$C_1$-$C_{30}$ heterocyclic group" as used herein may be understood by referring to the descriptions for $R_{10a}$ provided herein.

The terms "an azabenzothiophene group, an azabenzofuran group, an azaindene group, an azaindole group, an azabenzosilole group, an azadibenzothiophene group, an azadibenzofuran group, an azafluorene group, an azacarbazole group, and an azadibenzosilole group", as used herein, may each have the same backbone as "a benzothiophene group, a benzofuran group, an indene group, an indole group, a benzosilole group, a dibenzothiophene group, a dibenzofuran group, a fluorene group, a carbazole group, and a dibenzosilole group", respectively, each having a heterocyclic ring in which at least one ring-forming carbon atom is substituted with a nitrogen atom.

In one or more embodiments, the organometallic compound may be one of Compounds 1 to 12, but embodiments are not limited thereto:

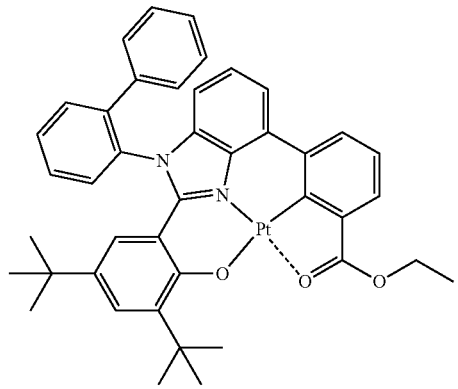

2

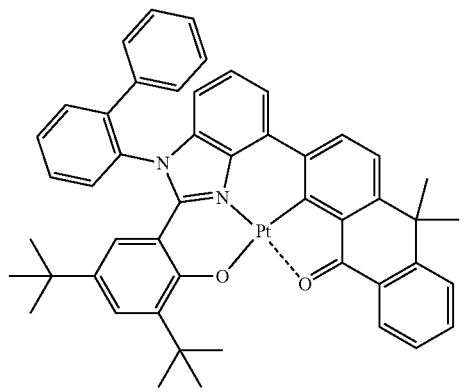

3

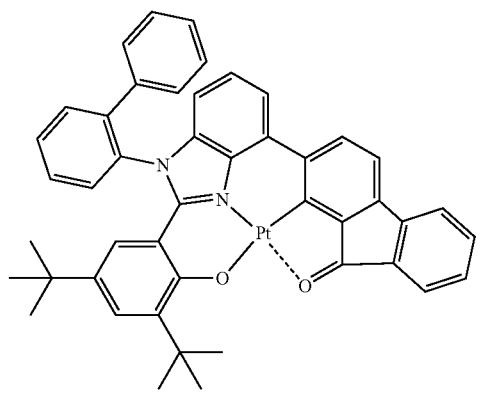

4

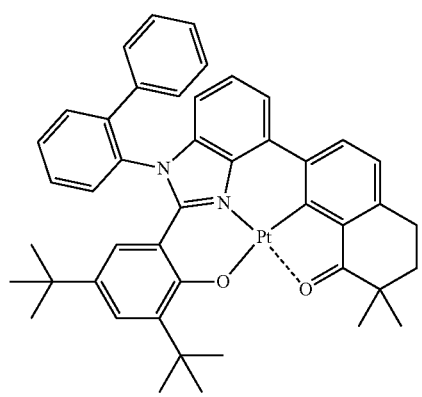

1

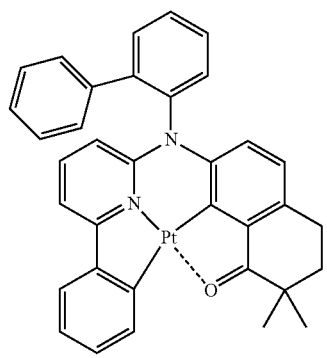

5

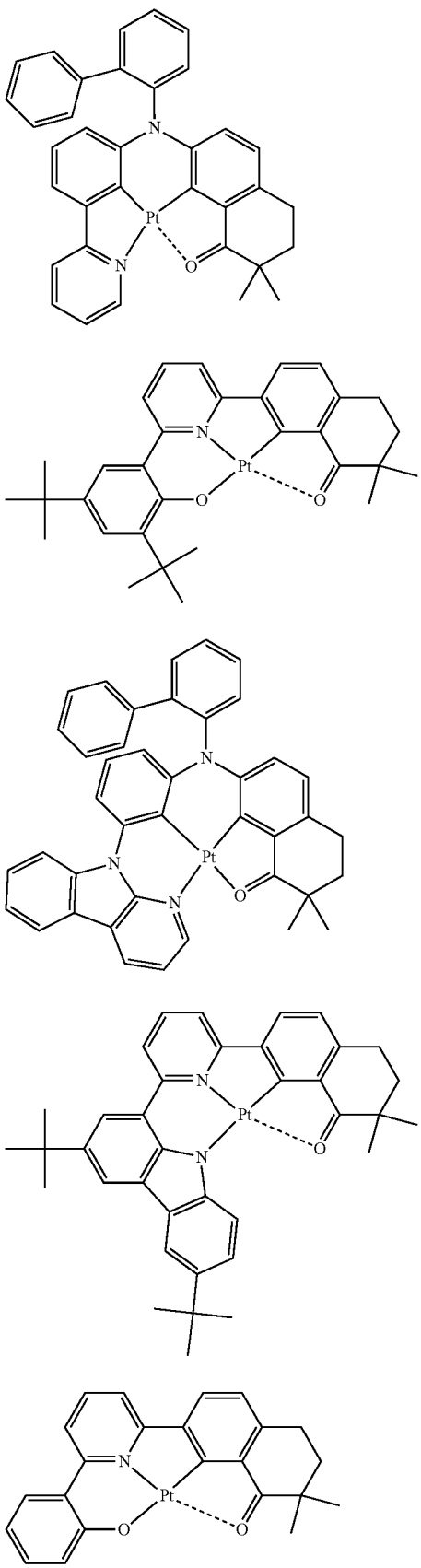

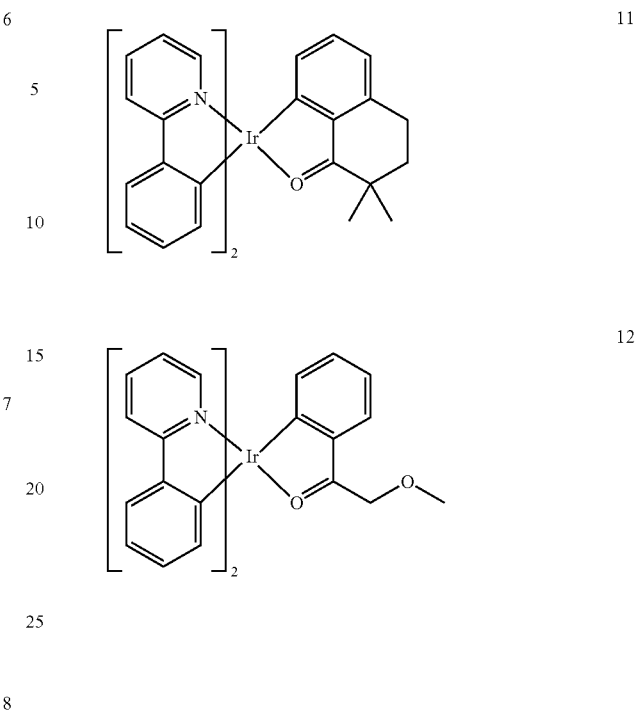

In Formulae 2, 1A, and 1A(1), $X_4$ may be O or S, and a bond between $X_4$ and M in Formulae 1, 1A, and 1A(1) may be a "coordinate bond", wherein $L_1$ in Formula 1 may be selected from ligands represented by Formula 2. Accordingly, the organometallic compound may have a relatively high highest occupied molecular orbital (HOMO) energy level (i.e., a relatively low HOMO energy level absolute value), as compared with a compound having a "covalent bond" between $X_4$ and M in Formulae 2, 1A, and 1A(1) (e.g., Compound A). Thus, an electronic device, e.g., an organic light-emitting device, including the organometallic compound represented by Formula 1, 1A, or 1A(1) may have excellent luminescence efficiency.

For example, the HOMO, LUMO, singlet ($S_i$) energy level, and triplet ($T_1$) energy level of Compounds 1 to 10 and Compound A were evaluated by using Gaussian according to a density functional theory (DFT) method (structure optimization is performed at a degree of B3LYP, and 6-31G(d, p)). The results thereof are shown in Table 1.

TABLE 1

| Compound No. | HOMO (eV) | LUMO (eV) | $S_1$ energy level (eV) | $T_1$ energy level (eV) |
|---|---|---|---|---|
| 1 | −4.721 | −1.924 | 2.3 | 2.134 |
| 2 | −4.399 | −2.359 | 1.587 | 1.217 |
| 3 | −4.653 | −2.226 | 1.98 | 1.828 |
| 4 | −4.799 | −2.655 | 1.684 | 1.546 |
| 5 | −4.976 | −1.857 | 2.400 | 2.082 |
| 6 | −4.51 | −1.687 | 2.189 | 1.843 |
| 7 | −4.763 | −2.123 | 2.163 | 2.001 |
| 8 | −4.507 | −1.650 | 2.246 | 1.857 |
| 9 | −4.501 | −2.169 | 1.865 | 1.687 |

TABLE 1-continued

| Compound No. | HOMO (eV) | LUMO (eV) | S$_1$ energy level (eV) | T$_1$ energy level (eV) |
|---|---|---|---|---|
| 10 | −4.921 | −2.103 | 2.324 | 2.121 |
| A | −5.45 | −1.79 | 2.90 | 2.60 |

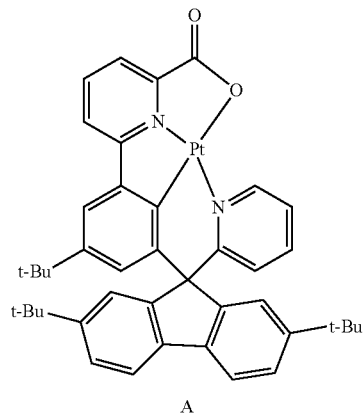

A wherein "t-Bu" in Compound A represents a tert-butyl group.

Referring to the results of Table 1, the organometallic compound represented by Formula 1 was found to have suitable electrical characteristics for use as a dopant in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, e.g., as a dopant in an emission layer of the organic layer. Thus, according to another aspect, there is provided an organic light-emitting device that may include a first electrode; a second electrode; and an organic layer disposed between the first electrode and the second electrode, wherein the organic layer includes an emission layer and at least one organometallic compound represented by Formula 1.

Since the organic light-emitting device has an organic layer including the organometallic compound represented by Formula 1, the organic light-emitting device may have a low driving voltage, high efficiency, high power, high quantum efficiency, long lifespan, low roll-off, and excellent color purity.

The organometallic compound represented by Formula 1 may be used in a pair of electrodes of an organic light-emitting device. For example, the organometallic compound represented by Formula 1 may be included in the emission layer. In this embodiment, the organometallic compound may serve as a dopant and the emission layer may further include a host (that is, an amount of the organometallic compound represented by Formula 1 may be smaller than that of the host).

As used herein, "(for example, the organic layer) including at least one organometallic compound" means that "(the organic layer) including an organometallic compound of Formula 1, or at least two different organometallic compounds of Formula 1".

For example, Compound 1 may only be included in the organic layer as an organometallic compound. In this embodiment, Compound 1 may be included in the emission layer of the organic light-emitting device. In some embodiments, Compounds 1 and 2 may be included in the organic layer as organometallic compounds. In this embodiment, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, or a combination thereof, and the electron transport region may include a hole blocking layer, an electron transport layer, an electron injection layer, or a combination thereof.

The term "organic layer" as used herein refers to a single and/or a plurality of layers disposed between the first electrode and the second electrode in an organic light-emitting device. The "organic layer" may include not only organic compounds but also organometallic complexes including metals.

FIG. 1 illustrates a schematic cross-sectional view of an organic light-emitting device 10 according to an embodiment. Hereinafter, a structure of an organic light-emitting device according to one or more embodiments and a method of manufacturing the organic light-emitting device will be described with reference to FIG. 1. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by vacuum-depositing or sputtering, onto the substrate, a material for forming the first electrode 11. The first electrode 11 may be an anode. The material for forming the first electrode 11 may be selected from materials with a high work function for easy hole injection. The first electrode 11 may be a reflective electrode, a semi-transmissive electrode, or a transmissive electrode.

The material for forming the first electrode 11 may be selected from indium tin oxide (ITO), indium zinc oxide (IZO), tin oxide (SnO$_2$), and zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but embodiments are not limited thereto.

The organic layer 15 may be on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum degree in a range of about $10^{-8}$ torr to about $10^{-3}$ torr, and at a rate in a range of about 0.01 Angstroms per second (A/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

The conditions for forming a hole transport layer and an electron blocking layer may be inferred from the conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), (polyaniline)/poly(4-styrenesulfonate) (PANI/PSS), a compound represented by Formula 201, and a compound represented by Formula 202:

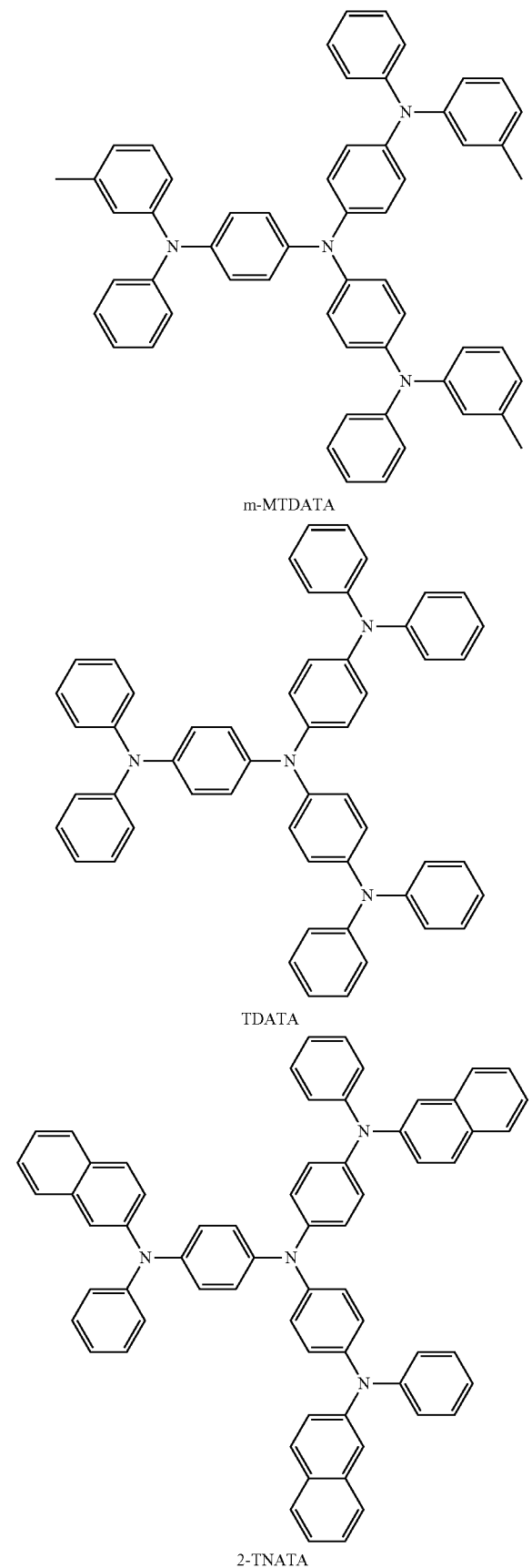

m-MTDATA

TDATA

2-TNATA

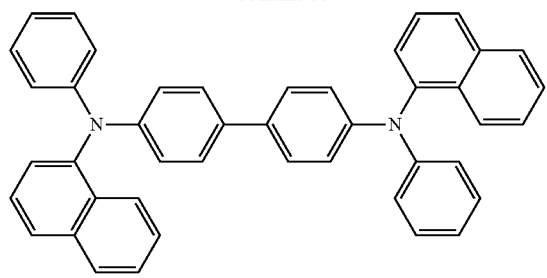
NPB
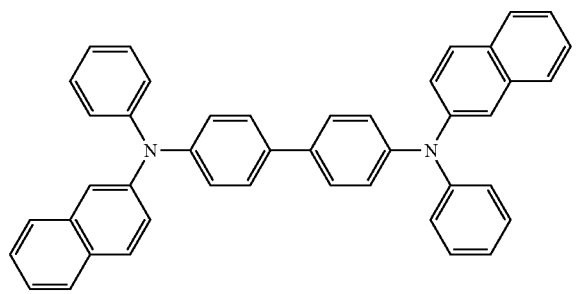
β-NPB
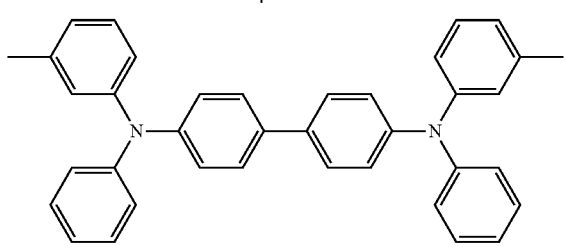
TPD
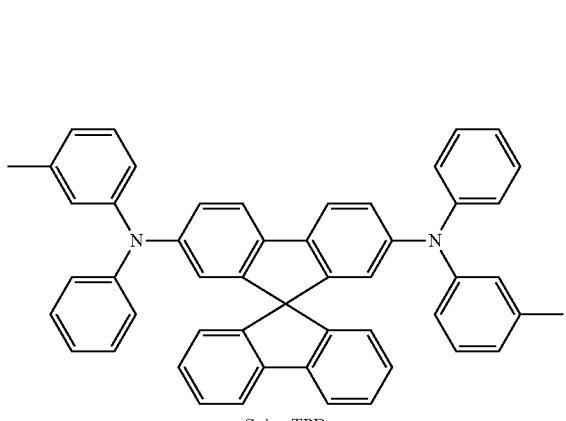
Spiro-TPD
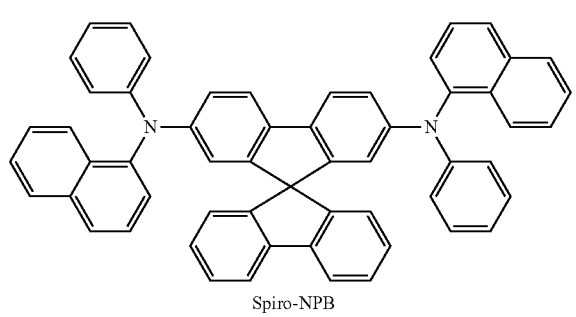
Spiro-NPB
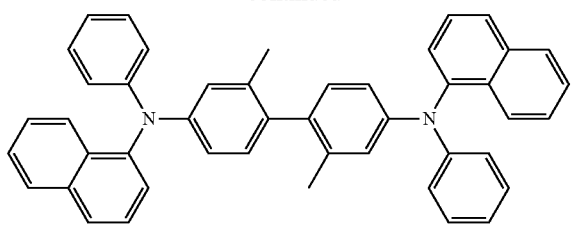
methylated NPB
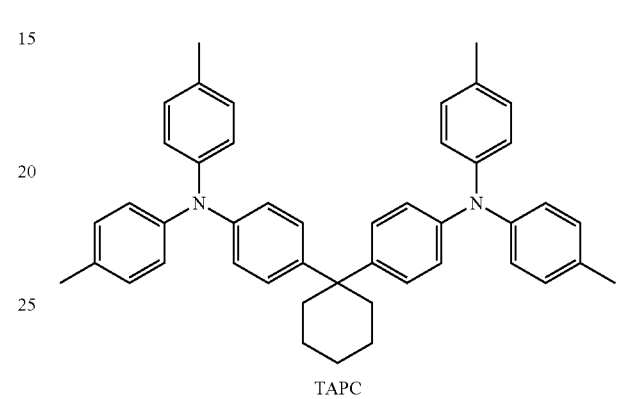
TAPC
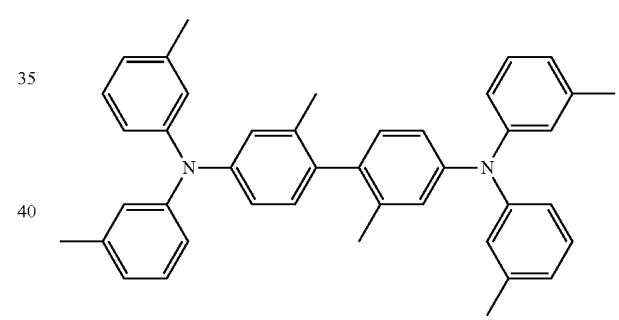
HMTPD
Formula 201
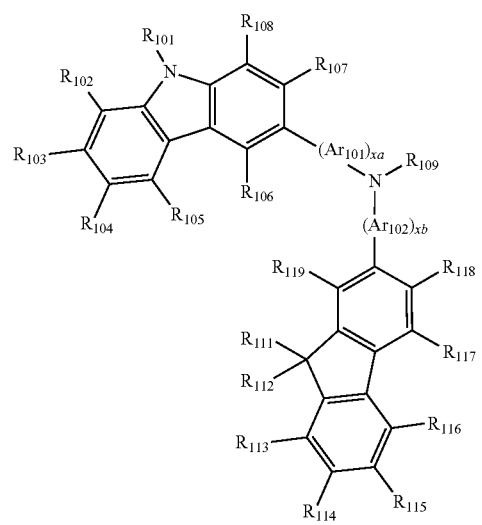

Formula 202

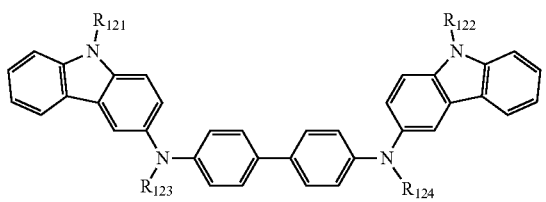

wherein, in Formula 201, $Ar_{101}$ and $Ar_{102}$ may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5. In some embodiments, xa and xb may each independently be an integer selected from 0, 1, and 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), and a $C_1$-$C_{10}$ alkoxy group (e.g., a methoxy group, an ethoxy group, a propoxy group, a butoxy group, or a pentoxy group);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

In Formula 201, $R_{109}$ may be selected from a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but embodiments are not limited thereto:

Formula 201A

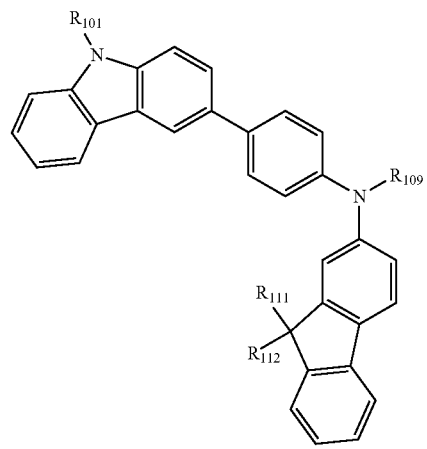

$R_{101}$, $R_{111}$, $R_{112}$, and $R_{109}$ in Formula 201A may respectively be understood by referring to the descriptions for those provided herein.

In some embodiments, the compounds represented by Formulae 201 and 202 may include Compounds HT1 to HT20, but embodiments are not limited thereto:

HT1
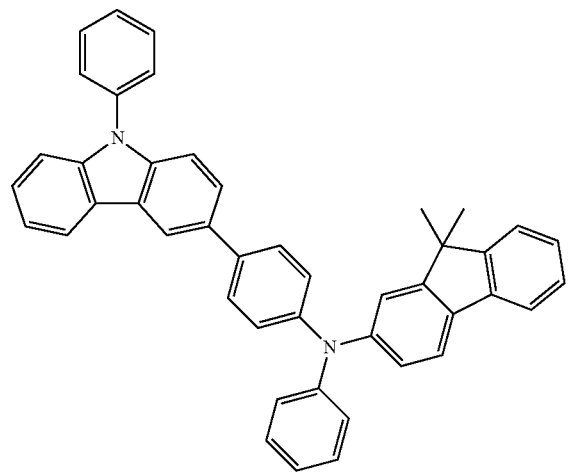
HT3
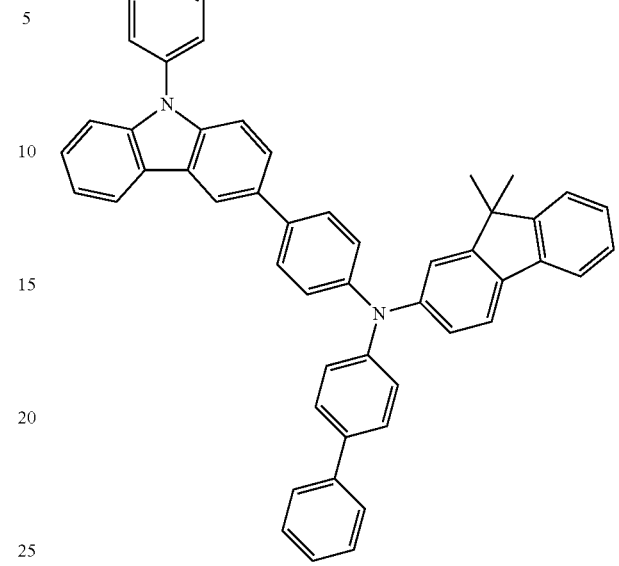
HT2
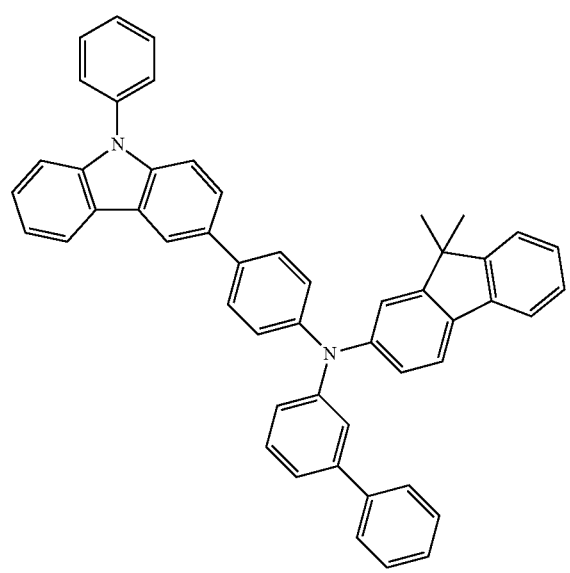
HT4
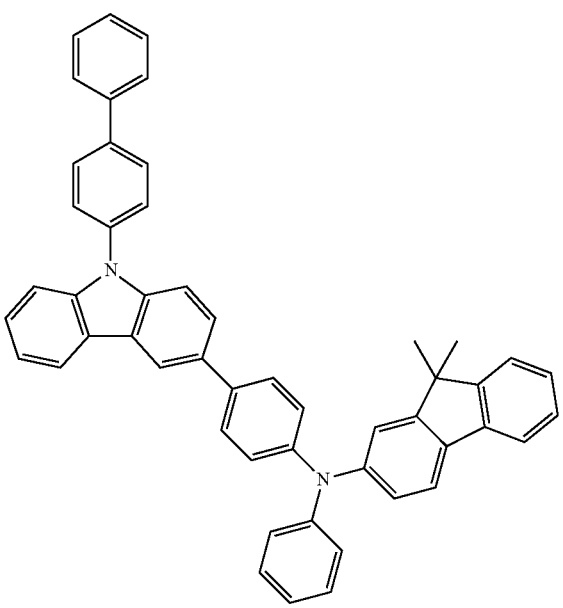

125
-continued
HT5
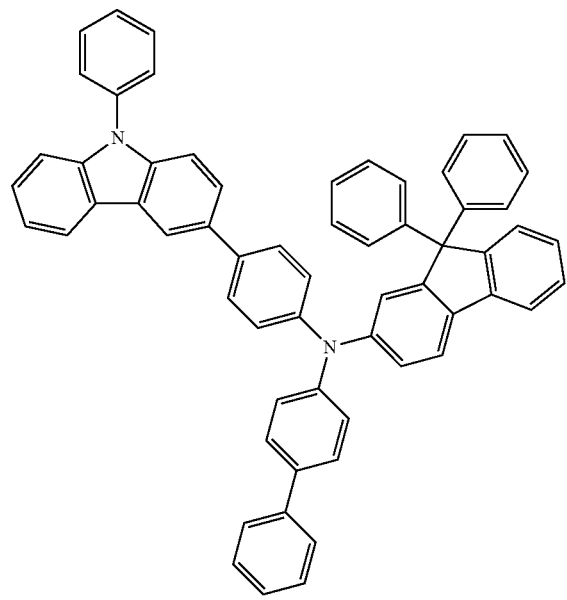
126
-continued
HT7
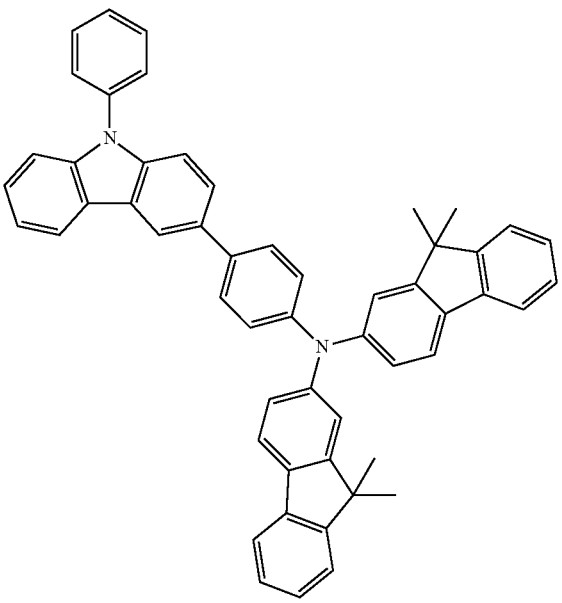
HT8
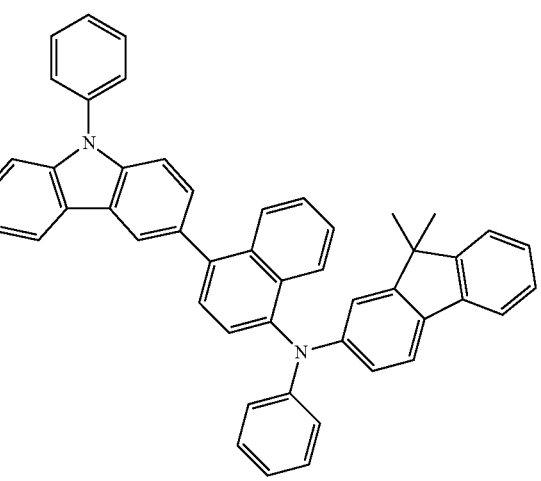
HT6
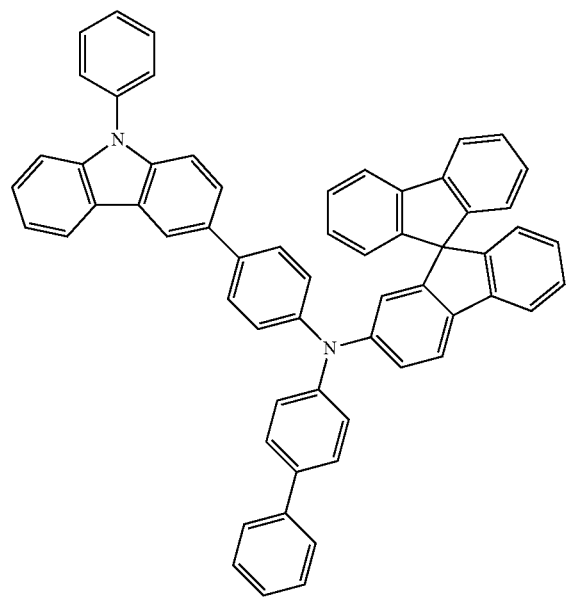
HT9
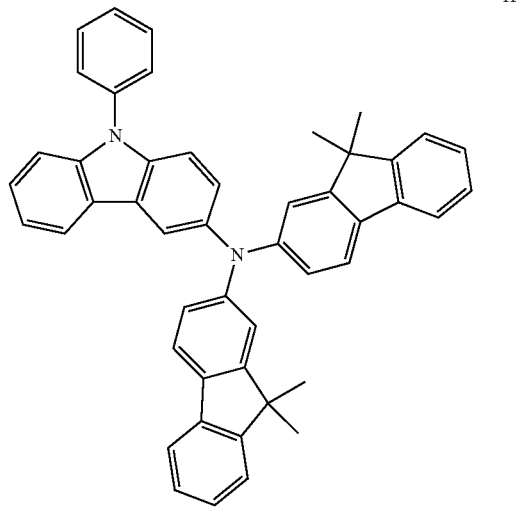

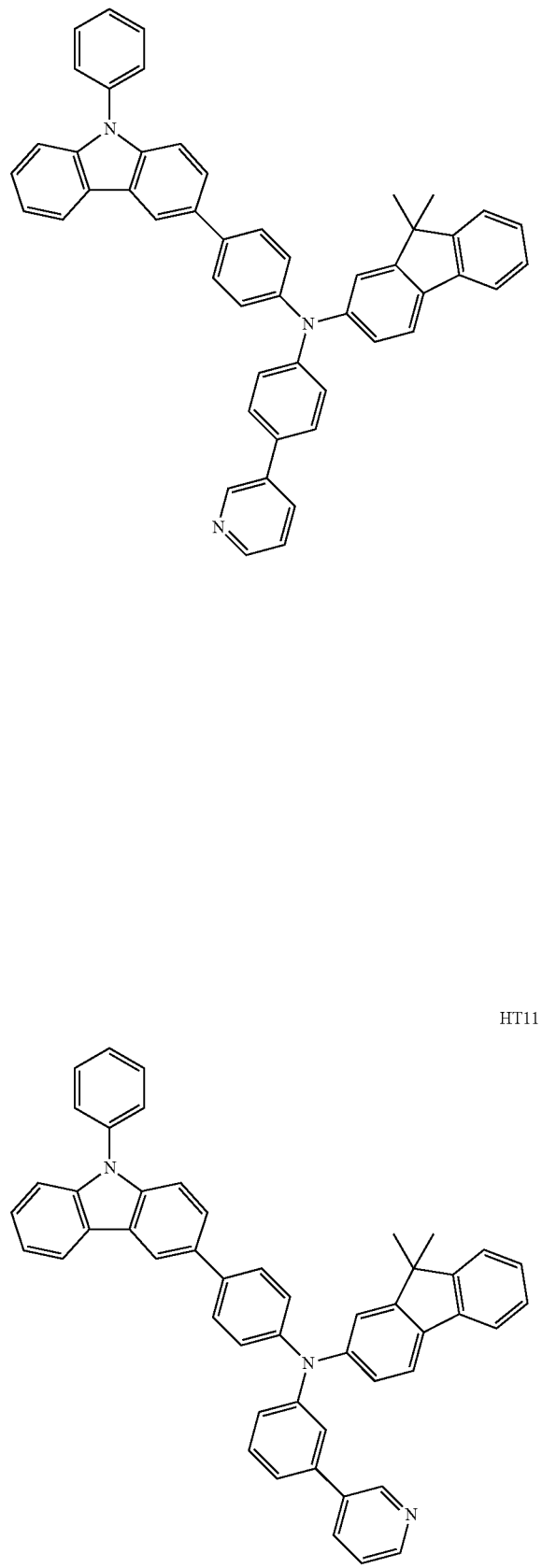
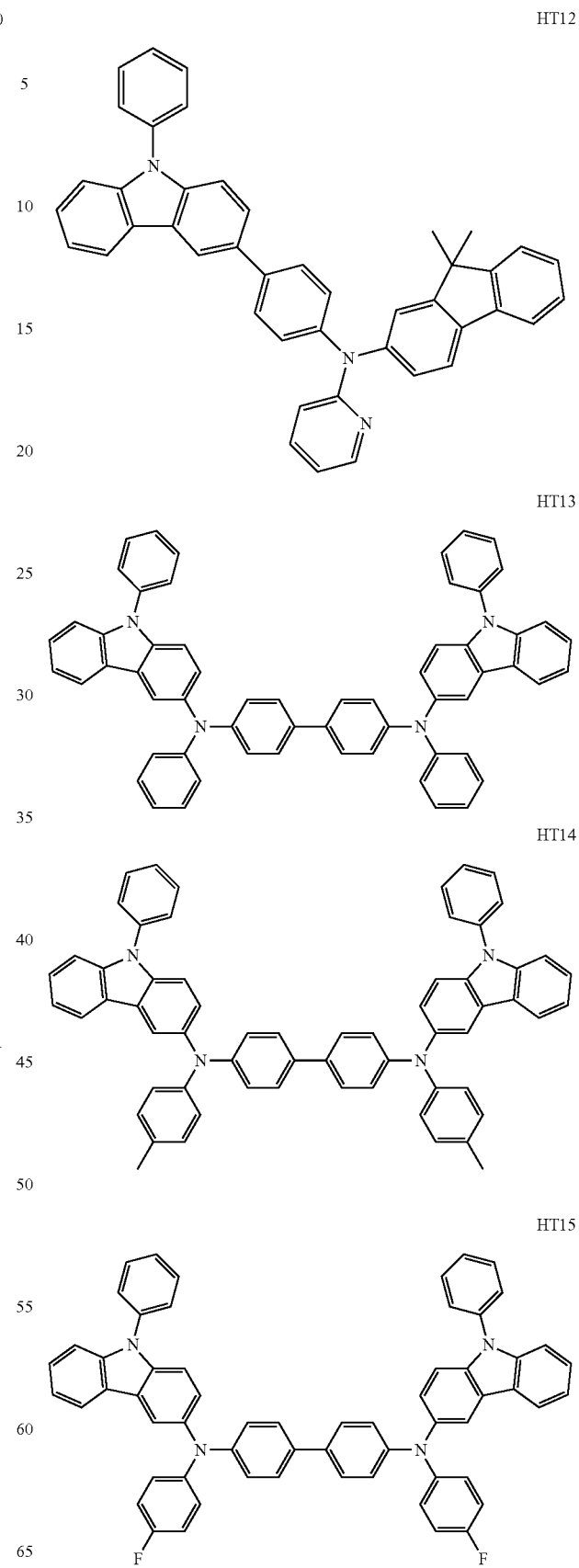

-continued

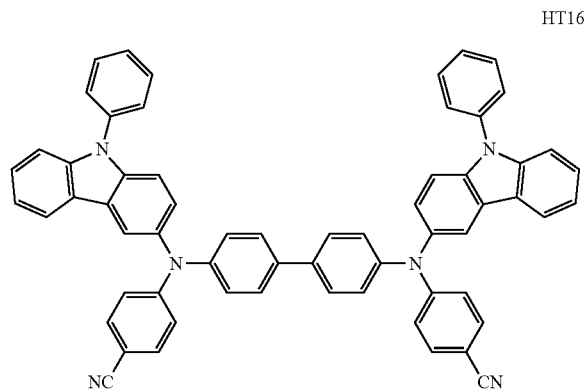

HT16

HT17

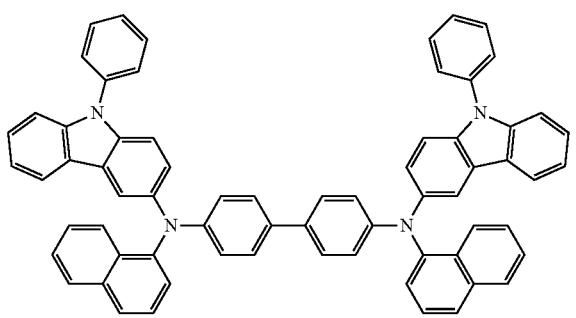

HT18

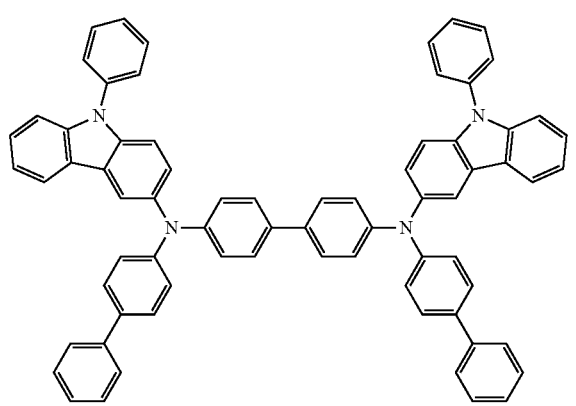

HT19

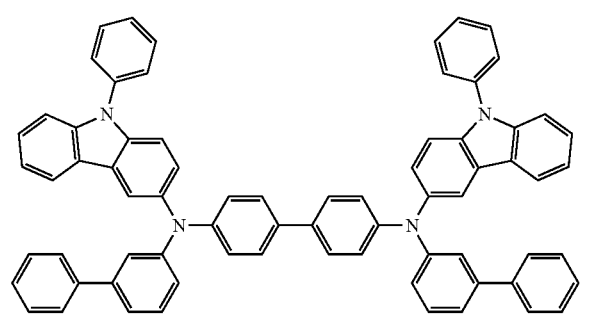

-continued

HT20

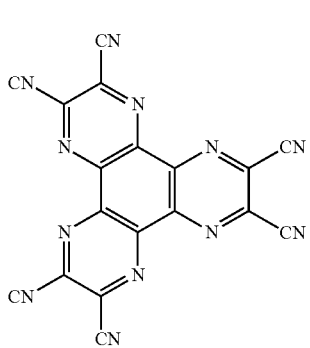

The thickness of the hole transport region may be in a range of about 100 Angstroms (Å) to about 10,000 Å, for example, about 100 Å to about 1,000 Å. When the hole transport region includes at least one selected from a hole injection layer and a hole transport layer, the thickness of the hole injection layer may be in a range of about 100 Å to about 10,000 Å, for example, about 100 Å to about 1,000 Å, the thickness of the hole transport layer may be in a range of about 50 Å to about 2,000 Å, for example, about 100 Å to about 1,500 Å. While not wishing to be bound by theory, it is understood that when the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1, but embodiments are not limited thereto:

HT-D1

F4-TCNQ

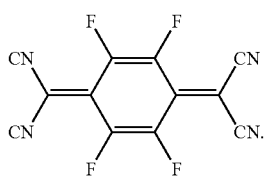

The hole transport region may further include a buffer layer.

The buffer layer may compensate for an optical resonance distance depending on a wavelength of light emitted from the emission layer to improve the efficiency of an organic light-emitting device.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to the those conditions for forming a hole injection layer, though the conditions may vary depending on a compound that is used.

When the hole transport region includes an electron blocking layer, a material for forming the electron blocking layer may be selected from the materials for forming a hole transport region and host materials described herein, but embodiments are not limited thereto. In some embodiments, when the hole transport region includes an electron blocking layer, mCP described herein may be used for forming the electron blocking layer.

The emission layer may include a host and a dopant, and the dopant may include the organometallic compound represented by Formula 1.

The host may include at least one selected from TPBi, TBADN, ADN (also known as "DNA"), CBP, CDBP, TCP, mCP, and Compounds H50 and H51:

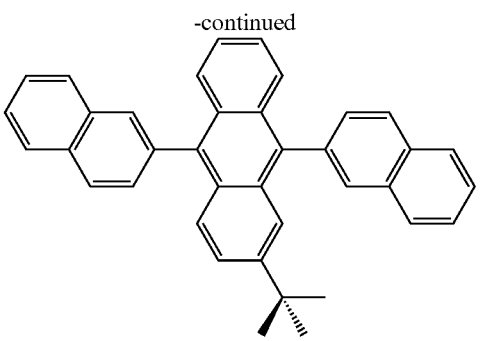

TBADN

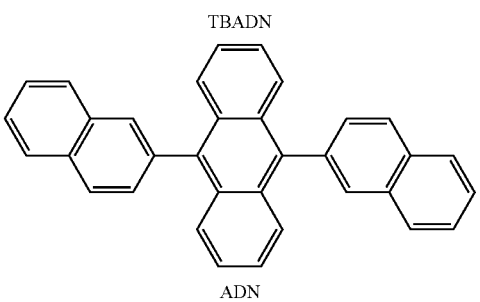

ADN

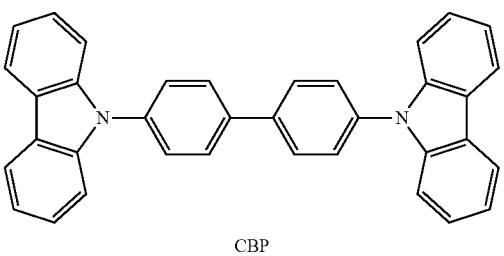

CBP

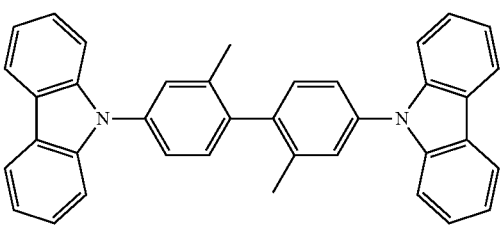

CDBP

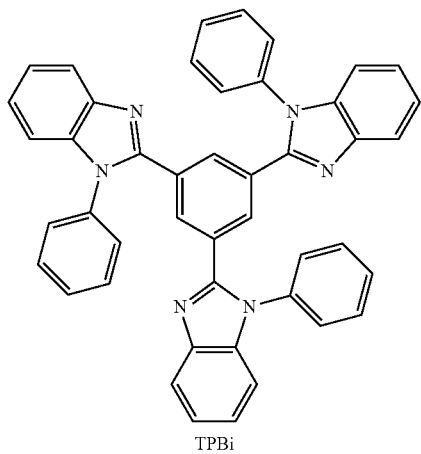

TPBi

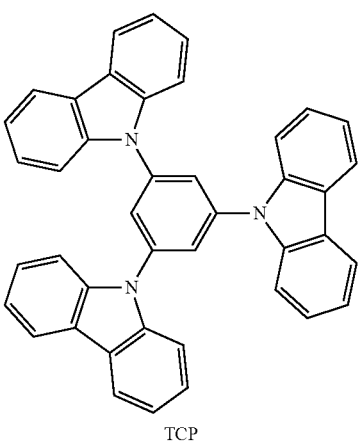

TCP

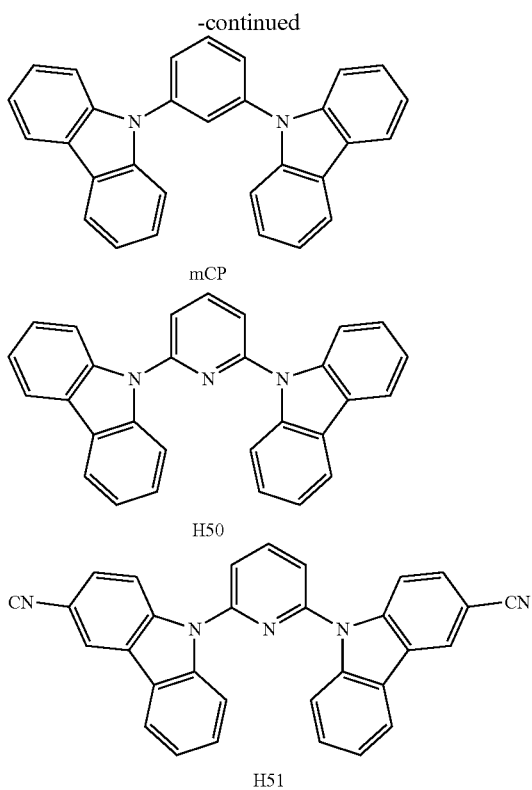

mCP

H50

H51

In some embodiments, the host may further include a compound represented by Formula 301:

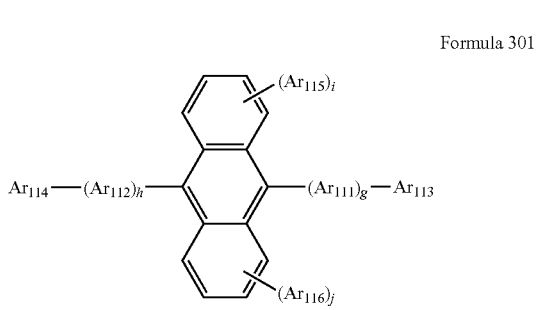

Formula 301 wherein, in Formula 301, $Ar_{111}$ and $Ar_{112}$ may each independently be selected from a phenylene group, a naphthylene group, a phenanthrenylene group, and a pyrenylene group; and a phenyl group, a phenylene group substituted with at least one selected from a naphthyl group and an anthracenyl group, a naphthylene group, a phenanthrenylene group, and a pyrenylene group.

In Formula 301, $Ar_{113}$ to $Ar_{116}$ may each independently be selected from a $C_1$-$C_{10}$ alkyl group, a phenyl group, a naphthyl group, a phenanthrenyl group, and a pyrenyl group; and a phenyl group, a phenyl group substituted with at least one selected from a naphthyl group and an anthracenyl group, a naphthyl group, a phenanthrenyl group, and a pyrenyl group.

In Formula 301, g, h, i, and j may each independently be an integer from 0 to 4. In some embodiments, g, h, i, and j may each independently be 0, 1, or 2.

In Formula 301, $Ar_{113}$ to $Ar_{116}$ may each independently be selected from a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

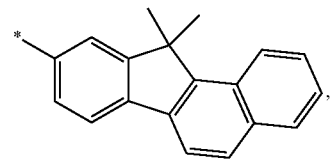 [SMILES: *c1ccc2c(c1)C(C)(C)c1c-2ccc2ccccc12]

but embodiments are not limited thereto.

In some embodiments, the host may include a compound represented by Formula 302:

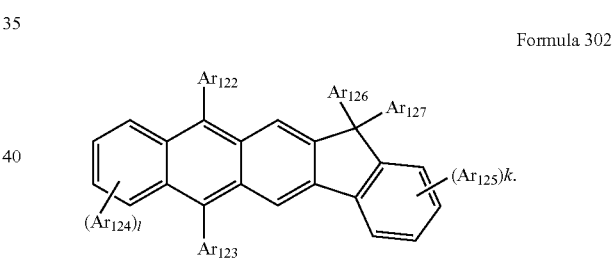

Formula 302

In Formula 302, $Ar_{122}$ to $Ar_{125}$ may each be understood by referring to the descriptions for $Ar_{113}$ provided herein with reference to Formula 301.

In Formula 302, $Ar_{126}$ and $Ar_{127}$ may each independently be a $C_1$-$C_{10}$ alkyl group, e.g., a methyl group, an ethyl group, or a propyl group.

In Formula 302, k and l may each independently be an integer from 0 to 4. In some embodiments, k and l may each be 0, 1, or 2.

When the organic light-emitting device 10 is a full-color organic light-emitting device, the emission layer may be patterned into a red emission layer, a green emission layer, and a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount of the dopant may be selected from a range of about 0.01 parts to about 15 parts by weight based on about 100 parts by weight of the host, but embodiments are not limited thereto.

The thickness of the emission layer may be in a range of about 100 Å to about 1,000 Å, and in some embodiments, about 200 Å to about 600 Å. While not wishing to be bound by theory, it is understood that when the thickness of the emission layer is within any of these ranges, improved luminescence characteristics may be obtained without a substantial increase in driving voltage.

Next, an electron transport region may be formed on the emission layer.

The electron transport region may include a hole blocking layer, an electron transport layer, an electron injection layer, or a combination thereof.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, at least one selected from BCP, Bphen, and BAlq, but embodiments are not limited thereto:

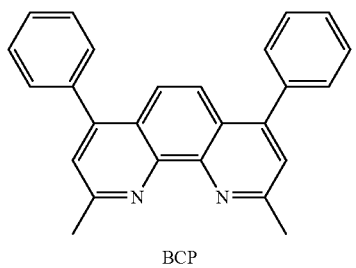

BCP

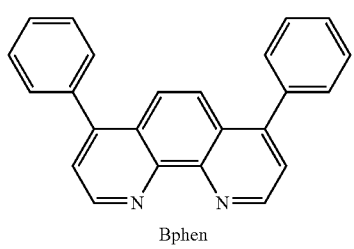

Bphen

The thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, excellent hole blocking characteristics may be obtained without a substantial increase in driving voltage.

The electron transport layer may further include at least one selected from BCP, BPhen, Alq3, BAlq, TAZ, and NTAZ:

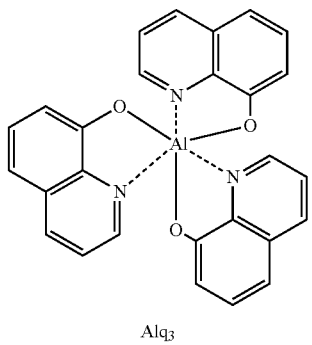

Alq3

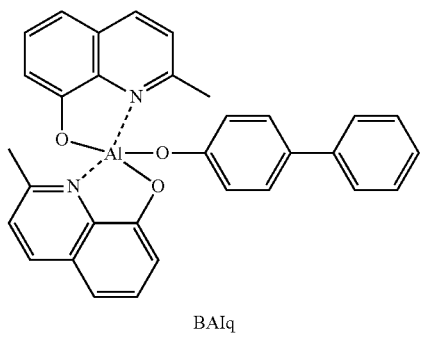

BAlq

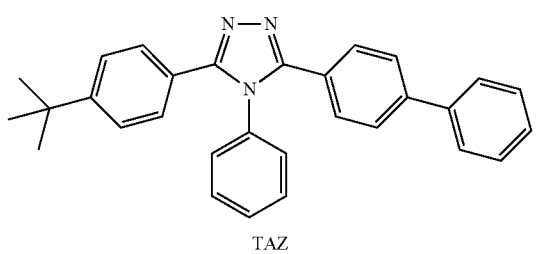

TAZ

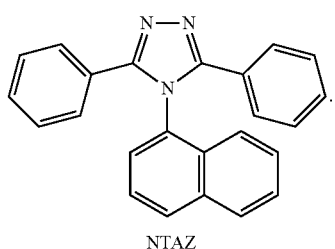

NTAZ

In some embodiments, the electron transport layer may include at least one selected from Compounds ET1 to ET25, but embodiments are not limited thereto:

ET1 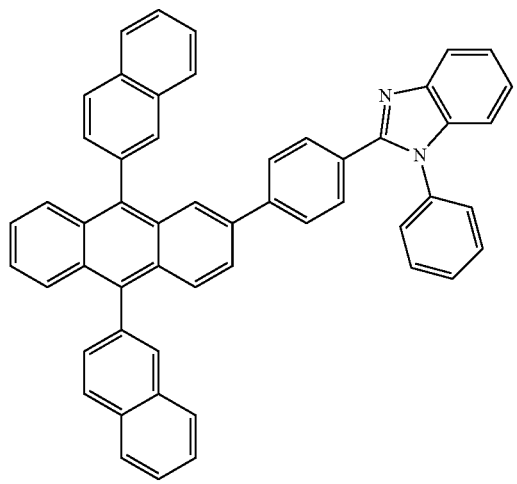
ET2 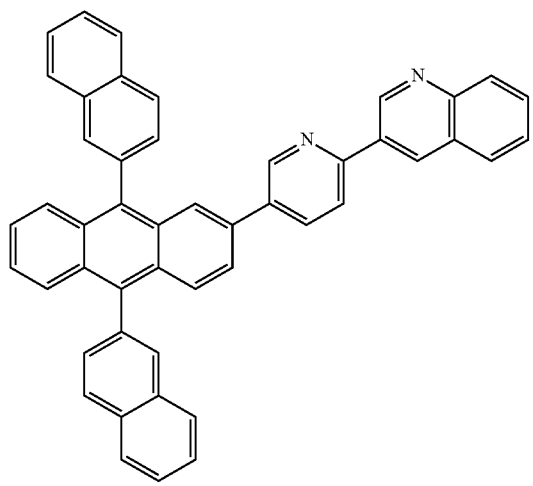
ET3 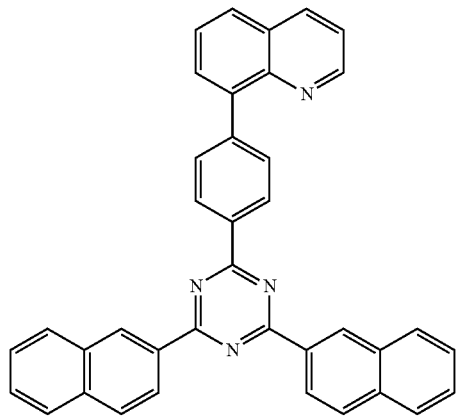
ET4 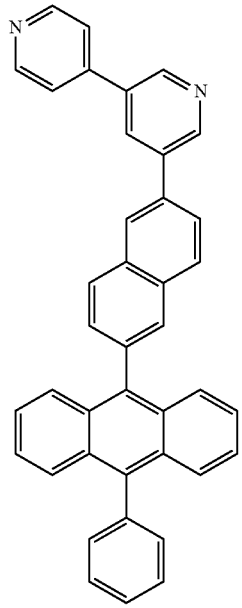
ET5 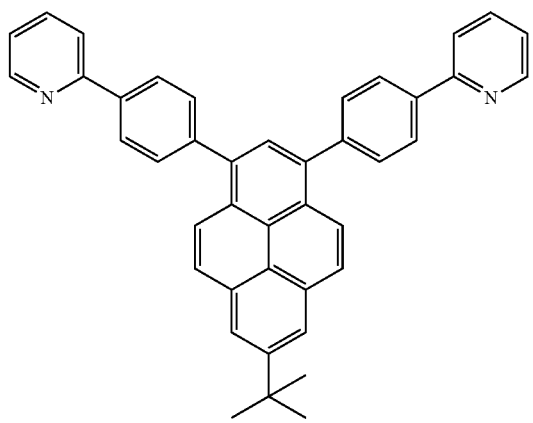
ET6 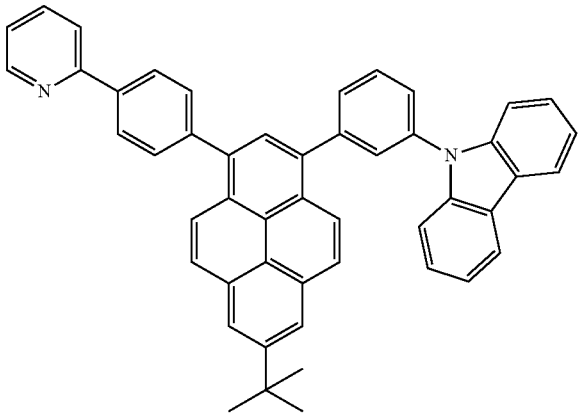

139
-continued
ET7
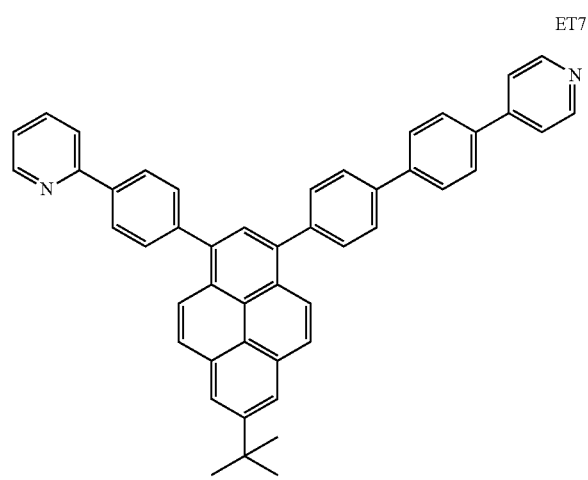
ET8
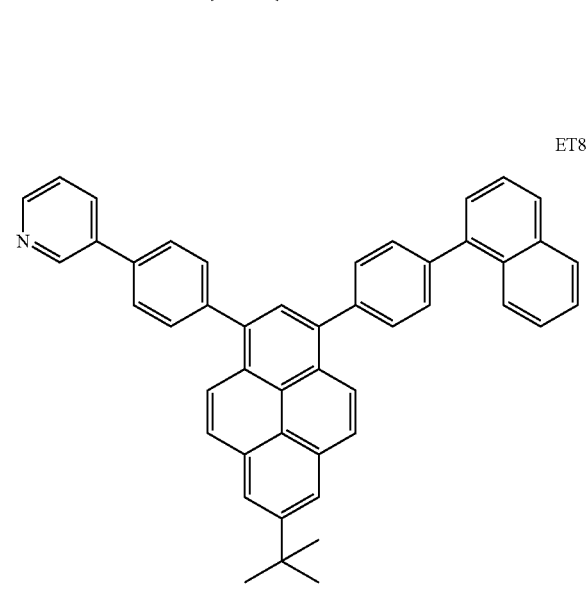
ET9
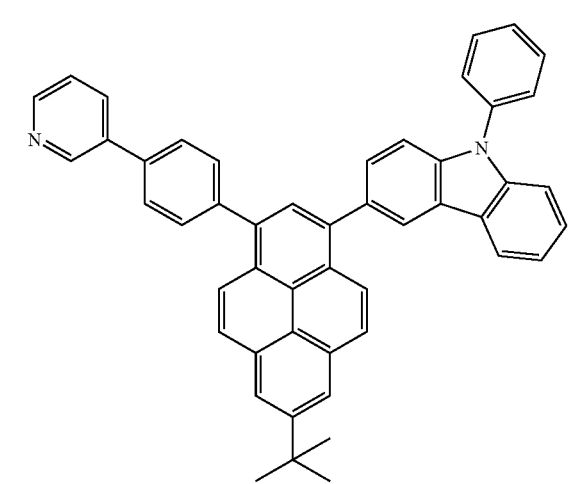
140
-continued
ET10
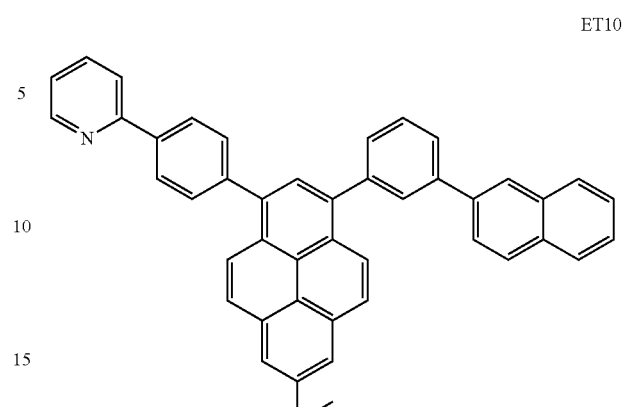
ET11
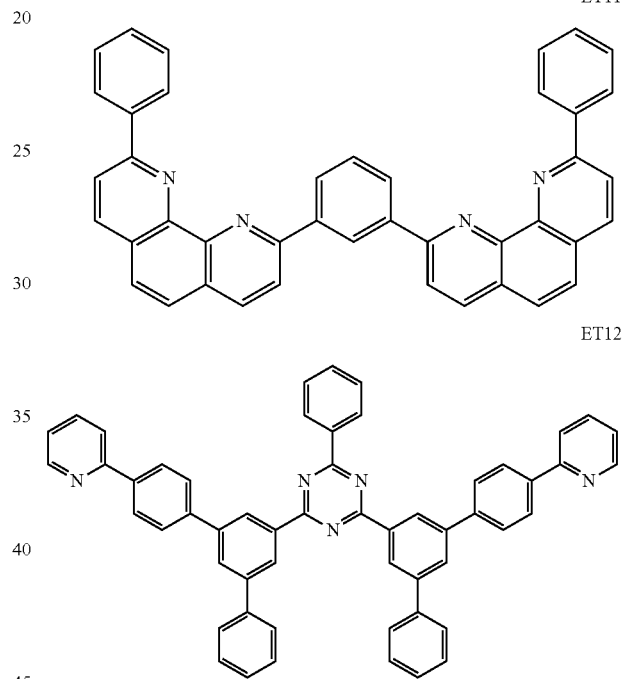
ET12
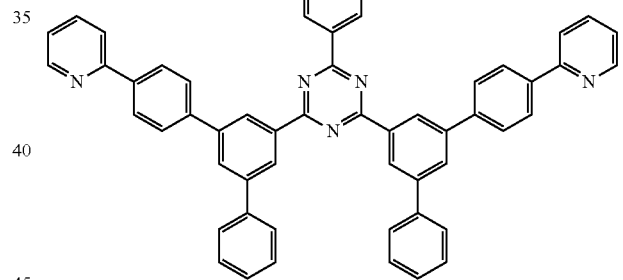
ET13
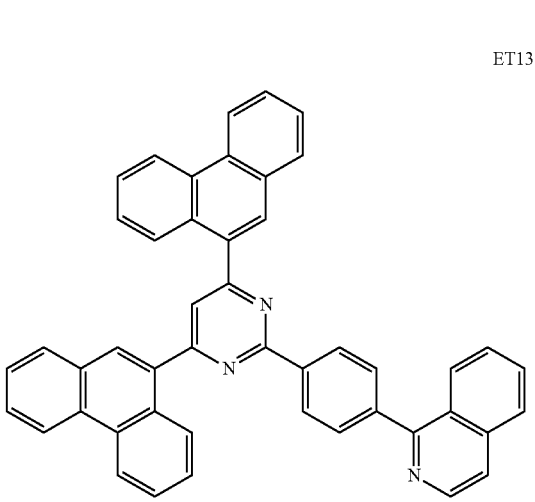

ET14
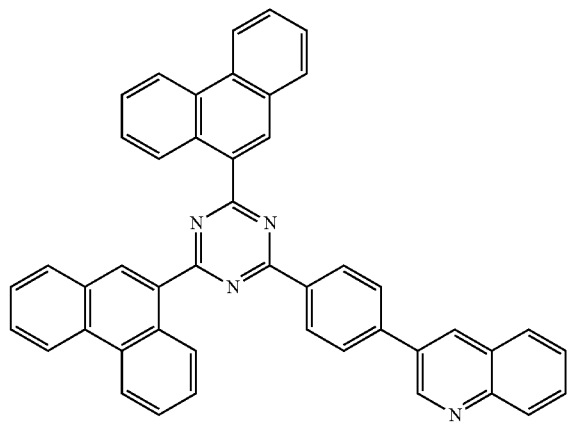
ET15
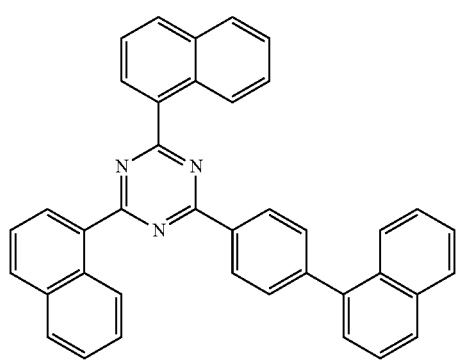
ET16
ET17
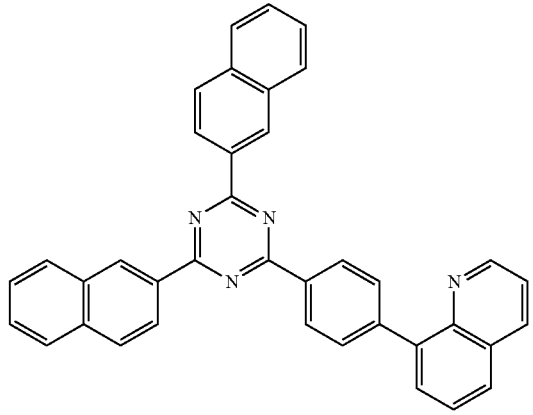
ET18
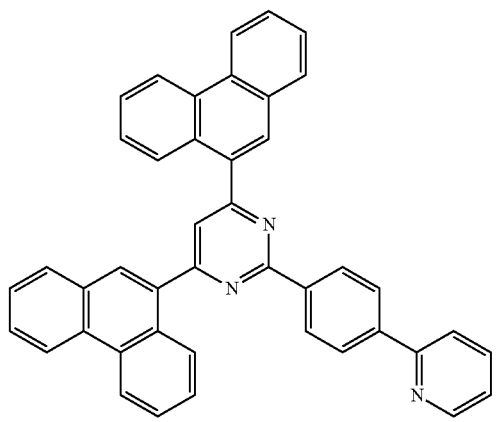
ET19
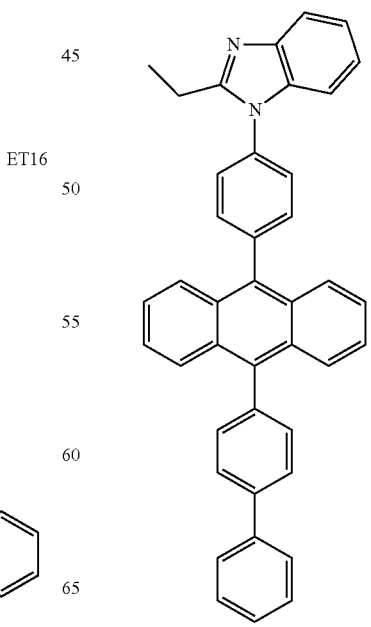

ET20
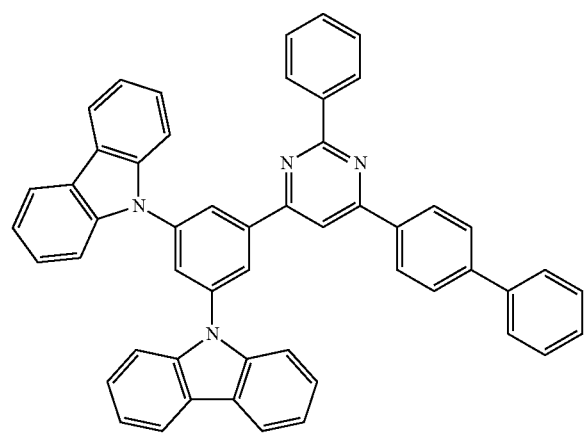
ET21
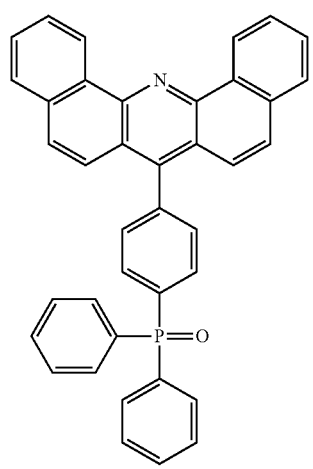
ET22
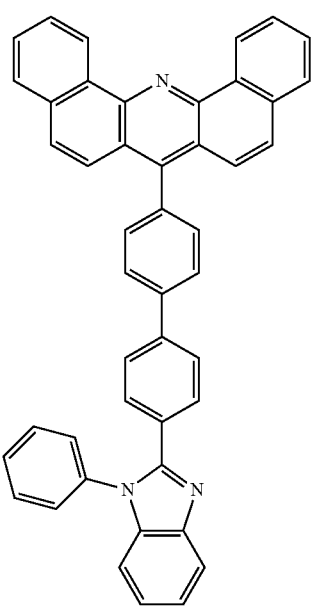
ET23
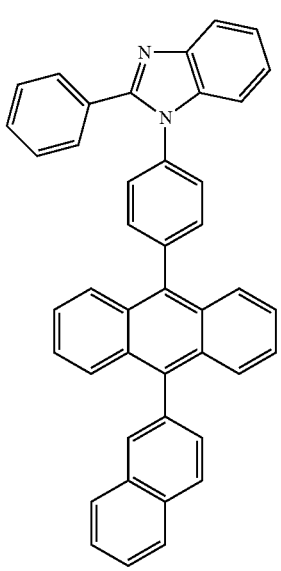
ET24
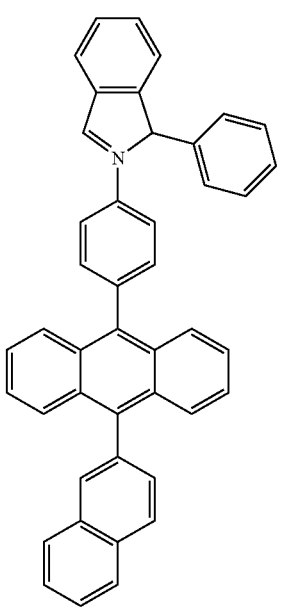
ET25
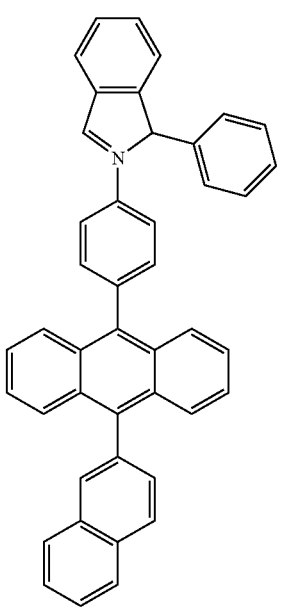
The thickness of the electron transport layer may be in a range of about 100 Å to about 1,000 Å, and in some embodiments, about 150 Å to about 500 Å. While not wishing to be bound by theory, it is understood that when the thickness of the electron transport layer is within any of these ranges, excellent electron transport characteristics may be obtained without a substantial increase in driving voltage.

The electron transport layer may further include a material containing metal, in addition to the materials described above.

The material containing metal may include a lithium (Li) complex. The Li complex may include, e.g., Compound ET-D1 (lithium 8-hydroxyquinolate, LiQ) or Compound ET-D2:

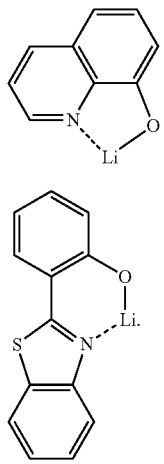

ET-D1

ET-D2

The electron transport region may include an electron injection layer that facilitates electron injection from the second electrode 19.

The electron injection layer may include at least one selected from LiF, NaCl, CsF, $Li_2O$, and BaO.

The thickness of the electron injection layer may be in a range of about 1 Å to about 100 Å, and in some embodiments, about 3 Å to about 90 Å. While not wishing to be bound by theory, it is understood that when the thickness of the electron injection layer is within any of these ranges, excellent electron injection characteristics may be obtained without a substantial increase in driving voltage.

The second electrode 19 may be formed on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to FIG. 1, but embodiments are not limited thereto.

According to another aspect, a diagnostic composition includes at least one organometallic compound represented by Formula 1.

Since the organometallic compound represented by Formula 1 provides high luminous efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_2$-$C_{60}$ alkenyl group" as used herein refers to a group formed by including at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a group formed by including at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having substantially the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group including 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and a $C_6$-$C_{60}$ arylene group each include at least two rings, the at least two rings may be fused.

The term "$C_1$-$C_{60}$ heteroaryl group" as used herein refers to a monovalent group having a cyclic aromatic system having at least one heteroatom selected from N, O, P, Si, and S as a ring-forming atom and 1 to 60 carbon atoms. The term "$C_1$-$C_{60}$ heteroarylene group" as used herein refers to a divalent group having a cyclic aromatic system having at least one heteroatom selected from N, O, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include at least two rings, the at least two rings may be fused.

The term "$C_6$-$C_{60}$ aryloxy group" as used herein indicates —$OA_{102}$ (wherein $A_{102}$ is a $C_6$-$C_{60}$ aryl group). The term "$C_6$-$C_{60}$ arylthio group" as used herein indicates —$SA_{103}$ (wherein $A_{103}$ is a $C_6$-$C_{60}$ aryl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group.

The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, and S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to saturated or unsaturated cyclic group including 1 to 30 carbon atoms and at least one heteroatom selected from N, O, P, Si, and S as ring-forming atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used in terms of molar equivalents.

EXAMPLES

Synthesis Example 1: Synthesis of Compound 1

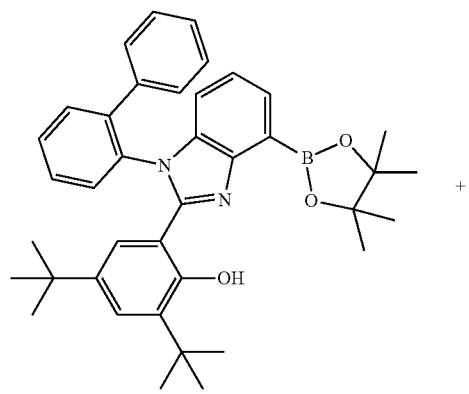

+

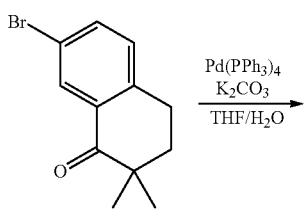

Pd(PPh$_3$)$_4$
K$_2$CO$_3$
—————→
THF/H$_2$O

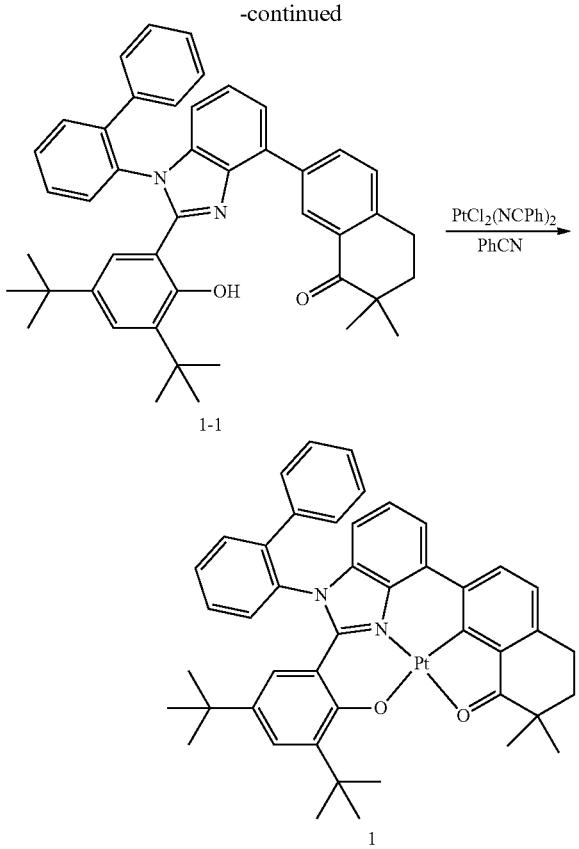

Synthesis of Intermediate 1-1

2.14 grams (g) (3.86 millimoles (mmol)) of 7-bromo-2,2-dimethyl-3,4-dihydronaphthalen-1(2H)-one, 1.22 g (4.06 mmol) of 2-(1-([1,1'-biphenyl]-2-yl)-4-(4,4,5,5-tetramethyl-1,3,2-dioxaborolan-2-yl)-1H-benzo[d]imidazol-2-yl)-4,6-di-tert-butylphenol, 0.22 g (0.19 mmol) of Pd(PPh$_3$)$_4$, and 1.23 g (11.59 mmol) of K$_2$CO$_3$ were mixed with 11 milliliters (mL) of tetrahydrofuran (THF) and 4 milliliters (mL) of distilled water. Subsequently, the mixture was stirred under reflux for 6 hours. The mixture was cooled to room temperature. Subsequently, an organic layer was extracted therefrom by using ethyl acetate (EA), and anhydrous magnesium sulfate (MgSO$_4$) was added thereto to dry the organic layer. The resultant was filtered and a solvent in the obtained filtrate was removed under reduced pressure. The residual was purified by column chromatography using EA and hexane at a ratio of 1:10 to obtain 2.40 g of Intermediate 1-1 (96%).

LC-MS m/z=647.36 (M+H)

Synthesis of Compound 1

0.77 g (1.19 mmol) of Intermediate 1-1 and 0.62 g (1.31 mmol) of PtCl$_2$(NCPh)$_2$ were mixed together with 15 mL of benzonitrile. The mixture was stirred at a temperature of about 200° C. for 12 hours to carry out the reaction. Thereafter, the temperature was lowered. After removing benzonitrile by distillation, an organic layer was extracted therefrom by using methylene chloride (MC), and anhydrous MgSO$_4$ was added thereto to dry the organic layer. The resultant was filtered and a solvent in the obtained filtrate was removed under reduced pressure. The residual was purified by column chromatography using MC and hexane at a ratio of 8:2 to obtain 0.50 g of Compound 1 (50%).

LC-MS m/z=840.28 (M+H)

Synthesis Example 2: Synthesis of Compound 2

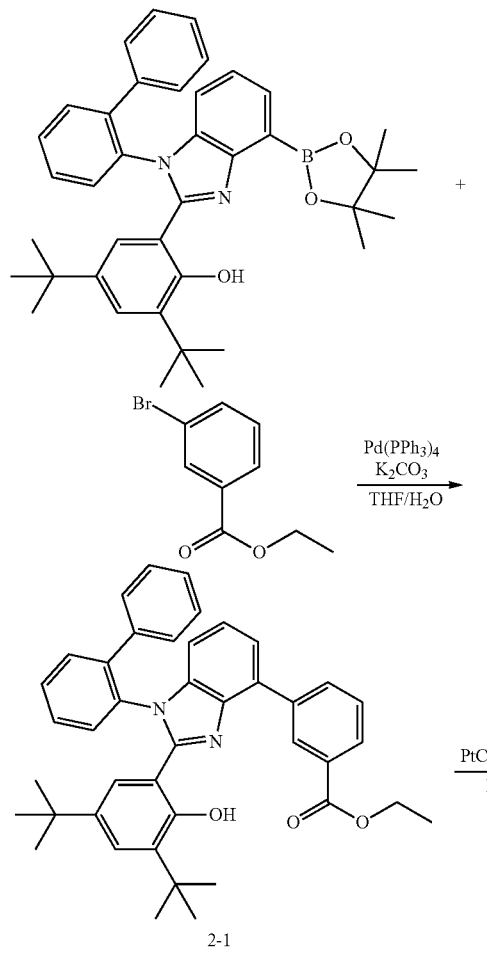

Synthesis of Intermediate 2-1

0.37 g (1.61 mmol) of ethyl 3-bromobenzoate, 1.01 g (1.69 mmol) of 2-(1-([1,1'-biphenyl]-2-yl)-4-(4,4,5,5-tetramethyl-1,3,2-dioxaborolan-2-yl)-1H-benzo[d]imidazol-2-yl)-4,6-di-tert-butylphenol, 0.09 g (0.08 mmol) of Pd(PPh$_3$)$_4$, and 0.51 g (4.82 mmol) of K$_2$CO$_3$ were mixed with 5 mL of THF and 2 mL of distilled water. Subsequently, the mixture was stirred under reflux for 6 hours. The mixture was cooled to room temperature. Subsequently, an organic layer was extracted therefrom by using EA, and anhydrous MgSO$_4$ was added thereto to dry the organic layer. The resultant was filtered and a solvent in the obtained filtrate was removed under reduced pressure. The residual was purified by column chromatography using EA and hexane at a ratio of 1:10 to obtain 0.76 g of Intermediate 2-1 (76%).

LC-MS m/z=623.39 (M+H)

Synthesis of Compound 2

0.41 g (0.65 mmol) of Intermediate 2-1 and 0.34 g (0.71 mmol) of PtCl$_2$(NCPh)$_2$ were mixed together with 10 mL of benzonitrile. The mixture was stirred at a temperature of about 20000 for 12 hours to carry out the reaction. Thereafter, the temperature was lowered. After removing benzonitrile by distillation, an organic layer was extracted therefrom by using MC, and anhydrous MgSO$_4$ was added thereto to dry the organic layer. The resultant was filtered and a solvent in the obtained filtrate was removed under reduced pressure. The residual was purified by column chromatography using MC and hexane at a ratio of 8:2 to obtain 0.15 g of Compound 2 (28%).

LC-MS m/z=816.35 (M+H)

Synthesis Example 3: Synthesis of Compound 3

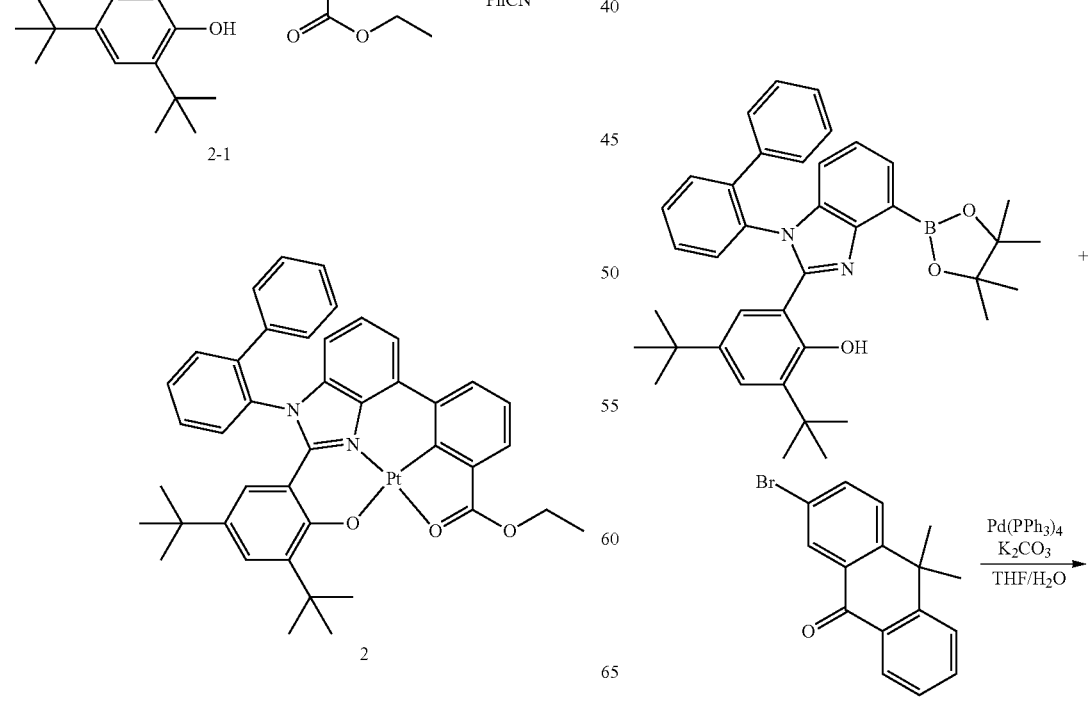

-continued

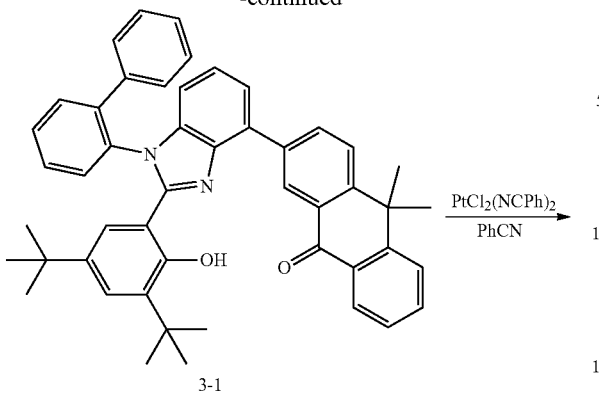

3-1

3

Synthesis of Intermediate 3-1

1.02 g (3.75 mmol) of 2-bromo-10,10-dimethylanthracen-9(10H)-one, 2.25 g (3.75 mmol) of 2-(1-([1,1'-biphenyl]-2-yl)-4-(4,4,5,5-tetramethyl-1,3,2-dioxaborolan-2-yl)-1H-benzo[d]imidazol-2-yl)-4,6-di-tert-butylphenol, 0.22 g (0.19 mmol) of Pd(PPh$_3$)$_4$, and 1.19 g (11.25 mmol) of K$_2$CO$_3$ were mixed with 11 mL of THF and 4 mL of distilled water. Subsequently, the mixture was stirred under reflux for 6 hours. The mixture was cooled to room temperature. Subsequently, an organic layer was extracted therefrom by using EA, and anhydrous MgSO$_4$ was added thereto to dry the organic layer. The resultant was filtered and a solvent in the obtained filtrate was removed under reduced pressure.

The residual was purified by column chromatography using EA and hexane at a ratio of 1:10 to obtain 0.60 g of Intermediate 3-1 (24%).

LC-MS m/z=667.37 (M+H)

Synthesis of Compound 3

0.60 g (0.93 mmol) of Intermediate 3-1 and 0.44 g (0.93 mmol) of PtCl$_2$(NCPh)$_2$ were mixed together with 10 mL of benzonitrile. The mixture was stirred at a temperature of about 200° C. for 12 hours to carry out the reaction. Thereafter, the temperature was lowered. After removing benzonitrile by distillation, an organic layer was extracted therefrom by using methylene chloride (MC), and anhydrous MgSO$_4$ was added thereto to dry the organic layer. The resultant was filtered and a solvent in the obtained filtrate was removed under reduced pressure. The residual was purified by column chromatography using MC and hexane at a ratio of 8:2 to obtain 0.27 g of Compound 3 (34%).

LC-MS m/z=888.35 (M+H)

Synthesis Example 4: Synthesis of Compound 4

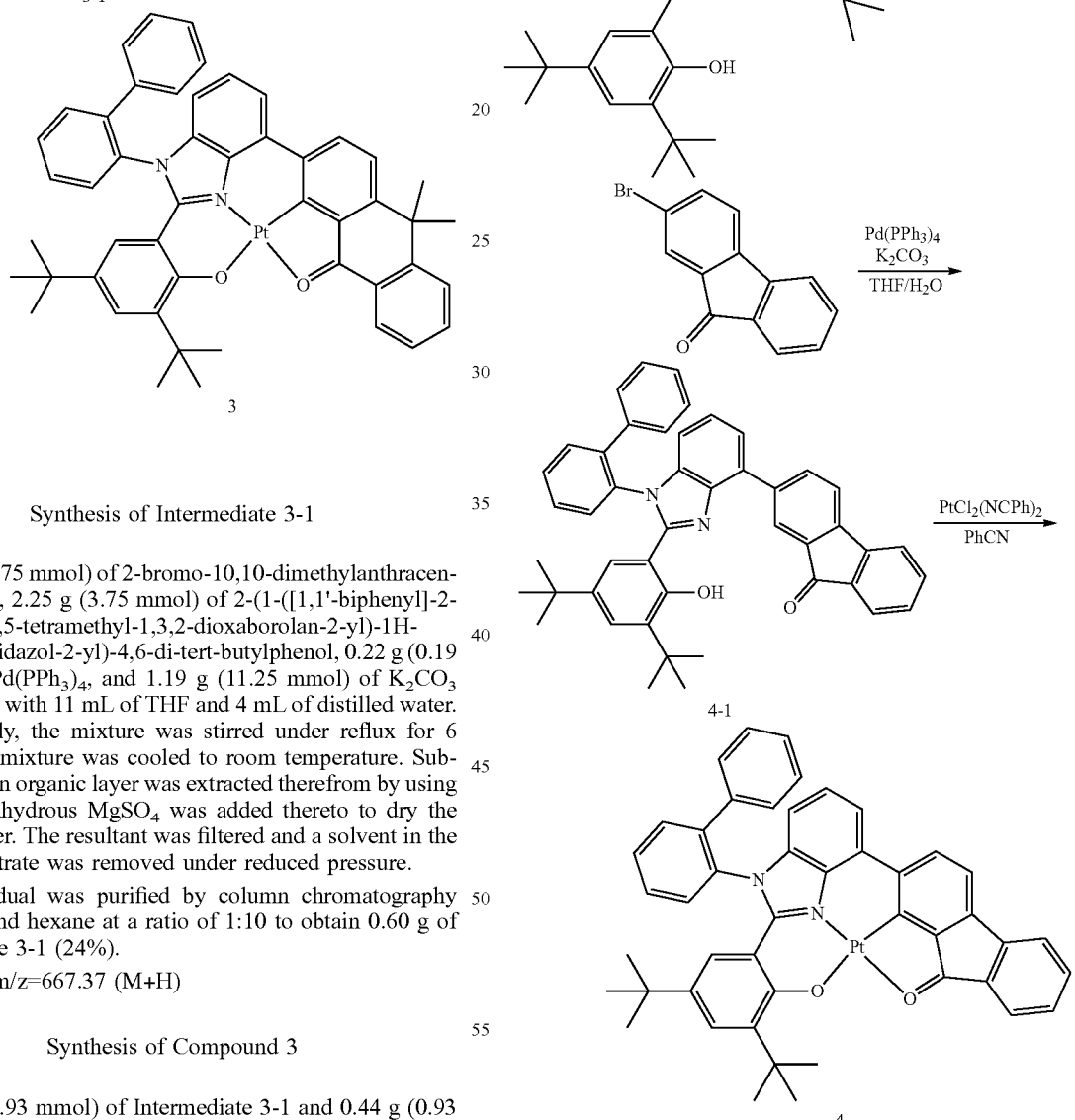

4-1

4

Synthesis of Intermediate 4-1

(1.19 g, 4.60 mmol) of 2-bromo-9H-fluoren-9-one, 2.90 g (4.83 mmol) of 2-(1-([1,1'-biphenyl]-2-yl)-4-(4,4,5,5-tetramethyl-1,3,2-dioxaborolan-2-yl)-1H-benzo[d]imidazol-2-yl)-4,6-di-tert-butylphenol, 0.27 g (0.23 mmol) of Pd(PPh$_3$)$_4$, and 1.46 g (13.79 mmol) of K$_2$CO$_3$ were mixed with 11 mL of THF and 4 mL of distilled water. Subsequently, the mixture was stirred under reflux for 6 hours. The mixture was cooled to room temperature. Subsequently, an organic layer was extracted therefrom by using EA, and anhydrous MgSO$_4$ was added thereto to dry the organic layer. The resultant was filtered and a solvent in the obtained filtrate was removed under reduced pressure. The residual was purified by column chromatography using EA and hexane at a ratio of 1:10 to obtain 3.00 g of Intermediate 4-1 (100%).

LC-MS m/z=653.35 (M+H)

Synthesis of Compound 4

0.73 g (1.12 mmol) of Intermediate 4-1 and 0.58 g (1.24 mmol) of PtCl$_2$(NCPh)$_2$ were mixed together with 15 mL of benzonitrile. The mixture was stirred at a temperature of about 200° C. for 12 hours to carry out the reaction. Thereafter, the temperature was lowered. After removing benzonitrile by distillation, an organic layer was extracted therefrom by using MC, and anhydrous MgSO$_4$ was added thereto to dry the organic layer. The resultant was filtered and a solvent in the obtained filtrate was removed under reduced pressure. The residual was purified by column chromatography using MC and hexane at a ratio of 8:2 to obtain 0.21 g of Compound 4 (22%).

LC-MS m/z=846.26 (M+H)

Evaluation Example 1: Analysis of Nuclear Magnetic Resonance (NMR) and Fourier Transform-Infrared (FT-IR) Spectrum with Respect to Intermediate 2-1 and Compound 2

Figure 2:
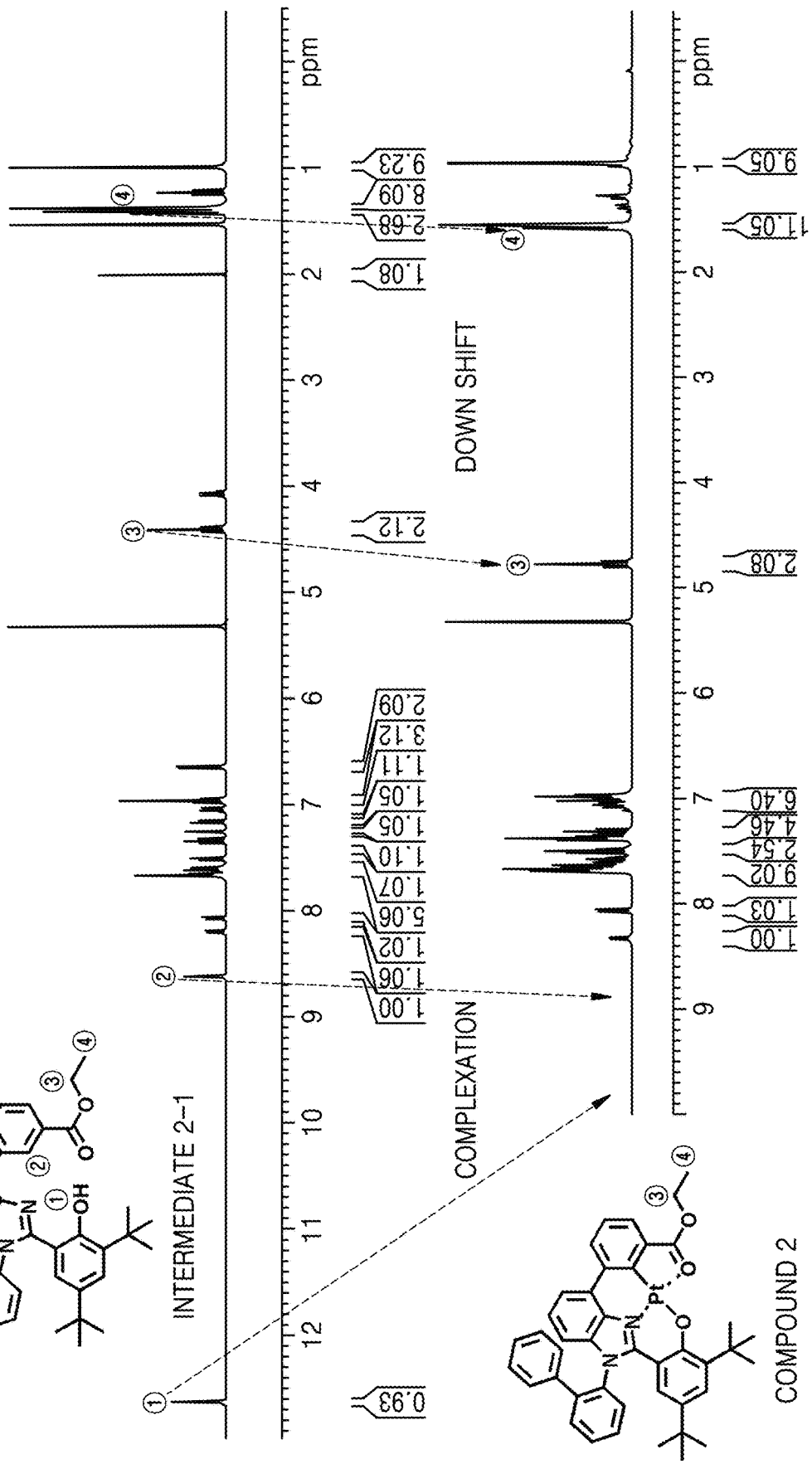
FIG. 2 is a graph of intensity (arbitrary units, a. u.) versus chemical shift (parts per million, ppm) showing nuclear magnetic resonance (NMR) spectra data of Intermediate 2-1 and Compound 2.
Figure 3:
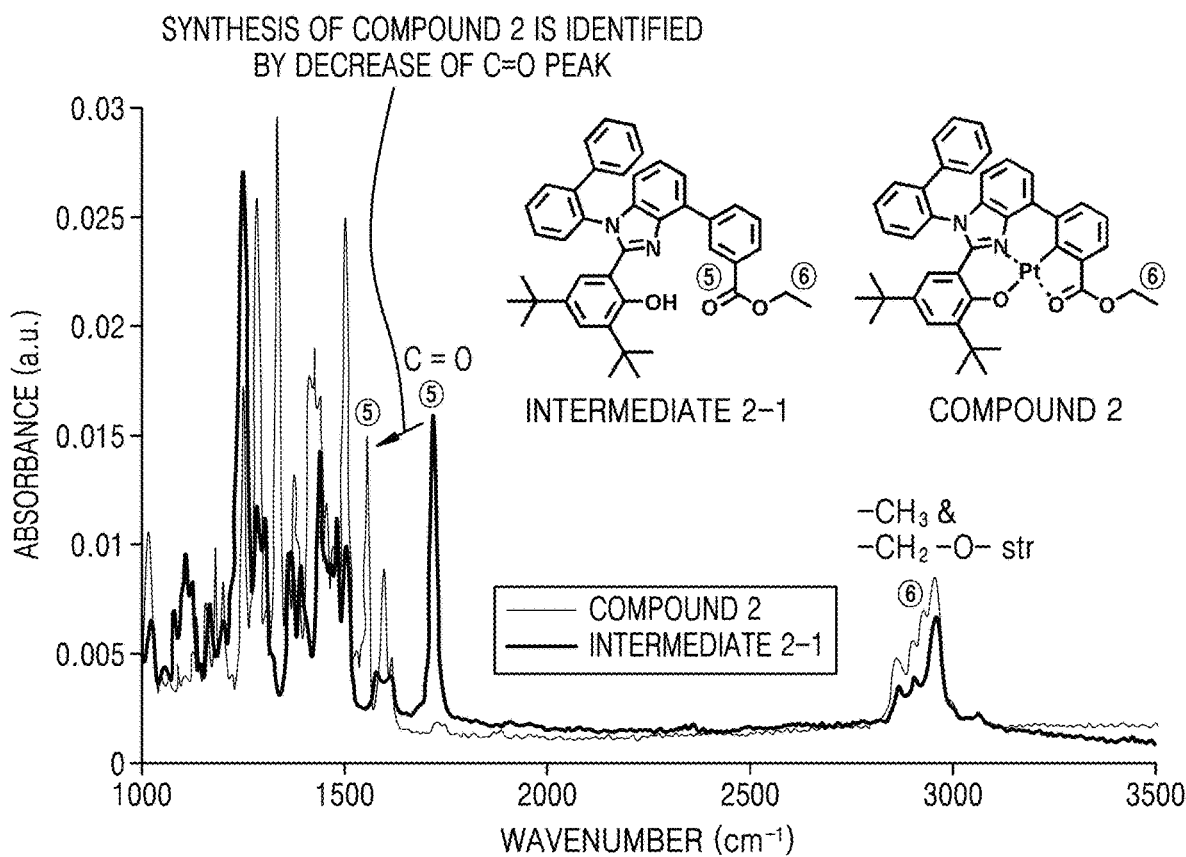
FIG. 3 is a graph of intensity (arbitrary units, a. u.) versus chemical shift (parts per million, ppm) showing Fourier transform-infrared (FT-IR) spectra data of Intermediate 2-1 and Compound 2.

The NMR spectra of Intermediate 2-1 and Compound 2 were analyzed by using a NMR spectrometer, AVANCE DPX 300. The results thereof are shown in FIG. 2. The FT-IR spectra of Intermediate 2-1 and Compound 2 were analyzed by using a FT-IR spectrometer (attenuated total reflection (ATR) mode), Vertex70-Hyperion 3000. The results thereof are shown in FIG. 3.

In FIG. 2, peaks at Points 1 and 2 of Intermediate 2-1 were not observed in the NMR spectrum of Compound 2. In FIG. 3, an absorbance of the C=O peak of the FT-IR spectrum of Compound 2 was low, as compared with an absorbance of the C=O peak of the FT-IR spectrum of Intermediate 2-1. Referring to the FIGS. 2 and 3, it was found that as a result of complexation of Pt with Intermediate 2-1, Compound 2 was synthesized, wherein Compound 2 had a coordinate bond between Pt and O that corresponds to X$_4$ in Formulae 2, 1 Å, and 1 Å(1) of the present specification.

Evaluation Example 2: Evaluation of Photoluminescence (PL) Spectrum

Compound 1 was diluted in toluene at a concentration of 10 millimoles (mM), and a PL spectrum of Compound was measured by using an ISC PC1 spectrofluorometer, in which a xenon lamp is mounted. The same process was performed on Compounds 2, 3, and A. The results thereof are shown in Table 2.

TABLE 2

| Compound No. | Maximum emission wavelength (nm) | Full width at half maximum (FWHM) (nm) |
|---|---|---|
| 1 | 572 | 98.4 |
| 2 | 509 | 69.6 |
| 3 | 673 | 63.7 |
| A | 516 | 70 |

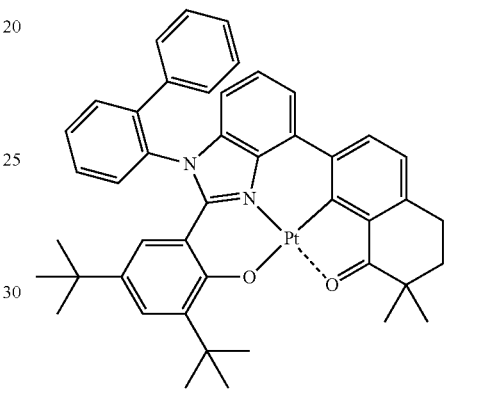

1

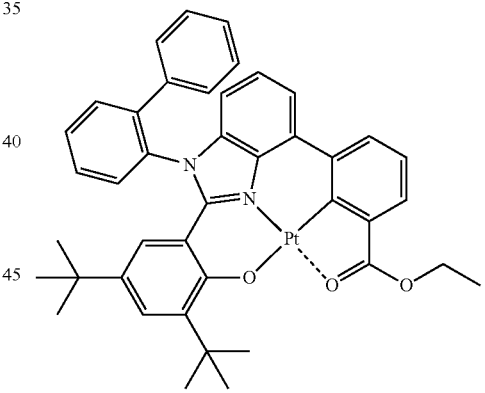

2

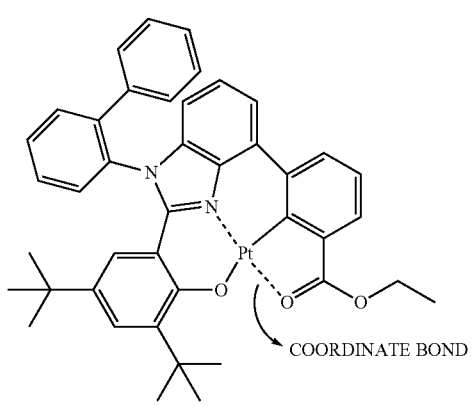

2

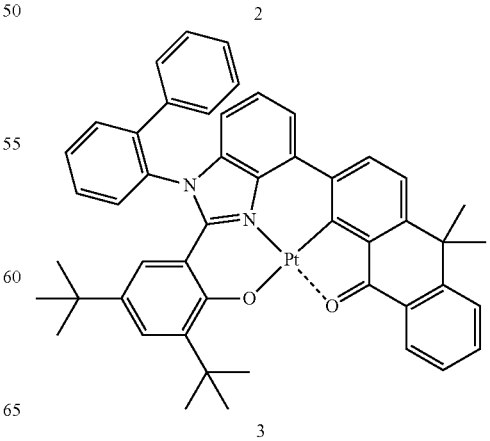

3

TABLE 2-continued

| Compound No. | Maximum emission wavelength (nm) | Full width at half maximum (FWHM) (nm) |
|---|---|---|

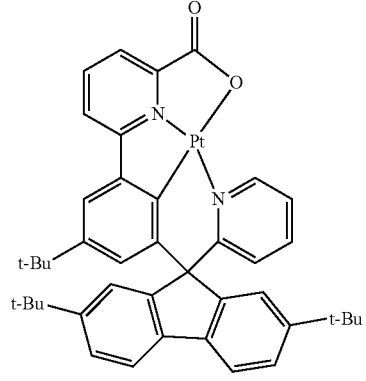

A

Evaluation Example 3: Evaluation of PL Quantum Yield (PLQY)

A $CH_2Cl_2$ solution of PMMA was mixed with a mixture of 8 percent by weight (weight %) of CBP and Compound 1 (a content of Compound 1 was 10 parts based on 100 parts by weight of the mixture). The resultant obtained therefrom was coated on a quartz substrate by using a spin coater, heat-treated in an oven at a temperature of 80° C., and cooled to room temperature, thereby obtaining a film.

PLQY in film was evaluated by using Hamamatsu Photonics absolute PL quantum yield measurement system employing PLQY measurement software (Hamamatsu Photonics, Ltd., Shizuoka, Japan), in which a xenon light source, a monochromator, a photonic multichannel analyzer, and an integrating sphere are mounted. Thus, PLQY in film of Compound 1 was measured.

The same process was performed on Compounds 2, 3, and A, to measure the PLQY in film of Compounds 1, 2, 3, and A. The results thereof are summarized in Table 3.

TABLE 3

| Compound No. | PLQY in film |
|---|---|
| 1 | 0.564 |
| 2 | 0.497 |
| 3 | 0.644 |
| A | 0.28 |

Referring to Table 3, Compounds 1 to 3 were found to have a high PLQY value, as compared with Compound A.

Example 1

A glass substrate, on which an anode having an ITO/Ag/ITO (70 Å/1,000 Å/70 Å) structure was deposited, was cut to a size of 50 millimeters (mm)×50 mm×0.5 mm, sonicated in iso-propyl alcohol and water for 5 minutes each, and cleaned by exposure to ultraviolet rays and ozone for 30 minutes. Subsequently, the glass substrate was mounted on a vacuum-deposition device.

2-TNATA was deposited on the anode to form a hole injection layer having a thickness of 600 Å. 4,4'-bis[N-(1-naphthyl)-N-phenylamino]biphenyl (hereinafter, referred as "NPB") was deposited on the hole injection layer to form a hole transport layer having a thickness of 1,350 Å.

CBP (as a host) and Compound 1 (as a dopant) were co-deposited on the hole transport layer at a weight ratio of 98:2 to form an emission layer having a thickness of 400 Å. BCP was deposited on the emission layer to form a hole blocking layer having a thickness of 50 Å. Subsequently, $Alq_3$ was deposited on the hole blocking layer to form an electron transport layer having a thickness of 350 Å. LiF was deposited on the electron transport layer to form an electron injection layer having a thickness of 10 Å.

MgAg was deposited on the electron injection layer at a weight ratio of 90:10 to form a cathode having a thickness of 120 Å, thereby completing the manufacture of an organic light-emitting device (which emits green light). The organic light-emitting device thus have a structure of ITO/Ag/ITO/2-TNATA (600 Å)/NPB (1,350 Å)/CBP+Compound 1 (2 weight %) (400 Å)/BCP (50 Å)/$Alq_3$ (350 Å)/LiF (10 Å)/MgAg (120 Å).

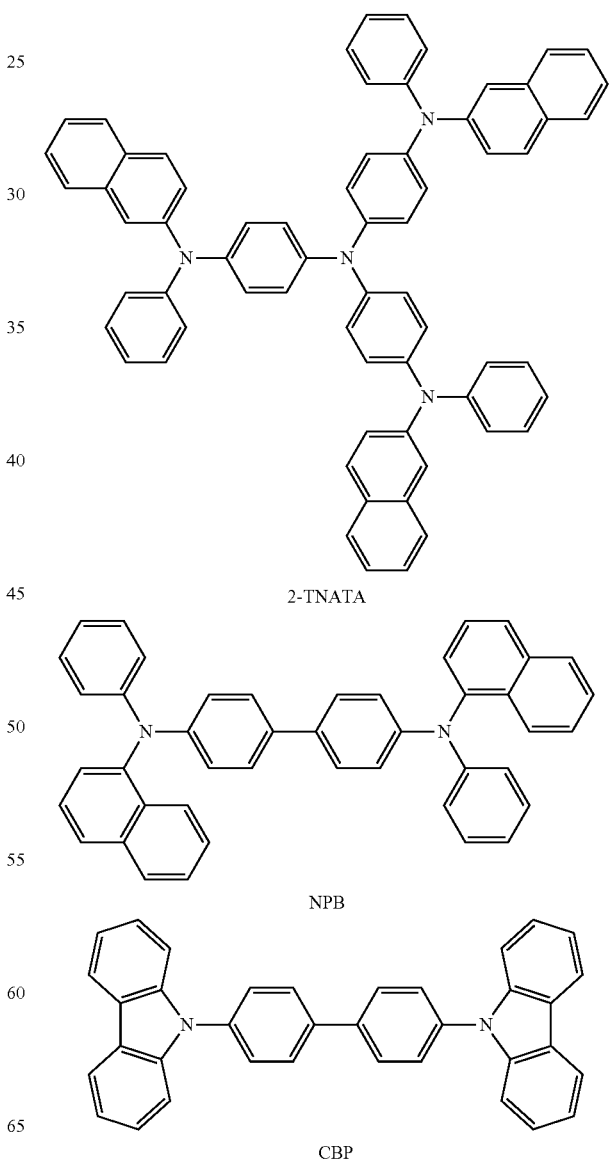

2-TNATA

NPB

CBP

-continued

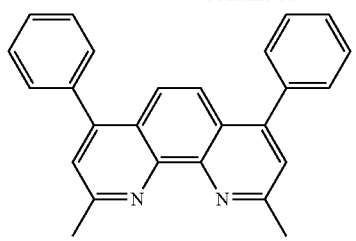

BCP

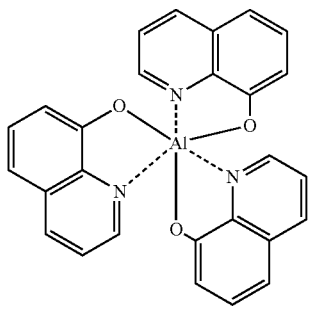

Alq₃

Examples 2 and 3 and Comparative Example A

Organic light-emitting devices were manufactured in substantially the same manner as in Example 1, except that the compounds listed in Table 4 were used instead of Compound 1 as a dopant in the formation of an emission layer.

Evaluation Example 4: Evaluation of Characteristics of Organic Light-Emitting Device The maximum emission wavelength and maximum external quantum efficiency ($EQE_{max}$) derived from electroluminescence (EL) spectra of the organic light-emitting devices manufactured in Examples 1 to 3 and Comparative Example A were evaluated.

Figure 4:
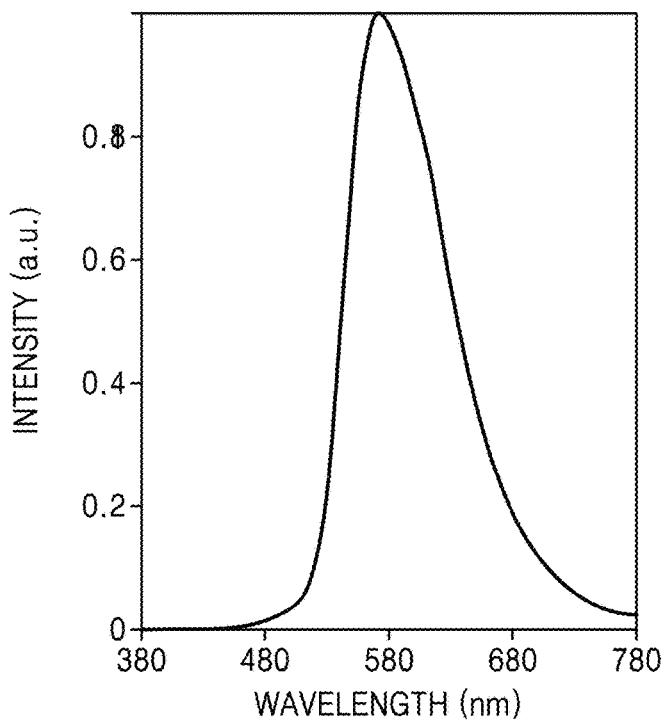
FIG. 4 is a graph of intensity (arbitrary units, a. u.) versus wavelength (nanometers, nm) with respect to electroluminescence (EL) of an organic light-emitting device of Example 1.

The results thereof are shown in Table 4. A Keithley 2400 current voltmeter and a luminance meter (Minolta Cs-1000 Å) were used in evaluation. The EL spectrum of the organic light-emitting device of Example 1 is shown in FIG. 4.

TABLE 4

| | Dopant | Maximum external quantum efficiency ($EQE_{max}$) (%) | Maximum emission wavelength (nm) |
|---|---|---|---|
| Example 1 | Compound 1 | 18.8 | 572 |
| Example 2 | Compound 2 | 19.2 | 511 |
| Example 3 | Compound 3 | 18.2 | 673 |
| Comparative Example A | Compound A | 18.0 | 520 |

TABLE 4-continued

| | Dopant | Maximum external quantum efficiency ($EQE_{max}$) (%) | Maximum emission wavelength (nm) |
|---|---|---|---|

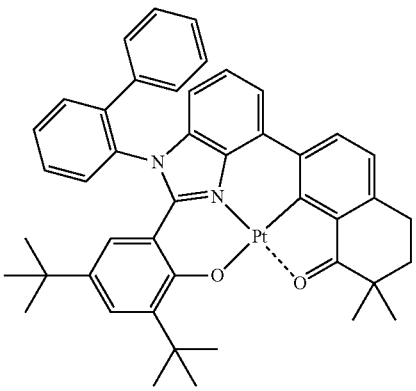

1

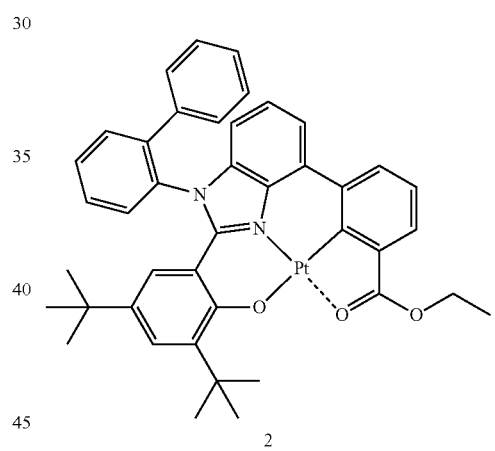

2

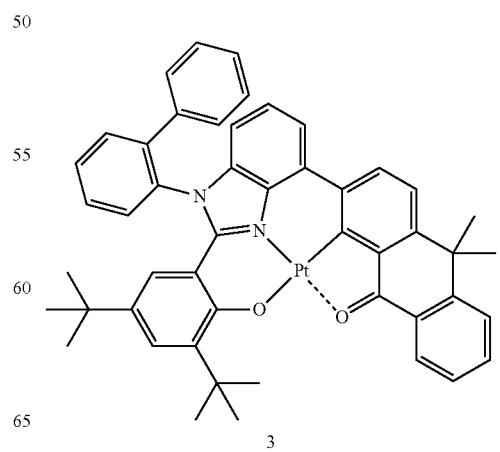

3

TABLE 4-continued

| Dopant | Maximum external quantum efficiency ($EQE_{max}$) (%) | Maximum emission wavelength (nm) |
| --- | --- | --- |

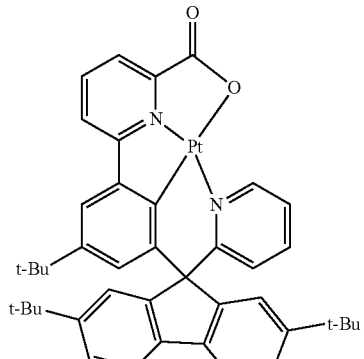

A

Referring to the results of Table 4, it was found that the organic light-emitting devices of Examples 1 to 3 have improved external quantum efficiency, as compared with the organic light-emitting device manufactured in Comparative Example A. In addition, it was found that the maximum external quantum efficiency of the organic light-emitting device of Example 2, having the most similar maximum emission wavelength with the organic light-emitting device of Comparative Example A, increased the most, as compared with the maximum quantum efficiency of the organic light-emitting device of Comparative Example A.

As apparent from the foregoing description, the organometallic compound has excellent electrical characteristics and/or thermal stability. Accordingly, an organic light-emitting device employing the organometallic compound has a low driving voltage, high efficiency, high power, high color purity, and/or excellent lifespan characteristics. Further, a diagnostic composition that includes the organometallic compound may have high diagnostic efficiency, because the organometallic compound is excellent in phosphorescent emission characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:
1. An organometallic compound represented by

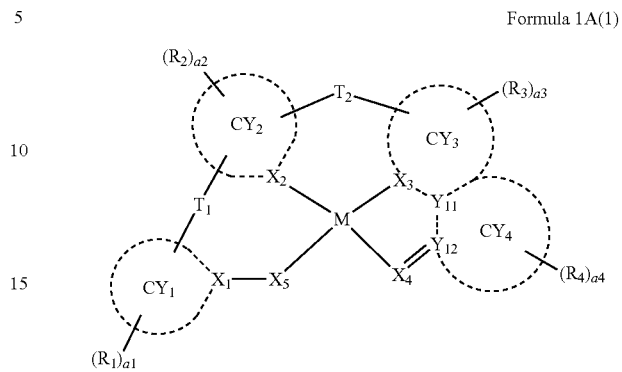

Formula 1A(1)

wherein, in Formula 1A(1),

M is a transition metal, $X_1$ and $X_2$ are each independently N or C, $X_5$ is selected from a covalent or coordinate bond, O, S, B(R'), N(R'), P(R'), (C'')(R''), Si(R')(R''), Ge(R')(R''), C(=O), B(R', R''), N(R')(R''), and P(R')(R''); when $X_5$ is a covalent or coordinate bond, $X_1$ and M are directly bound to each other, $X_4$ is bound to M via a coordinate bond, two bonds selected from a bond between M and $X_5$ or $X_1$, a bond between $X_2$ and M, and a bond between $X_3$ and M are each a covalent bond, while the remaining bond is a coordinate bond, $X_3$ and $Y_{12}$ are each independently N or C, $X_4$ is O or S, ring $CY_1$ to ring $CY_4$ are each independently a $C_5$-$C_{30}$ carbocyclic group or a $C_1$-$C_{30}$ heterocyclic group, $T_1$ and $T_2$ are each independently selected from a single bond, a double bond, *—N(R$_5$)—*', *—B(R$_5$)—*', *—P(R$_5$)—*', *—C(R$_5$)(R$_6$)—*', *—Si(R$_5$)(R$_6$)—*', *—Ge(R$_5$)(R$_6$)—*', *—S—*', *—Se—*', *—O—*', *—C(=O)—*', *—S(=O)—*', *—S(=O)$_2$—*', *—C(R$_5$)=*', *=C(R$_5$)—*', *—C(R$_5$)=C(R$_6$)—*', *—C(=S)—*', or *—C≡C—*', wherein * and *' each indicate a binding site to an adjacent atom, $R_1$ to $R_6$, R' and R are each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heteroaryl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ arylthio group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$)

a1 to a4 are each independently an integer from 0 to 20, two adjacent groups selected from a plurality of R$_1$ groups are optionally linked to form a C$_5$-C$_{30}$ carbocyclic group or a C$_1$-C$_{30}$ heterocyclic group, wherein the C$_5$-C$_{30}$ carbocyclic group and the C$_1$-C$_{30}$ heterocyclic group are each unsubstituted or substituted with at least one R$_{10a}$, two adjacent groups selected from a plurality of R$_2$ groups are optionally linked to form a C$_5$-C$_{30}$ carbocyclic group or a C$_1$-C$_{30}$ heterocyclic group, wherein the C$_5$-C$_{30}$ carbocyclic group and the C$_1$-C$_{30}$ heterocyclic group are each unsubstituted or substituted with at least one R$_{10a}$, two adjacent groups selected from a plurality of R$_3$ are optionally linked to form a C$_5$-C$_{30}$ carbocyclic group or a C$_1$-C$_{30}$ heterocyclic group, wherein the C$_5$-C$_{30}$ carbocyclic group and the C$_1$-C$_{30}$ heterocyclic group are each unsubstituted or substituted with at least one R$_{10a}$, at least two adjacent groups selected from R$_1$, R$_2$, R$_3$, R$_5$, R$_6$, R', and R" are optionally linked to form a C$_5$-C$_{30}$ carbocyclic group or a C$_1$-C$_{30}$ heterocyclic group, wherein the C$_5$-C$_{30}$ carbocyclic group and the C$_1$-C$_{30}$ heterocyclic group are each unsubstituted or substituted with at least one R$_{10a}$, R$_{10a}$ is selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$), Y$_{11}$ is selected from N and C, and wherein in Formula 1A(1) when Y$_{12}$ is C, then Y$_{11}$ is C.

2. The organometallic compound of claim 1, wherein M is Pt, Pd, or Au.

3. The organometallic compound of claim 1, wherein ring CY$_3$ is selected from i) a first ring, ii) a second ring, iii) a condensed ring in which two or more second rings are condensed, and iv) a condensed ring in which at least one first ring and at least one second ring are condensed, the first ring is selected from a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the second ring is selected from an adamantane group, a norbornane group, a norbornene group, a cyclohexane group, a cyclohexene group, a benzene group, a pyridine group, a pyrimidine group, a pyrazine group, a pyridazine group, and a triazine group.

4. The organometallic compound of claim 1, wherein R$_3$ R$_4$, and R$_{10a}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a C$_1$-C$_{20}$ alkyl group, and a C$_1$-C$_{20}$ alkoxy group;

a C$_1$-C$_{20}$ alkyl group and a C$_1$-C$_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a C$_1$-C$_{20}$ alkylthiophenyl group, a furanyl group, a C$_1$-C$_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a C$_1$-C$_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a $C_1$-$C_{20}$ alkylthiophenyl group, a furanyl group, a $C_1$-$C_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a $C_1$-$C_{20}$ alkylthiophenyl group, a furanyl group, a $C_1$-$C_{20}$ alkylfuranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and
—N(Q$_1$)(Q$_2$), —Si(Q$_3$)(Q$_4$)(Q$_5$), —B(Q$_6$)(Q$_7$), and —P(=O)(Q$_8$)(Q$_9$),
wherein Q$_1$ to Q$_9$ are each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

5. The organometallic compound of claim 1, satisfying one of Conditions 1 to 3:

Condition 1 a) $X_5$ is a chemical bond;

b) the moiety represented by

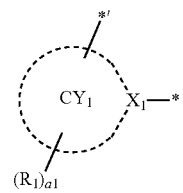

is represented by Formula A1-1;

c) $T_1$ is a single bond; and d) the moiety represented by

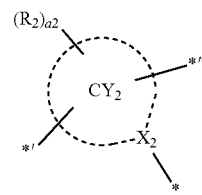

is represented by Formula A2-2 or $T_2$ is *—N(R$_5$)—*', *—B(R$_5$)—*', *—P(R$_5$)—*', *—C(R$_5$)(R$_6$)—*', *—Si(R$_5$)(R$_6$)—*', *—Ge(R$_5$)(R$_6$)—*', *—S—*', *—Se—*', *—O—*', *—C(=O)—*', *—S(=O)—*', *—S(=O)$_2$—*', *—C(R$_5$)=*', *=C(R$_5$)—*', *—C(R$_5$)=C(R$_6$)—*', *—C(=S)—*', or *—C≡C—*', Condition 2 a) $X_5$ is O, S, B(R'), N(R'), P(R'), C(R')(R"), Si(R')(R"), Ge(R')(R"), C(=O), B(R')(R"), N(R')(R"), and P(R')(R"), b) the moiety represented by

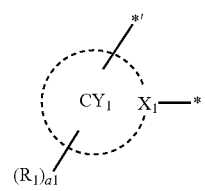

is represented by Formula A1-1;
c) $T_1$ is a single bond; and
d) the moiety represented by

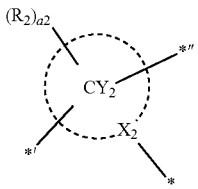

is represented by Formula A2-1 or Formula A2-2, and
Condition 3
a) $X_5$ is a covalent or coordinate bond;
b) the moiety represented by

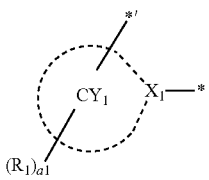

is represented by Formula A1-2;
c) $T_1$ is a single bond; and
d) the moiety represented by

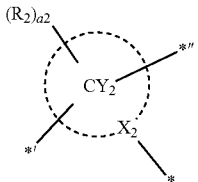

is represented by Formula A2-1 or Formula $A_{2\text{-}2}$,

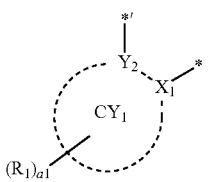 A1-1

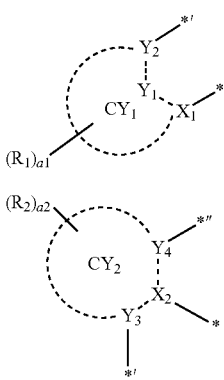 A1-2

A2-1

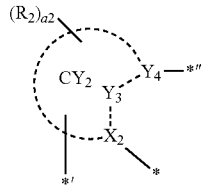 A2-2 wherein, in Formulae A1-1 and A1-2, $X_1$, ring $CY_1$, $R_1$, and $a_1$ are defined the same as those defined in claim 1, $Y_1$ and $Y_2$ are each independently selected from N and C, * indicates a binding site to M or $X_5$ in Formula 1A(1), *' indicates a binding site to $T_1$ in Formula 1A(1), in Formulae A2-1 and A2-2, $X_2$, ring $CY_2$, $R_2$, and a2 are defined the same as those defined in claim 1, $Y_3$ and $Y_4$ are each independently selected from N and C, * indicates a binding site to M in Formula 1A(1), *' indicates a binding site to $T_1$ in Formula 1A(1), and *''' indicates a binding site to $T_2$ in Formula 1A(1).

6. The organometallic compound of claim 1, wherein the moiety represented by

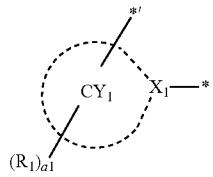

is represented by one selected from Formulae A1-1(1) to A1-1(28) and A1-2(1) to A1-2(74):

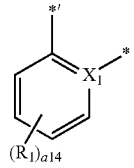 A1-1(1)

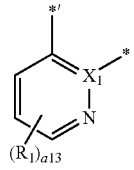 A1-1(2)

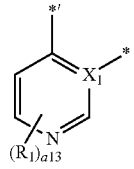 A1-1(3)

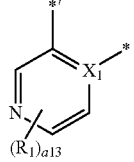 A1-1(4)

-continued
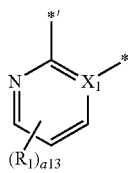
A1-1(5)
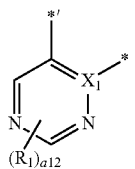
A1-1(6)
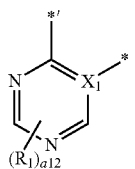
A1-1(7)
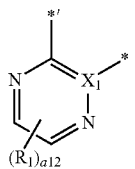
A1-1(8)
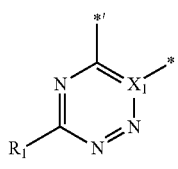
A1-1(9)
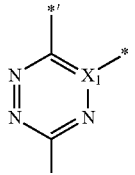
A1-1(10)
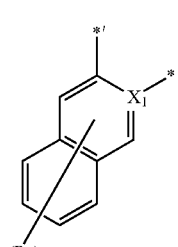
A1-1(11)
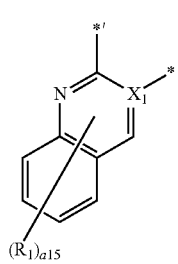
A1-1(12)
-continued
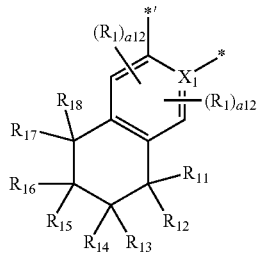
A1-1(13)
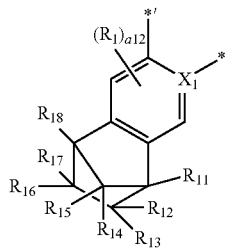
A1-1(14)
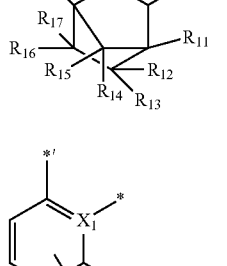
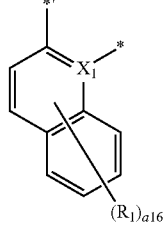
A1-1(15)
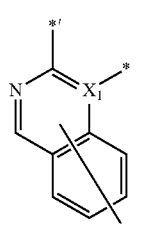
A1-1(16)
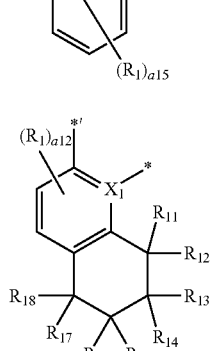
A1-1(17)
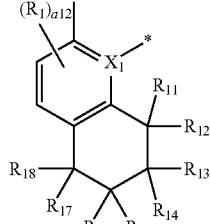
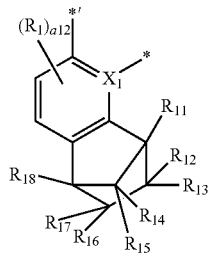
A1-1(18)

US 11,569,460 B2
171
-continued
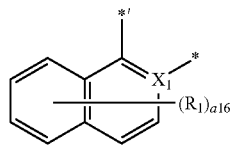 A1-1(19)
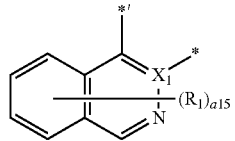 A1-1(20)
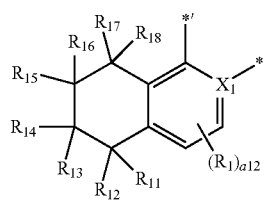 A1-1(21)
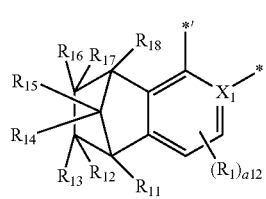 A1-1(22)
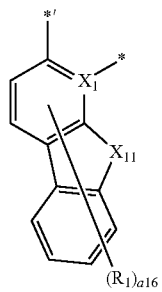 A1-1(23)
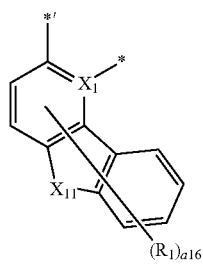 A1-1(24)
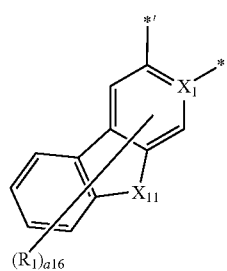 A1-1(25)
172
-continued
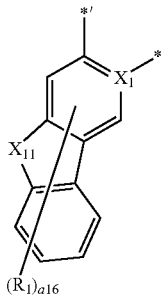 A1-1(26)
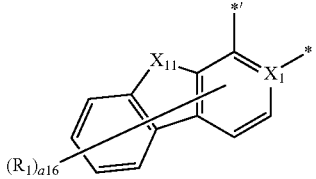 A1-1(27)
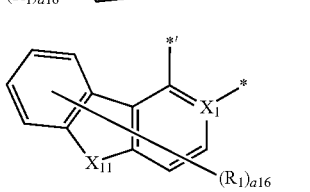 A1-1(28)
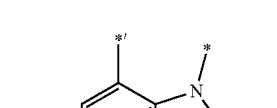 A1-2(1)
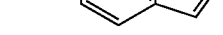 A1-2(2)
A1-2(3)
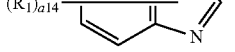 A1-2(4)
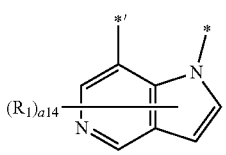 A1-2(5)
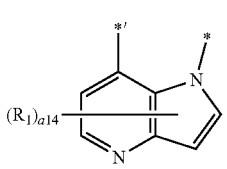 A1-2(6)

-continued
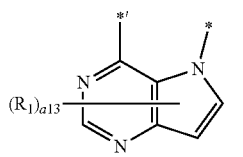
A1-2(7)
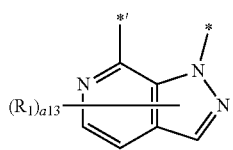
A1-2(8)
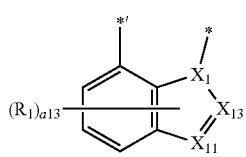
A1-2(9)
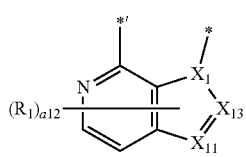
A1-2(10)
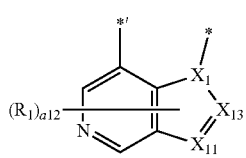
A1-2(11)
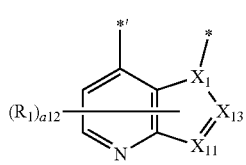
A1-2(12)
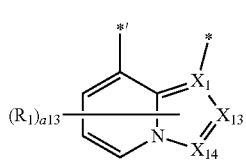
A1-2(13)
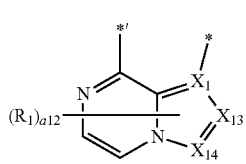
A1-2(14)
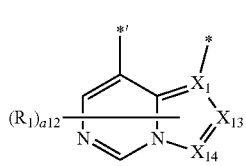
A1-2(15)
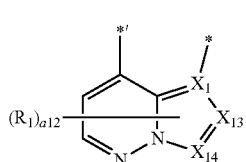
A1-2(16)
-continued
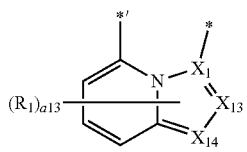
A1-2(17)
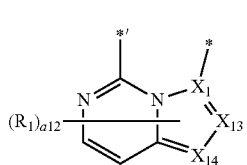
A1-2(18)
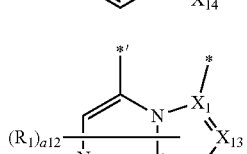
A1-2(19)
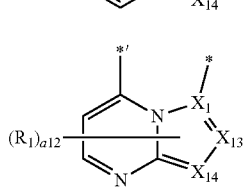
A1-2(20)
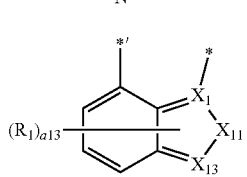
A1-2(21)
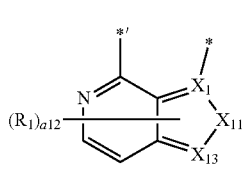
A1-2(22)
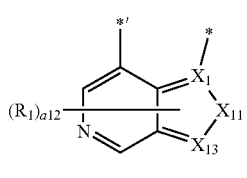
A1-2(23)
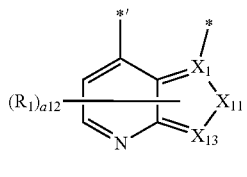
A1-2(24)
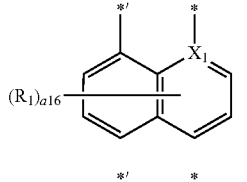
A1-2(25)
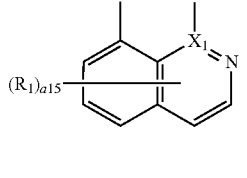
A1-2(26)

A1-2(27)
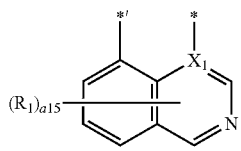
A1-2(28)
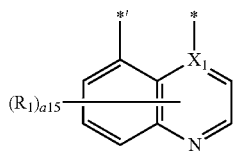
A1-2(29)
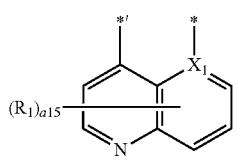
A1-2(30)
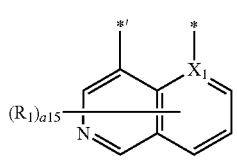
A1-2(31)
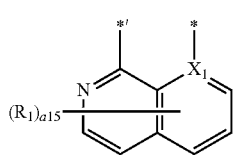
A1-2(32)
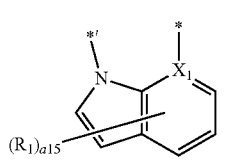
A1-2(33)
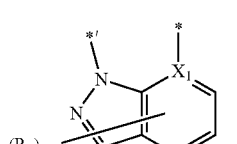
A1-2(34)
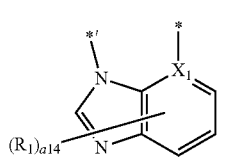
A1-2(35)
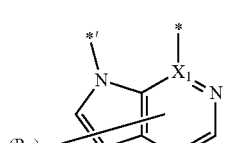
A1-2(36)
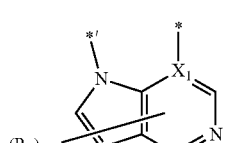
A1-2(37)
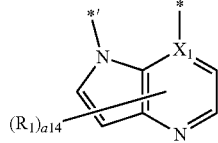
A1-2(38)
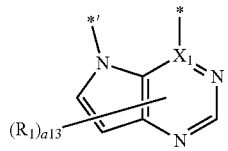
A1-2(39)
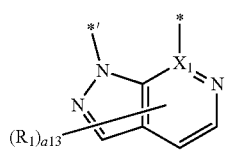
A1-2(40)
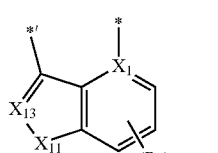
A1-2(41)
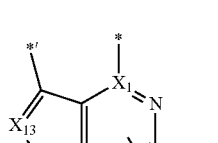
A1-2(42)
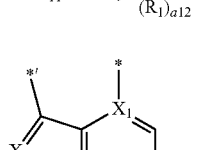
A1-2(43)
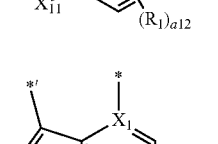
A1-2(44)
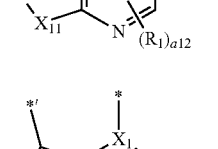
A1-2(45)
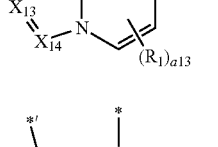
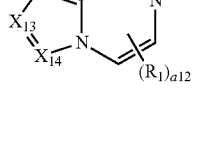

A1-2(46)
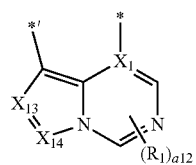
A1-2(47)
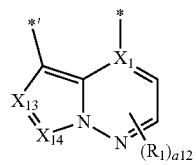
A1-2(48)
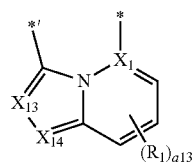
A1-2(49)
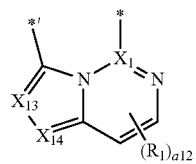
A1-2(50)
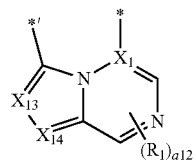
A1-2(51)
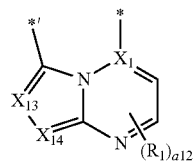
A1-2(52)
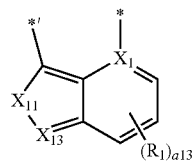
A1-2(53)
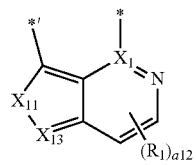
A1-2(54)
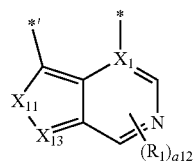
A1-2(55)
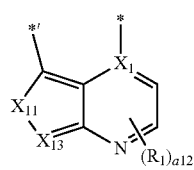
A1-2(56)
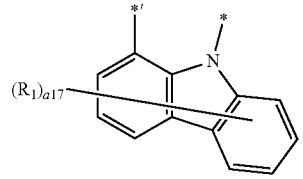
A1-2(57)
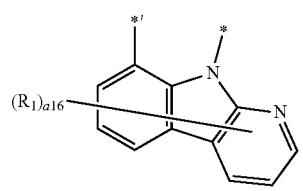
A1-2(58)
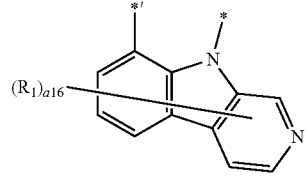
A1-2(59)
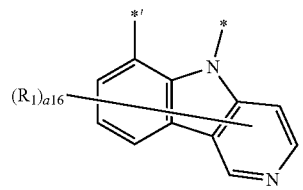
A1-2(60)
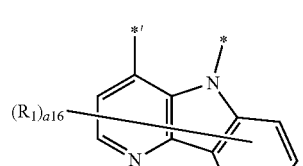
A1-2(61)
A1-2(62)
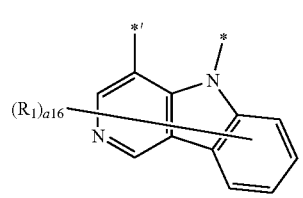

A1-2(63) 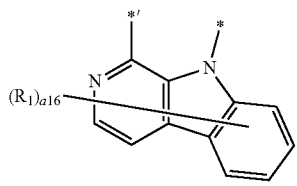

A1-2(64) 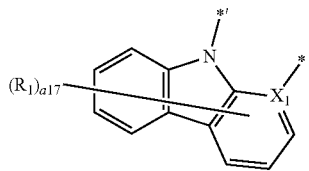

A1-2(65) 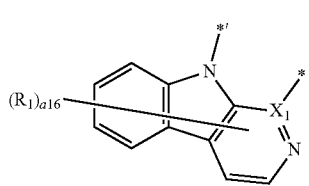

A1-2(66) 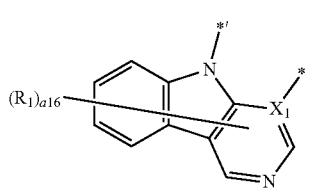

A1-2(67) 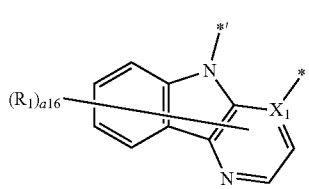

A1-2(68) 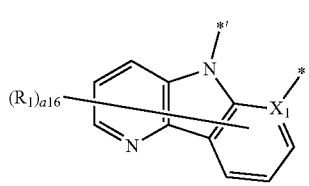

A1-2(69) 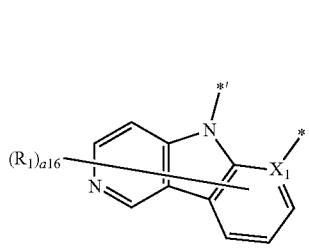

A1-2(70) 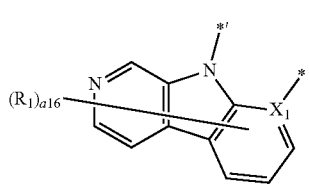

A1-2(71) 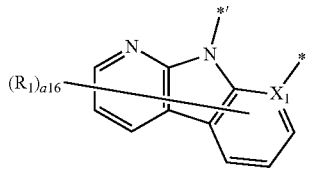

A1-2(72) 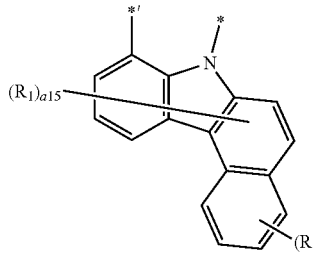

A1-2(73) 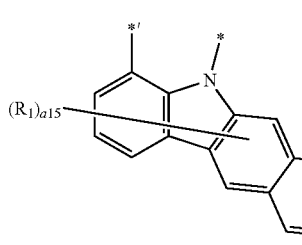

A1-2(74) 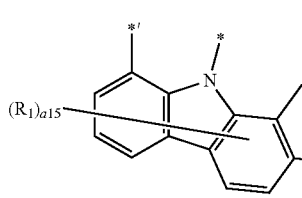

wherein, in Formulae A1-1(1) to A1-1(28) and A1-2(1) to A1-2(74), $X_1$ and $R_1$ are defined the same as those defined in claim 1, $X_{11}$ is O, S, $N(R_{11})$, $C(R_{11})(R_{12})$, or $Si(R_{11})(R_{12})$, $X_{13}$ is N or $C(R_{13})$, $X_{14}$ is N or $C(R_{14})$, $R_{11}$ to $R_{18}$ are each defined the same as $R_1$ defined in claim 1, a17 is an integer from 0 to 7, a16 is an integer from 0 to 6, a15 is an integer from 0 to 5, a14 is an integer from 0 to 4, a13 is an integer from 0 to 3, a12 is an integer from 0 to 2, \* indicates a binding site to M or $X_5$ in Formula 1A(1), and \*' indicates a binding site to $T_1$ in Formula 1A(1).

7. The organometallic compound of claim 1, wherein the moiety represented by

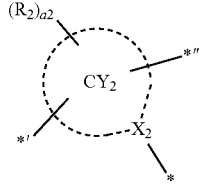

is represented by one selected from Formulae A2-1(1) to A2-1(17), A2-2(1) to A2-2(58), and A2-3(1) to A2-3(58):
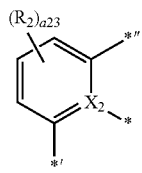
A2-1(1)
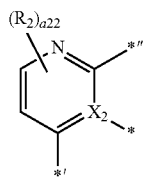
A2-1(2)
A2-1(3)
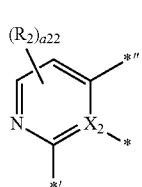
A2-1(4)
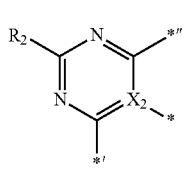
A2-1(5)
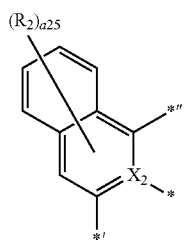
A2-1(6)
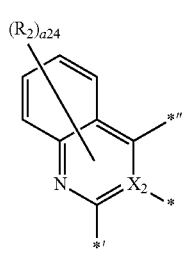
A2-1(7)
-continued
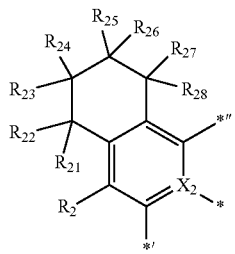
A2-1(8)
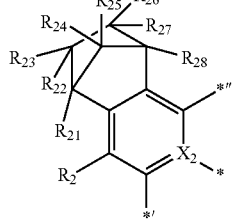
A2-1(9)
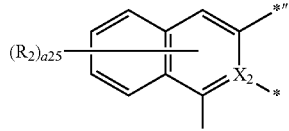
A2-1(10)
A2-1(11)
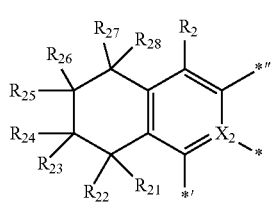
A2-1(12)
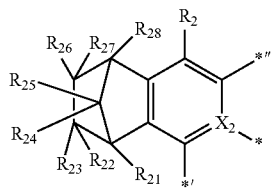
A2-1(13)
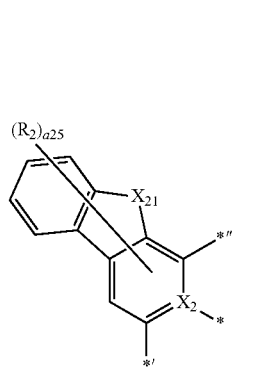
A2-1(14)

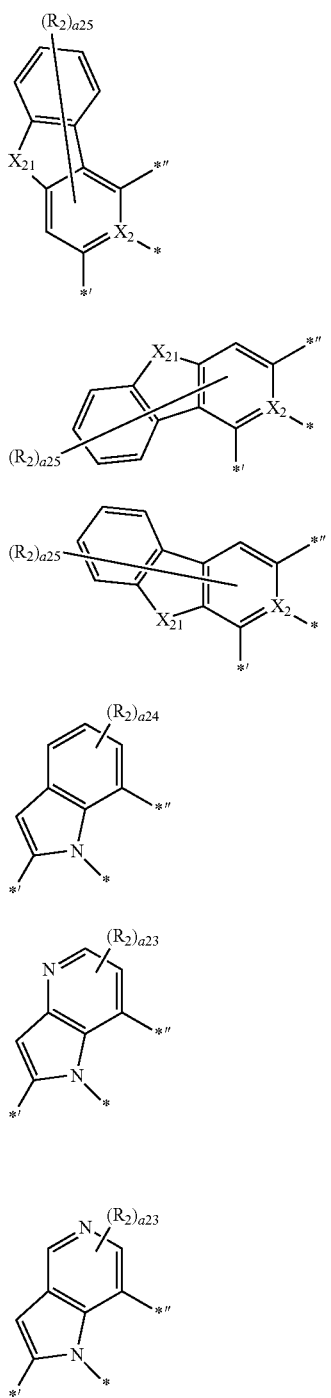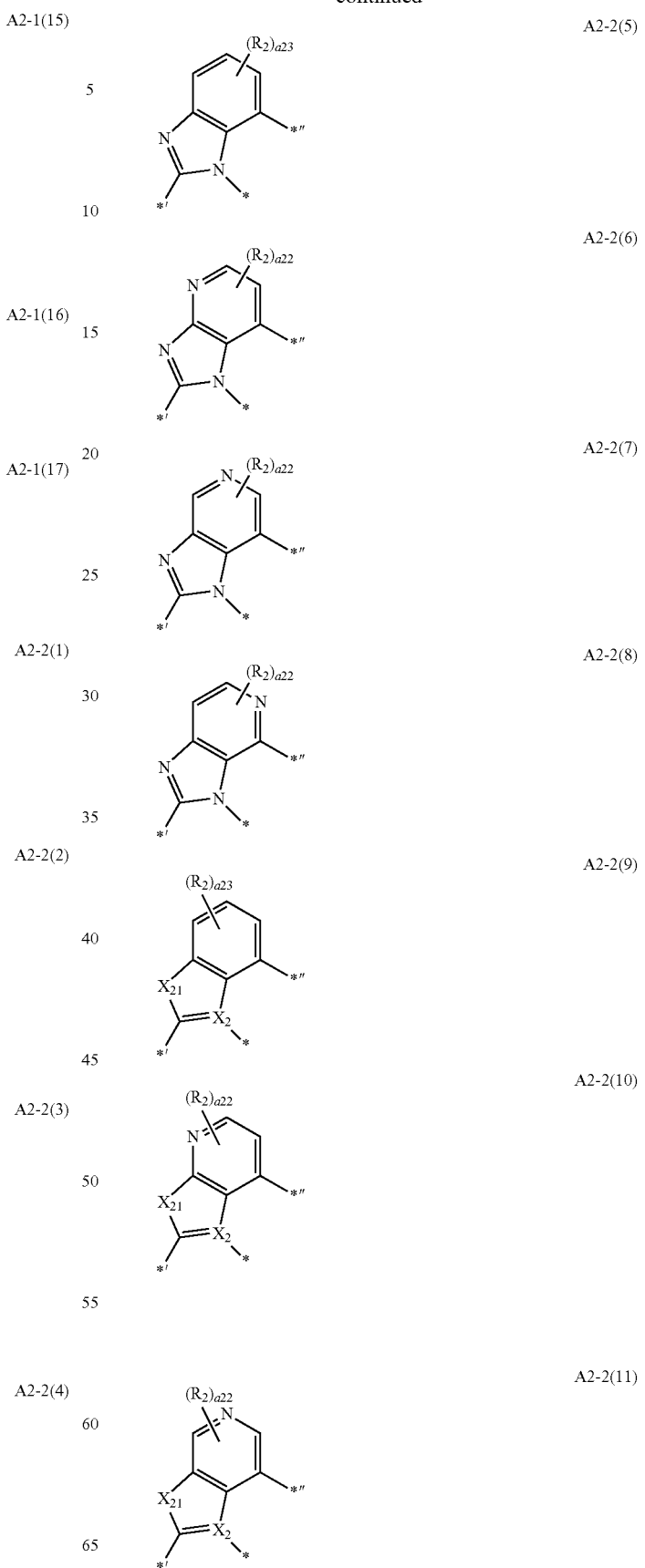

-continued
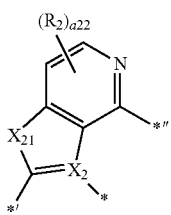
A2-2(12)
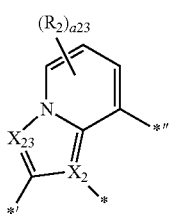
A2-2(13)
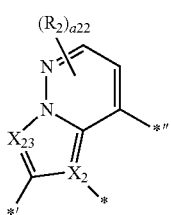
A2-2(14)
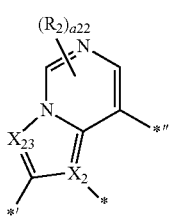
A2-2(15)
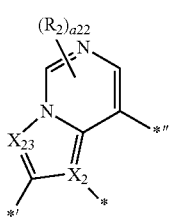
A2-2(16)
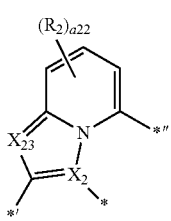
A2-2(17)
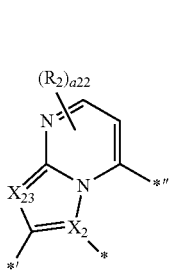
A2-2(18)
-continued
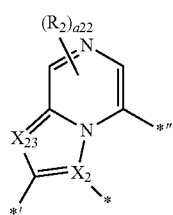
A2-2(19)
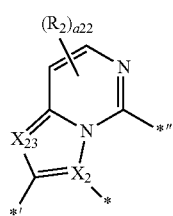
A2-2(20)
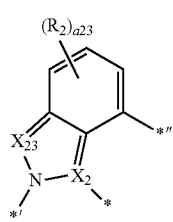
A2-2(21)
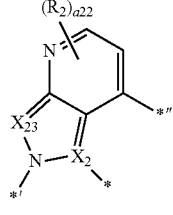
A2-2(22)
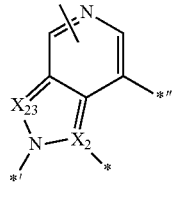
A2-2(23)
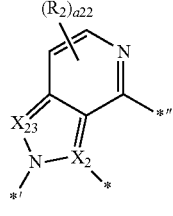
A2-2(24)
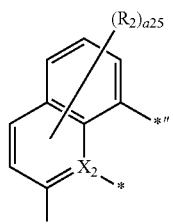
A2-2(25)

A2-2(26)
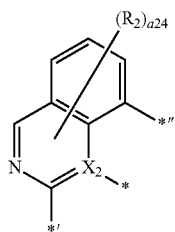
A2-2(27)
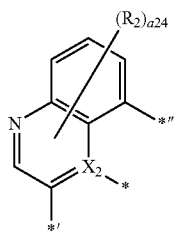
A2-2(28)
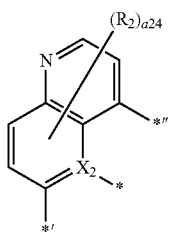
A2-2(29)
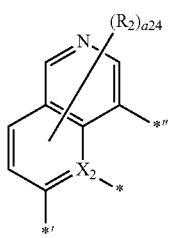
A2-2(30)
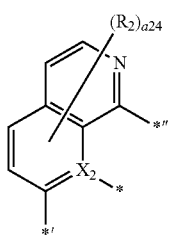
A2-2(31)
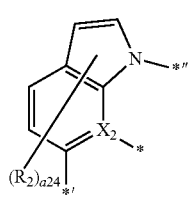
A2-2(32)
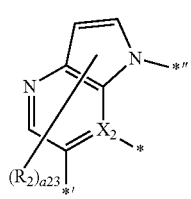
A2-2(33)
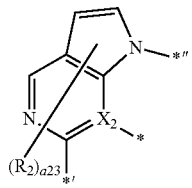
A2-2(34)
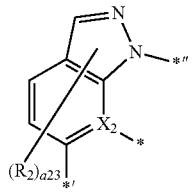
A2-2(35)
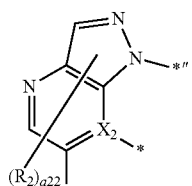
A2-2(36)
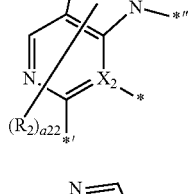
A2-2(37)
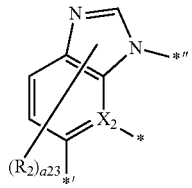
A2-2(38)
A2-2(39)
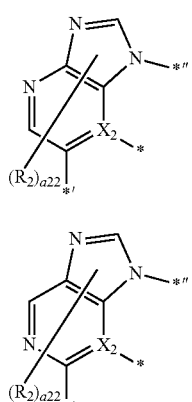
A2-2(40)
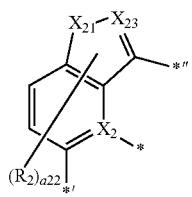

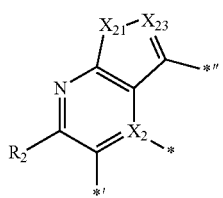 A2-2(41)
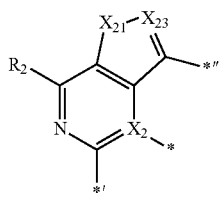 A2-2(42)
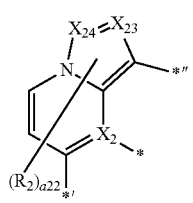 A2-2(43)
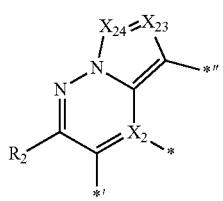 A2-2(44)
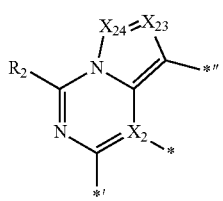 A2-2(45)
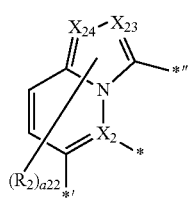 A2-2(46)
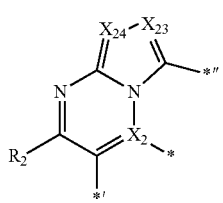 A2-2(47)
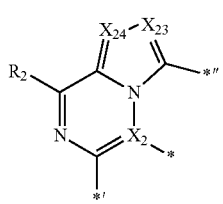 A2-2(48)
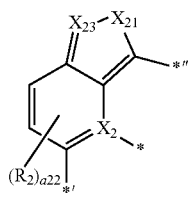 A2-2(49)
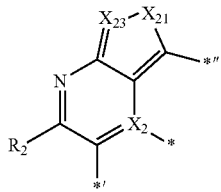 A2-2(50)
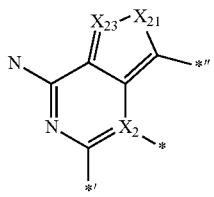 A2-2(51)
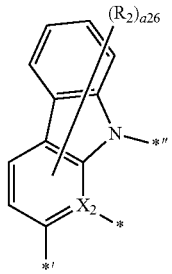 A2-2(52)
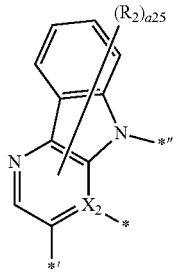 A2-2(53)
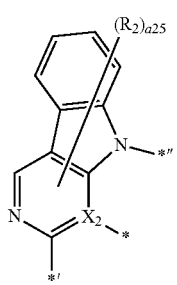 A2-2(54)

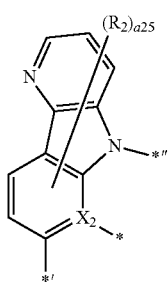
A2-2(55)
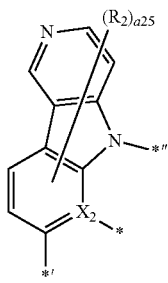
A2-2(56)
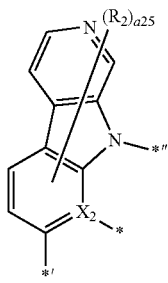
A2-2(57)
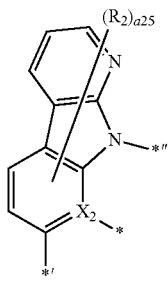
A2-2(58)
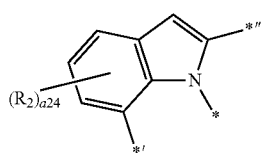
A2-3(1)
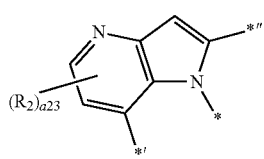
A2-3(2)
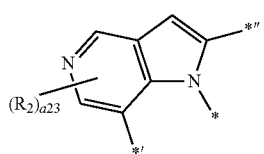
A2-3(3)
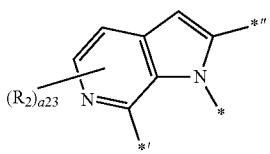
A2-3(4)
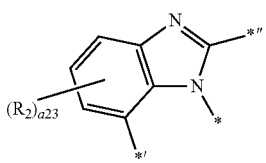
A2-3(5)
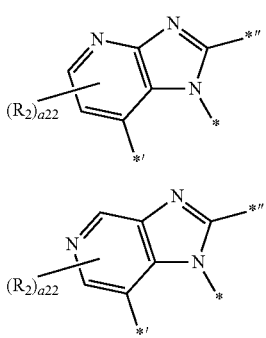
A2-3(6)
A2-3(7)
A2-3(8)
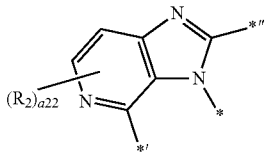
A2-3(1)
A2-3(2)
A2-3(3)
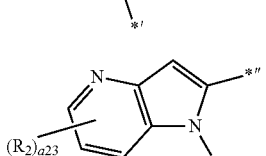
A2-3(4)
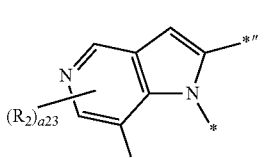
A2-3(4)
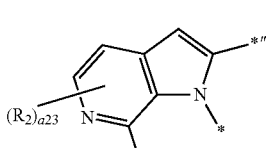
A2-3(5)
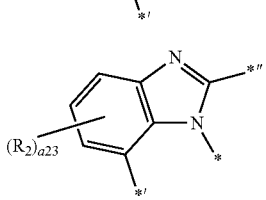

-continued
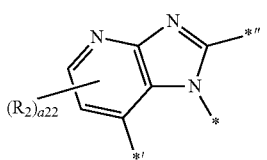
A2-3(6)
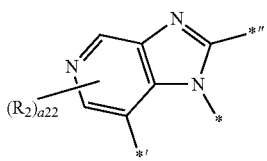
A2-3(7)
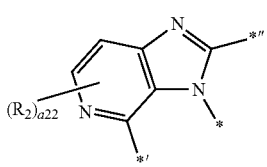
A2-3(8)
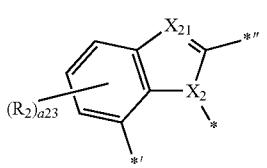
A2-3(9)
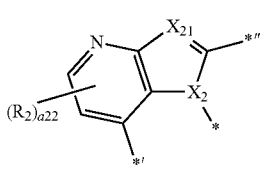
A2-3(10)
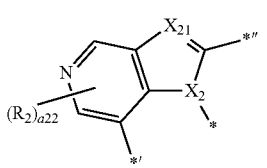
A2-3(11)
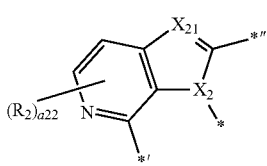
A2-3(12)
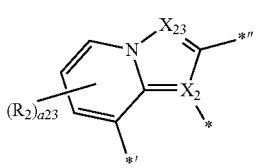
A2-3(13)
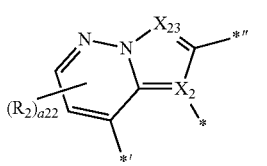
A2-3(14)
-continued
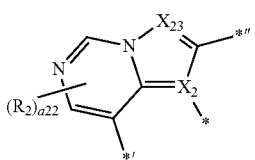
A2-3(15)
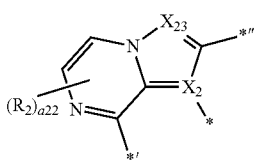
A2-3(16)
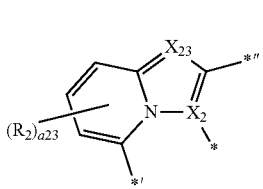
A2-3(17)
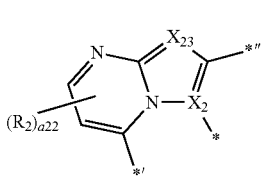
A2-3(18)
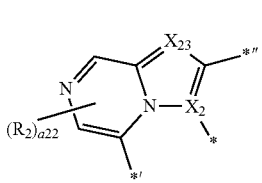
A2-3(19)
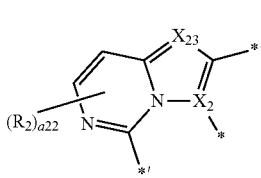
A2-3(20)
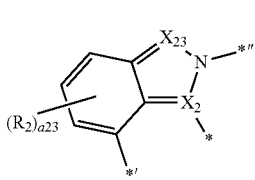
A2-3(21)
A2-3(22)
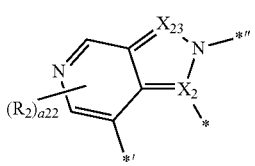
A2-3(23)

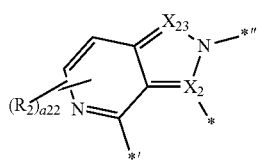 
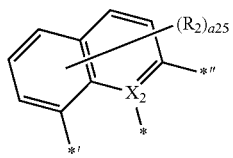 A2-3(25)
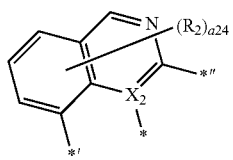 A2-3(26)
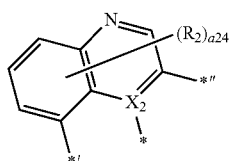 A2-3(27)
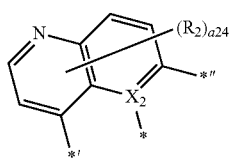 A2-3(28)
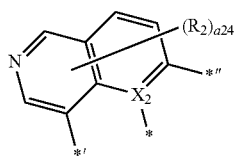 A2-3(29)
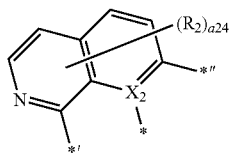 A2-3(30)
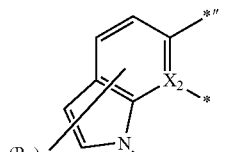 A2-3(31)
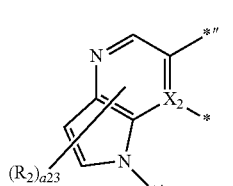 A2-3(32)
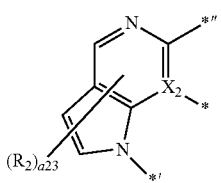 A2-3(33)
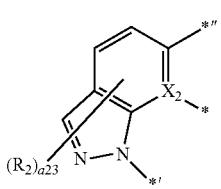 A2-3(34)
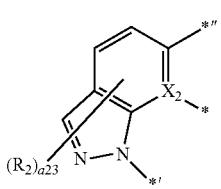 
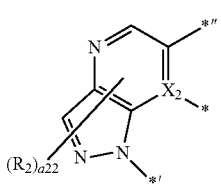 A2-3(35)
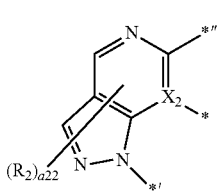 A2-3(36)
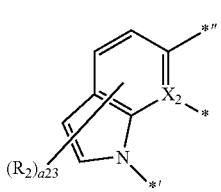 A2-3(37)
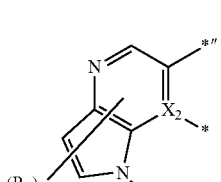 A2-3(38)
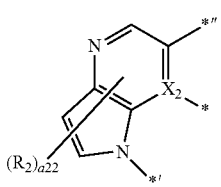 
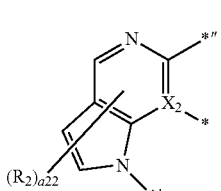 A2-3(39)
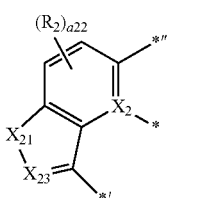 A2-3(40)

-continued

-continued

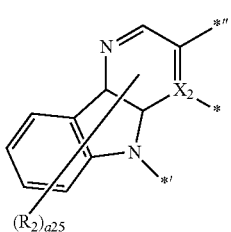
A2-3(54)

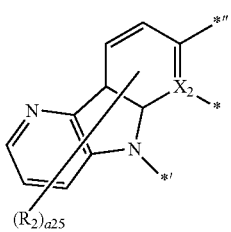
A2-3(55)

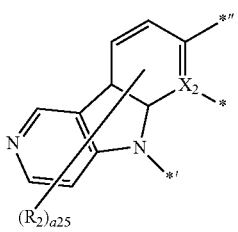
A2-3(56)

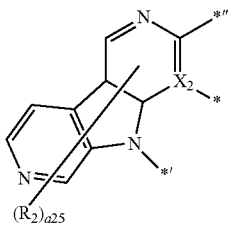
A2-3(57)

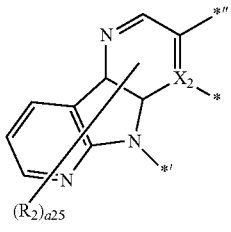
A2-3(58)

wherein, in Formulae A2-1(1) to A2-1(17), A2-2(1) to A2-2(58), and A2-3(1) to A2-3(58),
$X_2$ and $R_2$ are defined the same as those defined in claim 1,
$X_{21}$ is O, S, $N(R_{21})$, $C(R_{21})(R_{22})$, or $Si(R_{21})(R_{22})$,
$X_{23}$ is N or $C(R_{23})$,
$X_{24}$ is N or $C(R_{24})$,
$R_{21}$ to $R_{28}$ are each defined the same as $R_2$ defined in claim 1,
a26 is an integer from 0 to 6,
a25 is an integer from 0 to 5,
a24 is an integer from 0 to 4,
a23 is an integer from 0 to 3,
a22 is an integer from 0 to 2,
\* indicates a binding site to M in Formula 1A(1),
\*' indicates a binding site to $T_1$ in Formula 1A(1), and
\*'' indicates a binding site to $T_2$ in Formula 1A(1).

8. The organometallic compound of claim 1, wherein the moiety represented by

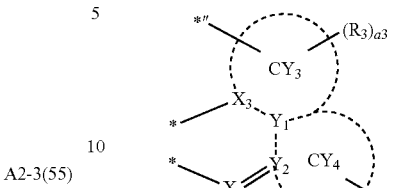

is represented by one of Formulae A4-1(1) to A4-1(24):

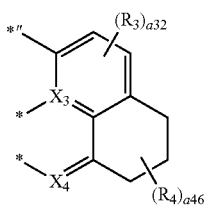
A4-1(1)

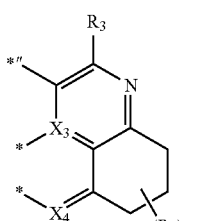
A4-1(2)

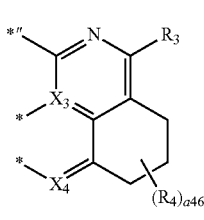
A4-1(3)

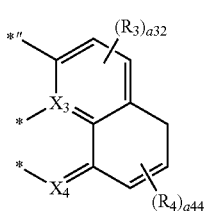
A4-1(4)

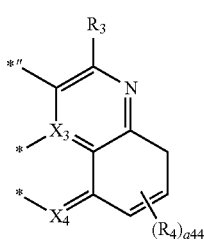
A4-1(5)

-continued
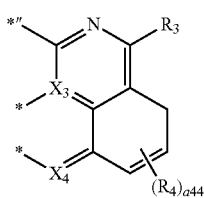
A4-1(6)
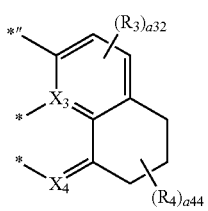
A4-1(7)
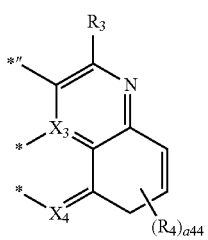
A4-1(8)
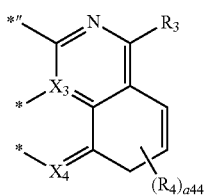
A4-1(9)
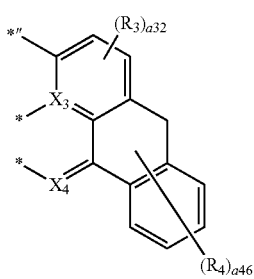
A4-1(10)
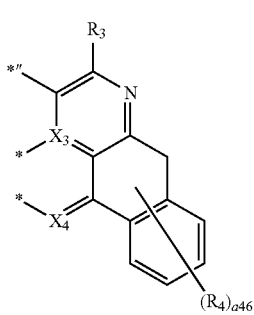
A4-1(11)
-continued
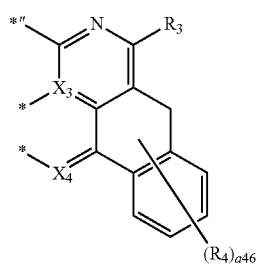
A4-1(12)
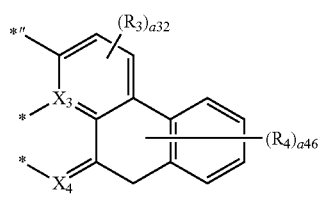
A4-1(13)
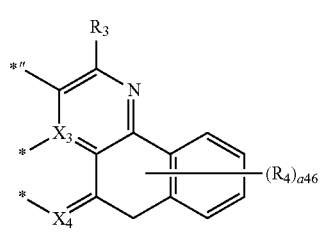
A4-1(14)
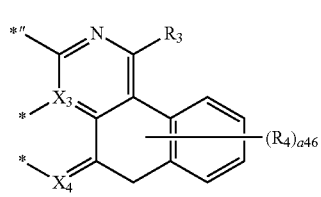
A4-1(15)
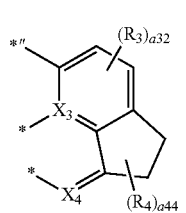
A4-1(16)
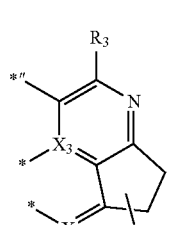
A4-1(17)
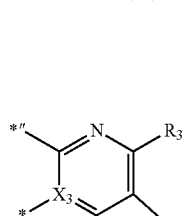
A4-1(18)

-continued

A4-1(19)
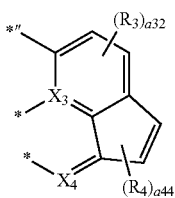

A4-1(20)
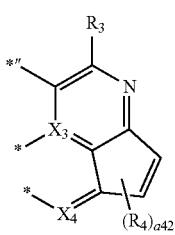

A4-1(21)
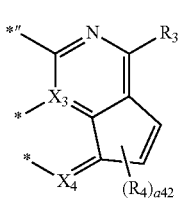

A4-1(22)
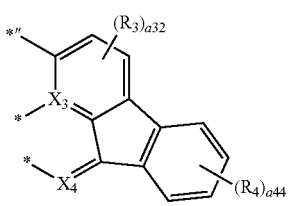

A4-1(23)
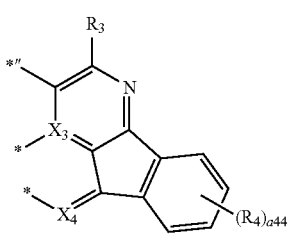

A4-1(24)
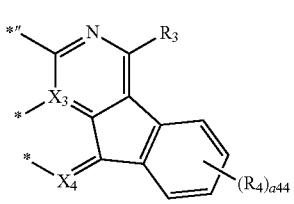

wherein, in Formulae A4-1(1) to A4-1(24),
$X_3$, $X_4$, $R_3$, and are defined the same as those defined in claim 1,
a46 is an integer from 0 to 6,
a44 is an integer from 0 to 4,
a42 and a32 are each independently an integer from 0 to 2,
* indicates a binding site to M in Formula 1A(1), and
*''' indicates a binding site to $T_2$ in Formula 1A(1).

9. The organometallic compound of claim 1, wherein the moiety represented by

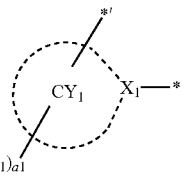

is represented by one of Formulae CY1-1 to CY1-30, and the moiety represented by is represented by one of Formulae CY2-1 to CY2-37,

CY1-1

CY1-2

CY1-3

CY1-4

CY1-5

-continued
CY1-6
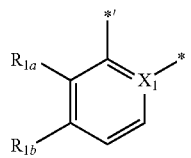
CY1-7
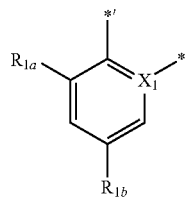
CY1-8
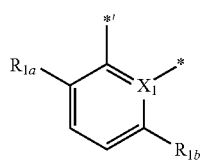
CY1-9
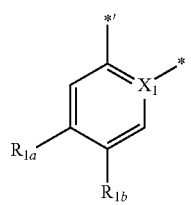
CY1-10
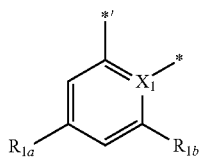
CY1-11
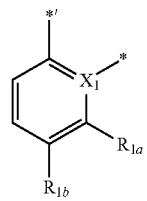
CY1-12
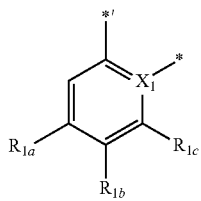
CY1-13
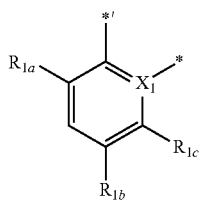
-continued
CY1-14
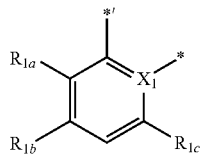
CY1-15
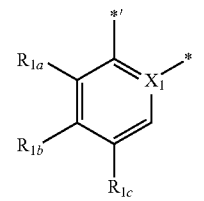
CY1-16
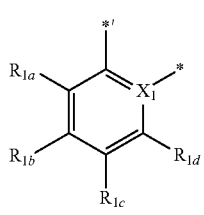
CY1-17
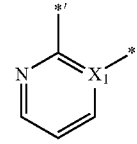
CY1-18
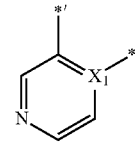
CY1-19
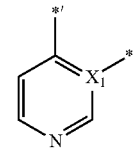
CY1-20
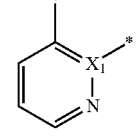
CY1-21
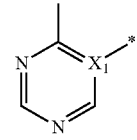
CY1-22
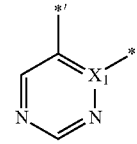

-continued
CY1-23
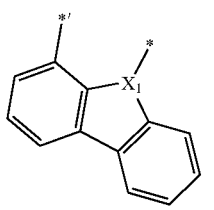
CY1-24
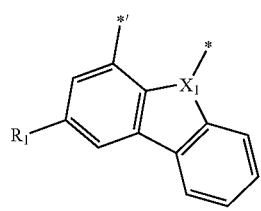
CY1-25
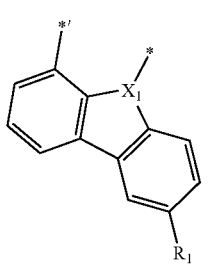
CY1-26
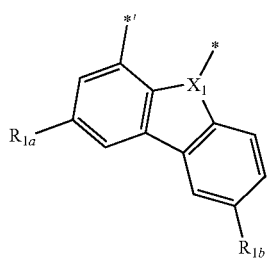
CY1-27
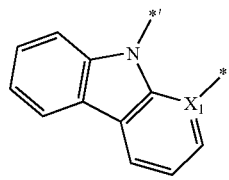
CY1-28
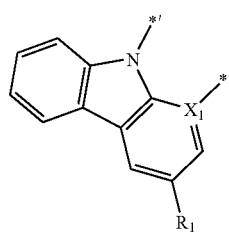
CY1-29
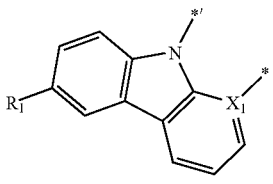
CY1-30
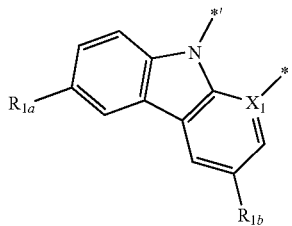
CY2-1
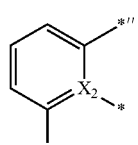
CY2-2
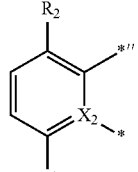
CY2-3
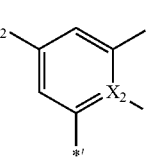
CY2-4
CY2-5
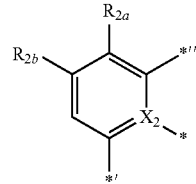
CY2-6
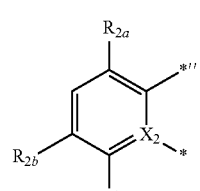
CY2-7
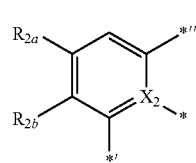

-continued
CY2-8
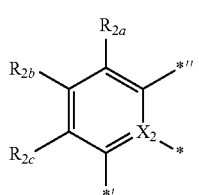
CY2-9
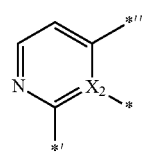
CY2-10
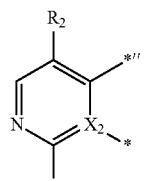
CY2-11
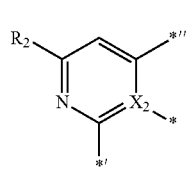
CY2-12
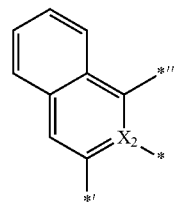
CY2-13
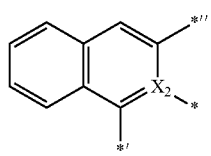
CY2-14
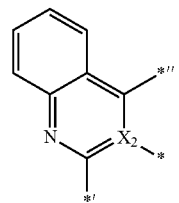
CY2-15
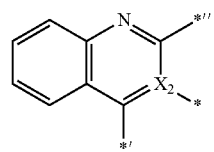
CY2-16
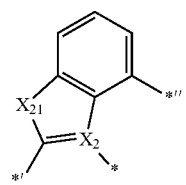
-continued
CY2-17
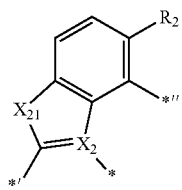
CY2-18
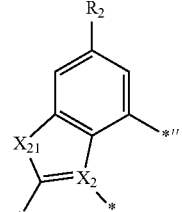
CY2-19
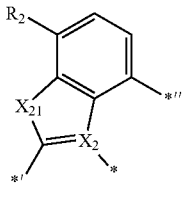
CY2-20
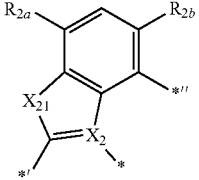
CY2-21
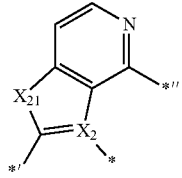
CY2-22
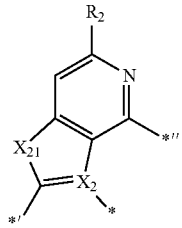
CY2-23
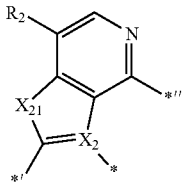
CY2-24
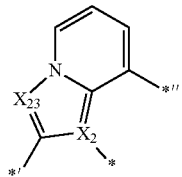

-continued

CY2-25

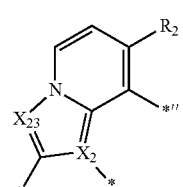

CY2-26

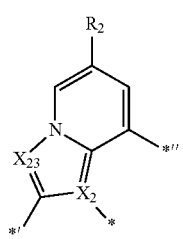

CY2-27

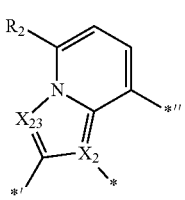

CY2-28

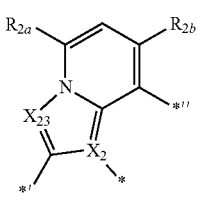

CY2-29

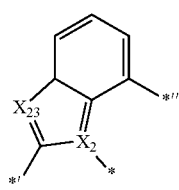

CY2-30

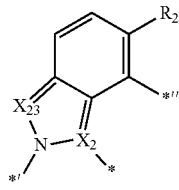

CY2-31

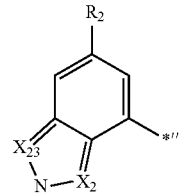

CY2-32

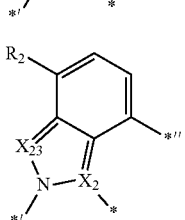

-continued

CY2-33

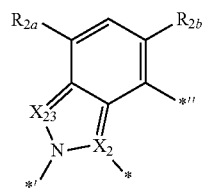

CY2-34

CY2-35

CY2-36

CY2-37 wherein, in Formulae CY1-1 to CY1-30, and CY2-1 to CY2-37, $X_1$ to $X_2$ and $R_1$ to $R_3$ are defined the same as those defined in claim 1, $X_{21}$ is O, S, N($R_{21}$), C($R_{21}$)($R_{22}$), or Si($R_{21}$)($R_{22}$), $X_{23}$ is N or C($R_{23}$), $R_{1a}$ to $R_{1d}$ are each defined the same as $R_1$ defined herein, $R_{2a}$ to $R_{2c}$ and $R_{21}$ to $R_{23}$ are each defined the same as $R_2$ defined herein, provided that $R_1$ to $R_2$, $R_{1a}$ to $R_{1d}$, and $R_{2a}$ to $R_{2c}$, are each not hydrogen, in Formula CY1-1 to CY1-30, * indicates a binding site to M or $X_5$ in Formula 1A, and *' indicates a binding site to $T_1$ in Formula 1A(1), in Formula CY2-1 to CY2-37, * indicates a binding site to M in Formula 1A(1), *' indicates a binding site to $T_1$ in Formula 1A(1), and *" indicates a binding site to $T_2$ in Formula 1A(1).

10. The organometallic compound of claim 1, wherein the moiety represented by

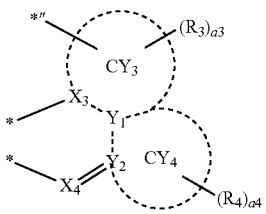

is represented by one of Formulae CY4-1 to CY4-7:

CY4-1

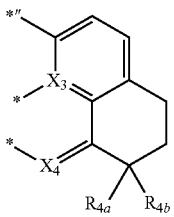

CY4-2

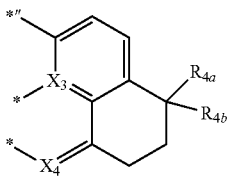

CY4-3

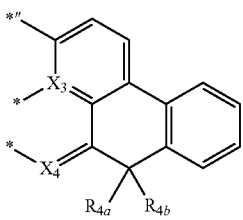

CY4-4

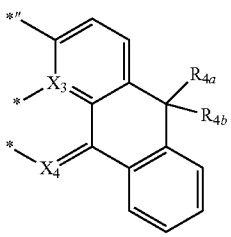

CY4-5

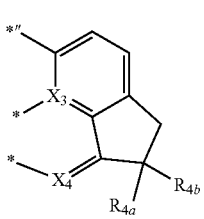

CY4-6

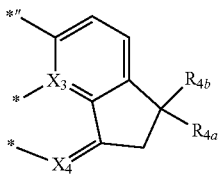

CY4-7

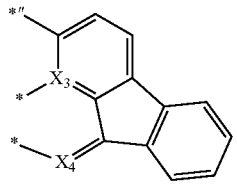

wherein, in Formulae CY4-1 to CY4-7,
$X_3$ and $X_4$ are respectively defined the same as those defined in claim 1,
$R_{4a}$ and $R_{4b}$ are each defined the same as $R_4$ defined in claim 1, provided that $R_{4a}$ and $R_{4b}$ are each not hydrogen,
*″ indicates a binding site to $T_2$ in Formula 1A(1), and
* indicates a binding site to M in Formula 1A(1).

11. An organic light-emitting device comprising:
a first electrode;
a second electrode; and
an organic layer disposed between the first electrode and the second electrode,
wherein the organic layer comprises an emission layer and at least one organometallic compound of claim 1.

12. The organic light-emitting device of claim 11, wherein
the first electrode is an anode,
the second electrode is a cathode, and
the organic layer comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
the electron transport region comprises a hole blocking layer, an electron transport layer, an electron injection layer, or any combination thereof.

13. The organic light-emitting device of claim 11, wherein the emission layer comprises the organometallic compound.

14. The organic light-emitting device of claim 13, wherein the emission layer further comprises a host in an amount of greater than an amount of the organometallic compound.

15. A diagnostic composition comprising at least one of the organometallic compound of claim 1.

16. An organometallic compound being selected from Compounds 1 and 3 to 10:

1

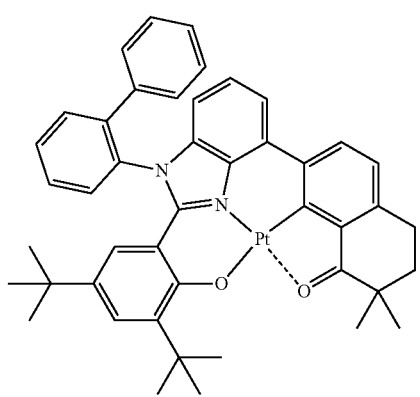

3
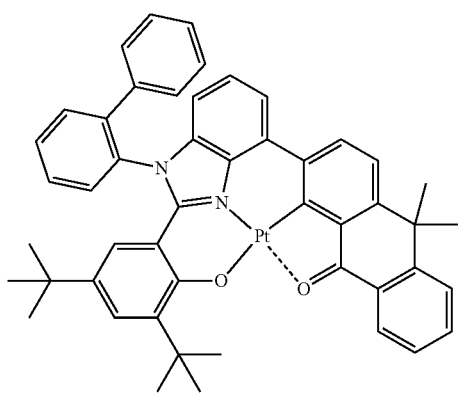
4
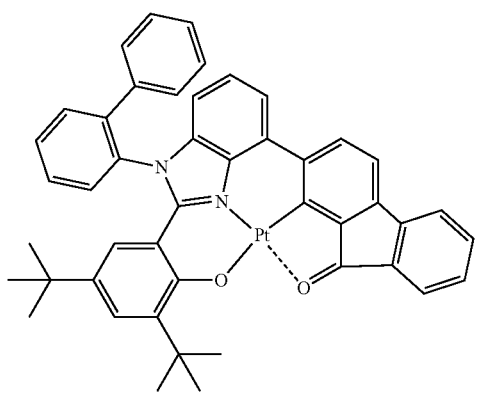
5
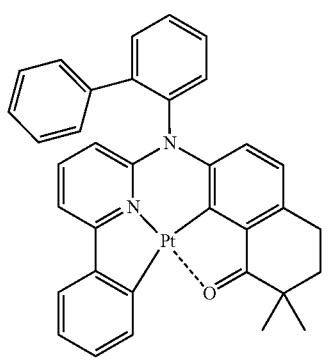
6
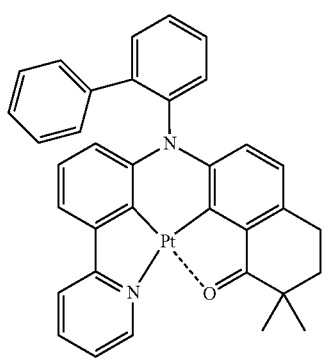
7
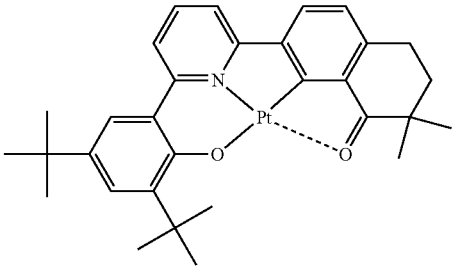
8
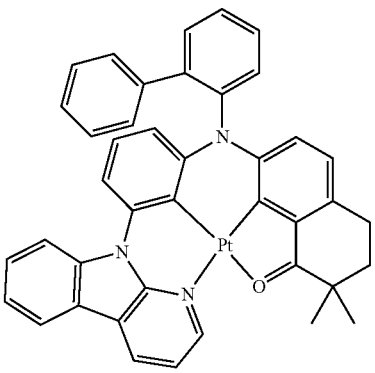
9
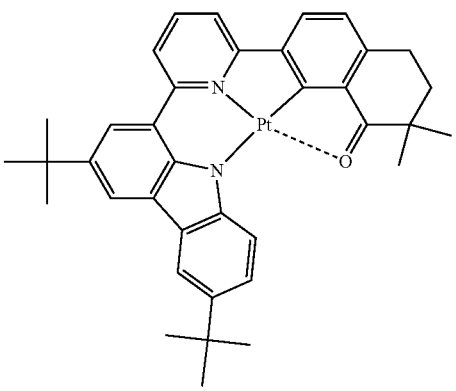
10
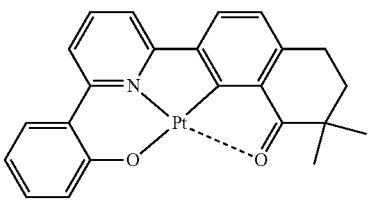
* * * * *